(12) United States Patent
Fukuda et al.

(10) Patent No.: US 9,024,312 B2
(45) Date of Patent: May 5, 2015

(54) SUBSTRATE FOR FLEXIBLE DEVICE, THIN FILM TRANSISTOR SUBSTRATE FOR FLEXIBLE DEVICE, FLEXIBLE DEVICE, SUBSTRATE FOR THIN FILM ELEMENT, THIN FILM ELEMENT, THIN FILM TRANSISTOR, METHOD FOR MANUFACTURING SUBSTRATE FOR THIN FILM ELEMENT, METHOD FOR MANUFACTURING THIN FILM ELEMENT, AND METHOD FOR MANUFACTURING THIN FILM TRANSISTOR

(75) Inventors: Shunji Fukuda, Tokyo-to (JP); Katsuya Sakayori, Tokyo-to (JP); Keita Arihara, Tokyo-to (JP); Koji Ichimura, Tokyo-to (JP); Kei Amagai, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 13/499,097

(22) PCT Filed: Sep. 29, 2010

(86) PCT No.: PCT/JP2010/066912
§ 371 (c)(1),
(2), (4) Date: Mar. 29, 2012

(87) PCT Pub. No.: WO2011/040440
PCT Pub. Date: Apr. 7, 2011

(65) Prior Publication Data
US 2012/0187399 A1   Jul. 26, 2012

(30) Foreign Application Priority Data

Sep. 30, 2009  (JP) ................................. 2009-228889
Apr. 9, 2010   (JP) ................................. 2010-090948
Apr. 9, 2010   (JP) ................................. 2010-090949
Apr. 9, 2010   (JP) ................................. 2010-090950

(51) Int. Cl.
*H01L 29/10* (2006.01)
*H01L 51/00* (2006.01)
(Continued)

(52) U.S. Cl.
CPC ......... *H01L 51/0097* (2013.01); *H01L 27/1218* (2013.01); *H01L 27/3244* (2013.01);
(Continued)

(58) Field of Classification Search
USPC ............................... 257/43; 313/483; 349/46
See application file for complete search history.

(56) References Cited

U.S. PATENT DOCUMENTS 6,350,844 B1    2/2002  Ono et al.
7,229,703 B2 *  6/2007  Kawashima et al. ......... 428/690
(Continued)

FOREIGN PATENT DOCUMENTS

JP    05-000268 A    1/1993
JP    08-176505 A    7/1996
(Continued)

OTHER PUBLICATIONS

International Search Report; mailed Dec. 28, 2010; PCT/JP2010/066912.

*Primary Examiner* — David Vu
*Assistant Examiner* — Brandon Fox
(74) *Attorney, Agent, or Firm* — Ladas & Parry LLP

(57) ABSTRACT

Disclosed is a substrate for a flexible device which, when a TFT is produced on a flexible substrate in which a metal layer and a polyimide layer are laminated, can suppress deterioration of the electrical performance of the TFT due to the surface irregularities of the metal foil surface and can suppress detachment or cracks of the TFT. Also disclosed is a substrate for a thin film element which has excellent surface smoothness and is capable of suppressing deterioration of the characteristics of thin film elements. Also disclosed are methods for manufacturing substrates for thin film elements.

28 Claims, 9 Drawing Sheets

(51) Int. Cl.
  *H01L 29/786*  (2006.01)
  *H01L 27/12*   (2006.01)
  *H01L 27/32*   (2006.01)
  *H01L 51/52*   (2006.01)

(52) U.S. Cl.
  CPC ...... *H01L29/78603* (2013.01); *H01L 29/7869* (2013.01); *H01L 51/5253* (2013.01); *Y02E 10/549* (2013.01)

(56) References Cited

U.S. PATENT DOCUMENTS

| | | | |
|---|---|---|---|
| 7,442,587 B2 * | 10/2008 | Amundson et al. | 438/149 |
| 8,093,135 B2 * | 1/2012 | Shimomura et al. | 438/458 |
| 2006/0209248 A1 * | 9/2006 | Shimada | 349/158 |
| 2007/0052088 A1 | 3/2007 | Tsurume et al. | |
| 2009/0001432 A1 * | 1/2009 | Kim et al. | 257/288 |
| 2009/0004772 A1 | 1/2009 | Jinbo et al. | |
| 2009/0014410 A1 | 1/2009 | Yokai et al. | |

FOREIGN PATENT DOCUMENTS

| | | | |
|---|---|---|---|
| JP | 08-186343 A | 7/1996 |
| JP | 2001-072781 A | 3/2001 |
| JP | 2001-139808 A | 5/2001 |
| JP | 2001-207194 A | 7/2001 |
| JP | 2002-348388 A | 12/2002 |
| JP | 2003-282258 A | 10/2003 |
| JP | 2006-003775 A | 1/2006 |
| JP | 2006-019654 A | 1/2006 |
| JP | 2006-124650 A | 5/2006 |
| JP | 2006-324368 A | 11/2006 |
| JP | 2007-047495 A | 2/2007 |
| JP | 2007-096055 A | 4/2007 |
| JP | 2007-096279 A | 4/2007 |
| JP | 2007-246897 A | 9/2007 |
| JP | 2008-028001 A | 2/2008 |
| JP | 2008-147207 A | 6/2008 |
| JP | 2008-211191 A | 9/2008 |
| JP | 2009-004394 A | 1/2009 |
| JP | 2009-038338 A | 2/2009 |
| JP | 2009-099847 A | 5/2009 |
| JP | 2009-188317 A | 8/2009 |
| JP | 2009-246342 A | 10/2009 |
| WO | 2008-133182 A1 | 11/2008 |
| WO | 2009/044659 A1 | 4/2009 |

\* cited by examiner

SUBSTRATE FOR FLEXIBLE DEVICE, THIN FILM TRANSISTOR SUBSTRATE FOR FLEXIBLE DEVICE, FLEXIBLE DEVICE, SUBSTRATE FOR THIN FILM ELEMENT, THIN FILM ELEMENT, THIN FILM TRANSISTOR, METHOD FOR MANUFACTURING SUBSTRATE FOR THIN FILM ELEMENT, METHOD FOR MANUFACTURING THIN FILM ELEMENT, AND METHOD FOR MANUFACTURING THIN FILM TRANSISTOR

TECHNICAL FIELD

The present invention relates to a flexible substrate used in organic electroluminescent display apparatuses, electronic papers and the like.

Furthermore, the present invention relates to a substrate for a thin film element comprising an insulating layer containing polyimide formed on a metal substrate, which is used in thin film elements such as thin film transistors, thin film solar cells, and electroluminescent elements, and a method for producing the same.

BACKGROUND ART

There are known, as a method for producing a flexible substrate in which a metal layer and a polyimide layer are laminated, for example, a method of bonding a metal foil and a polyimide film with an adhesive interposed therebetween, a method of heating and pressing a metal foil and a polyimide film, a method of depositing a metal on a polyimide film, and a method of applying a polyimide solution or a precursor of polyimide on a metal foil.

Furthermore, it has been suggested that when a thin film transistor (hereinafter, may be referred to as TFT) is produced on a plastic film, a film formed of an inorganic material is provided on the plastic film in order to prevent detachment of the TFT from the plastic film (see, for example, Patent Document 1 and Patent Document 2).

In regard to the method for producing a flexible substrate in which a metal layer and a polyimide layer are laminated, in the case of the method of using a metal foil, for example, when the metal film is a rolled foil, surface irregularities due to rolling streaks exist on the surface. Even in the case where the metal foil is an electrolytic foil, surface irregularities exist on the surface. Therefore, there is a problem that when a TFT is produced on a flexible substrate, the electrical performance of the TFT is deteriorated. Also, in the case of the method of using a polyimide film, since polyimide films usually contain particles for the purpose of enhancing anti-blocking properties, surface irregularities exist on the surface. Thus, similarly, there is a problem that when a TFT is produced on a flexible substrate, the electrical performance of the TFT is deteriorated.

Thus, a polyimide layer having satisfactory surface smoothness is desired.

However, even if a polyimide layer having satisfactory surface smoothness has been obtained, since polyimide has relatively high hygroscopic properties, there is a problem that in a process of producing a TFT on a flexible substrate, the TFT undergoes cracking or detachment as the dimension of the polyimide layer changes due to moisture. Furthermore, the dimension of the polyimide layer changes not only because of moisture but also because of heat, similarly, there occurs a problem of cracking or detachment of the TFT.

Meanwhile, polymeric materials are used in various manufactured goods for daily life due to their characteristics such as easy processability and light weight. Polyimides that have been developed by DuPont Company, the U.S.A. in 1955 have excellent heat resistance, and therefore, development has been in progress, such as an investigation being conducted on the application of polyimides to the field of aerospace. Since then, detailed investigations have been conducted by many researchers, and it has become clear that polyimides exhibit top-class performance even in organic materials in terms of heat resistance, dimensional stability and insulating characteristics. Thus, polyimides have been applied not only to the field of aerospace but also to insulating materials for electronic components. At present, polyimides are actively used in the chip-coating films in semiconductor devices, the base material for flexible printed wiring boards, and the like.

Polyimides are polymers that are synthesized primarily from diamines and acid dianhydrides. When a diamine and an acid dianhydride are allowed to react in a solution, a polyamide acid (polyamic acid), which is a precursor of polyimide, is formed, and thereafter, the polyamide acid is converted to polyimide through a dehydration ring-closure reaction. Generally, since polyimides lack solubility in solvents and are difficult to process, in many cases, a desired shape is produced while the compound is in the form of a precursor, and then the precursor is converted to polyimide by being subjected to heating. Many of polyimide precursors are unstable to heat or water, and the precursors tend to have poor storage stability, such as requiring refrigerated storage. In view of this point, there have been developed polyimides in which a skeleton having excellent solubility is introduced into the molecular structure, or the molecular structure is subjected to modification such as reduction of the molecular weight, so that molding or coating can be achieved by first obtaining a polyimide and then dissolving the polymer in a solvent. However, when these polyimides are used, the polymers tend to deteriorate in the film properties such as heat resistance, chemical resistance, the coefficient of linear thermal expansion, and the coefficient of hygroscopic expansion, as compared with systems using polyimide precursors. Therefore, systems using polyimide precursors and systems using solvent-soluble polyimides can be distinguished for use according to the purpose.

A polyimide film is formed, in the case of using a solvent-soluble polyimide, by applying a polyimide resin composition on a substrate, and heat treating the composition to evaporate the solvent; and in the case of using a polyimide precursor, a polyimide film is formed by applying a polyimide resin composition on a substrate, heat treating the composition to evaporate the solvent, and then further heating the polymer to subject the polymer to imidization and thermal cyclization. In this case, when the polyimide resin composition is applied, if the wettability to the base material is poor, it is difficult to uniformly apply the resin composition on the base material, so that there occurs a problem in the flatness of the surface after film formation. Also, if the effect is conspicuous, there is a problem that repelling or foaming may occur, pinholes may be formed in the film, or the like.

In order to address the problems described above, it has been proposed to add a surfactant formed from a silicone oil into the polyimide resin composition (see, for example, Patent Document 3). According to this technology, it is believed that by adding a surfactant, air bubbles are not easily generated when a film is formed, and a decrease in the film uniformity due to air bubbles, or the generation of pinholes can be suppressed.

In recent years, polyimides are widely used as insulating materials for electronic components, and various performances are now demanded. Among them, particularly in a substrate for a thin film element in which a metal base material and an insulating layer containing polyimide are laminated, which substrate is used in thin film elements such as thin film transistors (TFT), thin film solar cells, and electroluminescent elements (hereinafter, electroluminescence may be referred to as EL), the thin film element unit formed on the insulating layer is thin, and also, when the metal base material is a rolled foil, surface irregularities due to rolling streaks exist on the surface, while when the metal base material is an electrolytic foil, surface irregularities also exist on the surface. Therefore, there is a problem that the characteristics of the thin film element are deteriorated due to the surface irregularities. Thus, it is demanded to improve the surface smoothness of the substrates for thin film elements.

However, in the case of applying a polyimide resin composition on a metal base material and thereby forming an insulating layer, when the polyimide resin composition is applied in the manner such as described above, uniform application is difficult, and repelling or foaming occurs. Also, surface irregularities exist on the surface of the metal base material, there is a problem that the uniformity of the film is markedly deteriorated.

It is believed that in the technique of using a polyimide resin composition to which a surfactant has been added as described in Patent Document 3, a film having excellent surface smoothness regardless of the surface irregularities of the substrate surface, can be formed. However, in the method of adding additives to such a polyimide resin composition, there remain various problems such as the compatibility of the additives with the polyimide resin composition, and the deterioration of the characteristics such as heat resistance of the film caused by the additives.

Furthermore, there is a problem in polyimide films that craters or pinholes due to air bubbles are generated. When craters or pinholes are present, the performance is deteriorated, and it is difficult to use polyimide films as insulating layers of electronic components.

Various factors can be considered as the causes for the generation of air bubbles in a film, but one of the factors may be a polyimide resin composition used in the formation of polyimide films. When a polyimide resin composition is prepared, air bubbles are incorporated into the polyimide resin composition, and these air bubbles remain in the film.

In order to remove air bubbles that have been incorporated into the polyimide resin composition, there has been proposed a method of degassing a polyamic acid varnish or a polyimide varnish (see, for example, Patent Documents 4 to 6). As a method of degassing a polyamic acid varnish or a polyimide varnish, for example, Patent Document 4 discloses a reduced pressure degassing method, a thin film type reduced pressure degassing method, and a centrifugal thin film degassing method; Patent Documents 4 and 5 disclose degassing methods using ultrasonic waves; and Patent Documents 4 and 6 disclose degassing methods of filtering using a filter.

As explained in the above, in a substrate for a thin film element in which a metal base material and an insulating layer containing polyimide are laminated, which substrate is used in thin film elements such as TFTs, thin film solar cells, and EL elements, since the thin film element unit formed on the insulating layer is thin, there is a risk that the fine surface irregularities of the surface of the substrate for a thin film element may deteriorate the characteristics of the thin film element. Therefore, it is demanded to improve the surface smoothness of the substrate for a thin film element. For example, in the case of a TFT, when there are fine surface irregularities in the semiconductor layer of the TFT, particularly in the underlying layer of a channel-forming region, that is, when fine surface irregularities exist on the surface of the insulating layer containing polyimide, the mobility of the TFT is markedly decreased, or a leak current flows, and the characteristics of the TFT are critically affected. Furthermore, the yield is decreased due to the surface state of the insulating layer containing polyimide.

The generation of craters or pinholes that are caused by air bubbles, on the surface of the insulating layer containing polyimide, can be suppressed through degassing of the polyimide resin composition. However, in the related art, as described in Patent Documents 4 and 6, those air bubbles having a size in the order of micrometers are considered to be problematic, but no investigation has been carried out on the air bubbles having a size in the order of nanometers. On the other hand, since the thin film element unit is thin in a substrate for a thin film element, the air bubbles having a size in the order of nanometers that affect the thin film element unit cause a problem. For example, in a TFT, those air bubbles in the nanometer order that affect the channel-forming region, cause a problem.

Here, foam in a liquid is in a state where a gas is mixed in a liquid while being in a gaseous form. This foam is not only incorporated from the outside, but is also very frequently generated from the liquid. On the other hand, a dissolved gas means a gas that is dissolved in a liquid, and this dissolved gas is not visible to the eye unlike the case of the foam.

The amount of a gas dissolved in a liquid varies with the type of the liquid, temperature or pressure, and the material to be wetted, and the dissolved gas in excess of the saturation amount is converted to foam and emerges. That is, even a liquid in a state without any foam may generate foam when the temperature or pressure changes. On the other hand, even if foam is present in the liquid, when the liquid is at a predetermined temperature or pressure, or when the amount of gas dissolved therein is lower than the saturation value, the foam is dissolved in the liquid. That is, simply removing the foam is not sufficient, and it is important to remove any dissolved gas.

If a dissolved gas is present in a polyimide resin composition in an amount close to the saturation amount, during the processes of application or the like, when the temperature or the pressure changes, the gas in excess of the saturation amount appears in the form of foam. If the gas in excess of the saturation amount is in a small amount, since it is difficult for the air bubble size to grow, there is no serious problem in view of the reduction of micrometer-sized air bubbles.

However, in order to control the smoothness to the order of nanometers in the surface of the insulating layer, it is necessary to suppress the generation of those air bubbles having a size in the order of nanometers. Accordingly, it is necessary to reduce the dissolved gas content in order to avoid the presence of any dissolved gas in excess of the saturation amount. Therefore, in order to prevent the generation of air bubbles having a size in the order of nanometers which exert adverse influence on the surface smoothness of the insulating layer in a substrate for a thin film element, it is very important to maintain the dissolved gas content in the polyimide resin composition to a value lower than the saturation amount.

CITATION LIST

Patent Documents

Patent Document 1: Japanese Patent Application Publication Laid-Open (JP-A) No. 2006-324368

Patent Document 2: JP-A No. 2008-147207
Patent Document 3: JP-A No. 2001-139808
Patent Document 4: JP-A No. 8-186343
Patent Document 5: JP-A No. 8-176505
Patent Document 6: JP-A No. 2002-348388

SUMMARY OF INVENTION

Technical Problem

The present invention was made in view of such circumstances, and it is an object of the invention to provide a substrate for a flexible device which, when a TFT is produced on a flexible substrate in which a metal layer and a polyimide layer are laminated, can suppress the deterioration of the electrical performance of the TFT caused by the surface irregularities of the metal foil surface, and can suppress detachment or cracking of the TFT.

Furthermore, the present invention was made in view of such circumstances, and it is another object of the invention to provide a substrate for a thin film element which has excellent surface smoothness and is capable of suppressing deterioration of the characteristics of thin film elements, and a method for manufacturing the substrate.

Solution to Problem

In order to achieve the objects described above, there is provided a substrate for a flexible device comprising a metal foil; a planarizing layer which is formed on the metal foil and contains polyimide; and a contact adhesive layer which is formed on the planarizing layer and contains an inorganic compound.

According to the present invention, since a planarizing layer containing polyimide is formed on a metal foil, the surface irregularities of the metal foil surface can be planarized, and when a TFT is produced on the substrate for a flexible device of the present invention, deterioration of the electrical performance of the TFT can be prevented. Furthermore, according to the present invention, since a contact adhesive layer is formed, when a TFT is produced on the substrate for a flexible device of the present invention, the adhesiveness between the substrate for a flexible device and the TFT is satisfactory, and the occurrence of detachment or cracking in the TFT can be prevented.

According to the invention described above, it is preferable that the planarizing layer contain polyimide as a main component. When polyimide is used as a main component, it is possible to obtain a planarizing layer having excellent insulation properties and heat resistance. Furthermore, when polyimide is used as a main component, thickness reduction of the planarizing layer is made possible, heat conductivity of the planarizing layer is enhanced, and a substrate for a flexible device having excellent heat conductivity can be obtained.

According to the invention described above, it is preferable that the surface roughness Ra of the contact adhesive layer be 25 nm or less. It is because when a TFT is produced on a substrate for a flexible device of the present invention, if the contact adhesive layer has smoothness as described above, deterioration in the electrical performance of the TFT can be effectively prevented.

Also, according to the present invention, it is preferable that the inorganic compound constituting the contact adhesive layer be at least one selected from the group consisting of silicon oxide, silicon nitride, silicon oxynitride, aluminum oxide, aluminum nitride, aluminum oxynitride, chromium oxide and titanium oxide. It is because when these materials are used, a film having satisfactory adhesiveness, smoothness, heat resistance, insulation properties and the like may be obtained.

Furthermore, according to the present invention, the contact adhesive layer may be a multilayer film. In this case, it is preferable that the contact adhesive layer has: a first contact adhesive layer that is formed on the planarizing layer and is formed from at least one selected from the group consisting of chromium, titanium, aluminum, silicon, silicon nitride, silicon oxynitride, aluminum oxide, aluminum nitride, aluminum oxynitride, chromium oxide and titanium oxide; and a second contact adhesive layer formed on the first contact adhesive layer and formed from silicon oxide. The first contact adhesive layer can increase the adhesiveness between the planarizing layer and the second contact adhesive layer, and the second contact adhesive layer can increase the adhesiveness between the planarizing layer and the TFT produced on the substrate for a flexible device of the present invention. Furthermore, by employing such a configuration, a contact adhesive layer having excellent adhesiveness, smoothness, heat resistance, insulation properties and the like can be obtained.

Furthermore, according to the present invention, it is preferable that the thickness of the contact adhesive layer be in the range of 1 nm to 500 nm. It is because if the thickness of the contact adhesive layer is too small, sufficient adhesiveness may not be obtained, and if the thickness of the contact adhesive layer is too large, cracks may occur.

Also, according to the present invention, it is preferable that the surface roughness Ra of the planarizing layer be 25 nm or less. It is because when a TFT is produced on the substrate for a flexible device of the present invention, if the planarizing layer has smoothness as described above, deterioration in the electrical performance of the TFT can be effectively prevented.

According to the present invention, it is preferable that the coefficient of hygroscopic expansion of the planarizing layer be in the range of 0 ppm/% RH to 15 ppm/% RH. The coefficient of hygroscopic expansion is an index of water absorbency, and a smaller coefficient of hygroscopic expansion means lower water absorbency. Therefore, when the coefficient of hygroscopic expansion is in the range described above, high reliability can be realized in the presence of moisture. For example, in the case of using the substrate for a flexible device of the present invention in an organic EL display apparatus, since organic EL display apparatuses are sensitive to moisture, in order to reduce moisture inside an element, it is preferable that the coefficient of hygroscopic expansion be relatively smaller. Furthermore, as the coefficient of hygroscopic expansion of the planarizing layer is smaller, the dimensional stability of the planarizing layer is enhanced. Since the coefficient of hygroscopic expansion of the metal foil is almost close to zero, if the coefficient of hygroscopic expansion of the planarizing layer is too large, there is a risk that the adhesiveness of the planarizing layer and the metal foil may be decreased.

Furthermore, according to the present invention, the planarizing layer may be partially formed on the metal foil. For example, when an organic EL display apparatus is produced using the substrate for a flexible device of the present invention, if a planarizing layer is formed over the entire surface of the metal foil and the end face of the planarizing layer is exposed, since polyimides generally exhibit hygroscopic properties, there is a risk that moisture may penetrate into the inside the element through the end faces of the planarizing layer at the time of production or at the time of driving, and the element performance may be deteriorated. Furthermore, for example, when an organic EL display apparatus is produced using the substrate for a flexible device of the present invention, the sealing member can be closely attached to the metal foil without using a planarizing layer therebetween, and the penetration of moisture into the organic EL display apparatus can be prevented. Meanwhile, the area where the metal foil is exposed may serve as a through-hole for penetrating through the planarizing layer and the contact adhesive layer and conducting electricity to the metal foil.

According to the present invention, it is preferable that the thickness of the planarizing layer be in the range of 1 μm to 1,000 μm. It is because if the thickness of the planarizing layer is too small, the insulation properties may not be maintained, or it may be difficult to planarize the surface irregularities of the metal foil surface. Also, it is because if the thickness of the planarizing layer is too large, flexibility may decrease or become excessive, drying may become difficult at the time of film formation, or the production cost may increase. In the case of imparting the function of heat dissipation to the substrate for a flexible device of the present invention, if the thickness of the planarizing layer is large, since polyimides have lower heat conductivity than metals, the heat conductivity of the planarizing layer is decreased.

Furthermore, according to the present invention, it is preferable that the coefficient of linear thermal expansion of the planarizing layer be in the range of 0 ppm/° C. to 25 ppm/° C. It is because when the coefficient of linear thermal expansion of the planarizing layer is in the range described above, the coefficients of linear thermal expansion of the planarizing layer and the metal foil may be adjusted to be close to each other, so that warpage of the substrate for a flexible device can be suppressed, and also, the adhesiveness between the planarizing layer and the metal foil can be increased.

According to the present invention, it is preferable that the difference between the coefficient of linear thermal expansion of the planarizing layer and the coefficient of linear thermal expansion of the metal foil be 15 ppm/° C. or less. As described above, it is because as the coefficients of linear thermal expansion of the planarizing layer and the metal foil are closer to each other, warpage of the substrate for a flexible device can be suppressed, and also, the adhesiveness between the planarizing layer and the metal foil is increased.

Furthermore, according to the present invention, it is preferable that the thickness of the metal foil be in the range of 1 μm to 1,000 μm. It is because if the thickness of the metal foil is too small, the gas barrier properties against oxygen or water vapor may decrease, or durability may deteriorate. Also, it is because if the thickness of the metal foil is too large, flexibility may decrease or become excessive, or the production cost may rise.

Furthermore, the present invention provides a TFT substrate for a flexible device comprising a substrate for a flexible device described above and a TFT formed on the contact adhesive layer of the substrate for a flexible device.

According to the present invention, since the substrate for a flexible device described above is used, the deterioration of the electrical performance of the TFT caused by the surface irregularities of the metal foil surface can be prevented, and also, the occurrence of detachment or cracks in the TFT can be prevented due to the contact adhesive layer.

In regard to the invention described above, it is preferable that the TFT have an oxide semiconductor layer. Oxide semiconductors are such that the electrical characteristics vary under the influence of water or oxygen. However, since the TFT substrate for a flexible device of the present invention has a metal foil, permeation of water vapor can be suppressed, and therefore, deterioration of the characteristics of the semiconductors can be prevented. Also, for example, in the case of using the TFT substrate for a flexible device of the present invention in an organic EL display apparatus, although organic EL display apparatuses are poor in the resistance to water or oxygen, since the permeation of oxygen and water vapor can be suppressed by the metal foil, deterioration of the element performance can be suppressed.

Furthermore, the present invention provides a flexible device comprising the TFT substrate for a flexible device described above.

According to the present invention, since the TFT substrate for a flexible device described above is used, the deterioration of the electrical performance of the TFT caused by the surface irregularities of the metal foil surface can be prevented, and also, the occurrence of detachment or cracks in the TFT can be prevented even at the time of production or use of the flexible device.

The present invention also provides an organic EL display apparatus comprising: a substrate for a flexible device having a metal foil, a planarizing layer which is formed on the metal foil and contains polyimide, and a contact adhesive layer which is formed on the planarizing layer and contains an inorganic compound; a back surface electrode layer and a TFT formed on the contact adhesive layer of the substrate for a flexible device; an electroluminescent (hereinafter, may be referred to as EL) layer which is formed on the back surface electrode layer and includes at least an organic light emitting layer; and a transparent electrode layer formed on the EL layer.

According to the present invention, since the substrate for a flexible device described above is used, the deterioration of the electrical performance of the TFT caused by the surface irregularities of the metal foil surface can be prevented, and also, the occurrence of detachment or cracks in the TFT can be prevented even at the time of production or use of the organic EL display apparatus.

Furthermore, the present invention provides an electronic paper comprising: a substrate for a flexible device having a metal foil, a planarizing layer which is formed on the metal foil and contains polyimide, and a contact adhesive layer which is formed on the planarizing layer and contains an inorganic compound; a back surface electrode layer and a TFT formed on the contact adhesive layer of the substrate for a flexible device; a display layer formed on the back surface electrode layer; and a transparent electrode layer formed on the display layer.

According to the present invention, since the substrate for a flexible device described above is used, the deterioration of the electrical performance of the TFT caused by the surface irregularities of the metal foil surface can be prevented, and also, the occurrence of detachment or cracks in the TFT can be prevented even at the time of production or use of the electronic paper.

Furthermore, in order to achieve the objects described above, the present invention provides a substrate for a thin film element comprising a metal base material and an insulating layer which is formed on the metal base material and contains polyimide, characterized in that the surface roughness Ra of the insulating layer is 30 nm or less.

According to the present invention, since the insulating layer has excellent surface smoothness, deterioration of the characteristics of a thin film element caused by fine surface irregularities can be prevented.

In regard to the invention described above, it is preferable that the contact angle of the metal base material surface with respect to the solvent included in the polyimide resin composition that is used in the insulating layer be 30° or less. When the contact angle with respect to the solvent included in the polyimide resin composition is made small to a predetermined range, the wettability of the polyimide resin composition to the metal base material can be further enhanced, and the uniformity of the coating film can be further increased. Also, the fluctuation of the contact angle with respect to the solvent included in the polyimide resin composition between metal base materials or inside the metal base material can be reduced, and an insulating layer can be formed stably.

Furthermore, according to the present invention, it is preferable that the metal base material contains iron as a main component. For a metal base material containing iron as a main component, a wide variety of compositions have been developed, and the composition can be selected in accordance with the characteristics needed for the use. Furthermore, a metal base material containing iron as a main component has high chemical resistance, and various chemical treatments can be applied. In addition, a metal base material containing iron as a main component also has an advantage that the metal base material is excellent in the properties such as heat resistance, oxidation resistance and low expansion.

Furthermore, according to the present invention, it is preferable that the ratio of the amount of carbon (C) element relative to the total amount of elements detected by X-ray photoelectron spectrophotometry (XPS) from the metal base material surface be 0.25 or less. It is because when the ratio of the amount of carbon (C) element relative to the total amount of detected elements is in the range described above, the contact angle of the metal base material surface with respect to the solvent included in the polyimide resin composition decreases, and the coating properties of the polyimide resin composition on the metal base material can be ameliorated.

Also, according to the present invention, it is preferable that the coefficient of hygroscopic expansion of the insulating layer be in the range of 0 ppm/% RH to 15 ppm/% RH. The coefficient of hygroscopic expansion is an index of water absorbency, and a smaller coefficient of hygroscopic expansion means lower water absorbency. Therefore, when the coefficient of hygroscopic expansion is in the range described above, high reliability can be realized in the presence of moisture. Furthermore, as the coefficient of hygroscopic expansion of the insulating layer is smaller, the dimensional stability of the insulating layer is enhanced. Since the coefficient of hygroscopic expansion of the metal base material is almost close to zero, if the coefficient of hygroscopic expansion of the insulating layer is too large, there is a risk that the adhesiveness of the insulating layer and the metal base material may be decreased.

According to the present invention, it is preferable that the coefficient of linear thermal expansion of the insulating layer be in the range of 0 ppm/° C. to 25 ppm/° C. It is because when the coefficient of linear thermal expansion of the insulating layer is in the range described above, the coefficients of linear thermal expansion of the insulating layer and the metal base material may be adjusted to be close to each other, so that warpage of the substrate for a thin film element can be suppressed, and also, the adhesiveness between the insulating layer and the metal base material can be increased.

According to the present invention, it is preferable that the difference between the coefficient of linear thermal expansion of the insulating layer and the coefficient of linear thermal expansion of the metal base material be 15 ppm/° C. or less. As described above, it is because, as the coefficients of linear thermal expansion of the insulating layer and the metal base material are closer to each other, warpage of the substrate for a thin film element can be suppressed, and also, the adhesiveness between the insulating layer and the metal base material is increased.

Furthermore, the present invention provides a thin film element comprising the substrate for a thin film element, and a thin film element unit formed on the substrate for a thin film element.

According to the present invention, since the substrate for a thin film element described above is used, it is possible to obtain a thin film element having excellent characteristics.

Furthermore, the present invention provides a TFT comprising the substrate for a thin film element described above, and a TFT formed on the substrate for a thin film element.

According to the present invention, since the substrate for a thin film element described above is used, it is possible to obtain a TFT having satisfactory electrical performance.

Furthermore, in order to achieve the objects described above, the present invention provides a method for manufacturing a substrate for a thin film element, comprising steps of: metal base material surface treatment step of subjecting a metal base material to a chemical treatment; and an insulating layer forming step of applying a polyimide resin composition on the metal base material and thereby forming an insulating layer, characterized in that the surface roughness Ra of the insulating layer is 30 nm or less.

In a metal base material which has not been subjected to any treatment, there are occasions in which organic components contained in the atmosphere adhere to the surface of the metal base material during the time period between the production and the use of the metal base material. Furthermore, metal base materials include rolled foils and electrolytic foils, and in the case of a rolled foil, organic components such as rolling oil used in the production process for the rolled foil, particularly in a metal rolling step, may adhere to the surface of the metal base material. As such, since many organic components adhere to the surface of the metal base material, wettability of the polyimide resin composition to the metal base material is decreased.

According to the present invention, the organic components remaining on the surface of the metal base material can be removed by subjecting the metal base material to a chemical treatment, and the wettability of the polyimide resin composition to the metal base material can be improved. For that reason, when a polyimide resin composition is applied on the metal base material, the resin composition can be uniformly applied, and the occurrence of repelling or foaming can be suppressed. Therefore, uniformity of the coating film is enhanced, pinholes or craters are reduced, and an insulating layer having excellent surface smoothness can be formed. Even in the case where surface irregularities exist in the metal base material surface, the surface irregularities of the metal base material surface can be planarized by forming an insulating layer on the metal base material, and the surface smoothness of the substrate for a thin film element can be improved. Therefore, according to the present invention, a substrate for a thin film element capable of preventing deterioration of the characteristics of a thin film element can be obtained. Furthermore, according to the present invention, since an insulating layer is formed by using a polyimide resin composition, it is possible to form an insulating layer having excellent insulation properties, heat resistance and dimensional stability. Also, thickness reduction of the insulating layer can be achieved, heat conductivity of the insulating layer is enhanced, and it is possible to obtain a substrate for a thin film element which has excellent heat dissipation properties and also has excellent gas barrier properties due to the possession of a metal base material.

Furthermore, in regard to the metal base material, when the metal base material has a small thickness and can be rolled up, and the use amount is a large amount, a roll-shaped metal base material is mainly used, and when the metal base material has a large thickness and is difficult to roll up, or the use amount is a small amount, a sheet-like metal base material is mainly used. Here, a metal base material that has not been subjected to any treatment has a large fluctuation in the wettability of the polyimide resin composition to the metal base material between the metal base materials or within the metal base material. Particularly, the fluctuation of wettability of the polyimide resin composition within the metal base material becomes conspicuous in the roll-shaped metal base material. This can be considered to be because the extents of remaining of the organic components described above differ in different metal base materials.

For that reason, when the above-described organic components remaining on the surface of the metal base material are removed by subjecting the metal base material to a chemical treatment, the fluctuation in the wettability of the polyimide resin composition between metal base materials or inside the metal base material can be reduced, and an insulating layer can be formed stably.

In regard to the present invention described above, it is preferable to apply a chemical treatment during the process of surface treatment of the metal base material, so that the contact angle of the metal base material surface with respect to the solvent included in the polyimide resin composition is adjusted to 30° or less. When the contact angle with respect to the solvent included in the polyimide resin composition is made small to a predetermined range, the wettability of the polyimide resin composition to the metal base material can be further enhanced, and the uniformity of the coating film can be further increased. Also, the fluctuation of the contact angle with respect to the solvent included in the polyimide resin composition between metal base materials or inside the metal base material can be reduced, and an insulating layer can be formed stably.

Also, according to the present invention, it is preferable that the metal base material contains iron as a main component. For a metal base material containing iron as a main component, a wide variety of compositions have been developed, and the composition can be selected in accordance with the characteristics needed for the use. Furthermore, a metal base material containing iron as a main component has high chemical resistance, and various chemical treatments can be applied. In addition, a metal base material containing iron as a main component also has an advantage that the metal base material is excellent in the properties such as heat resistance, oxidation resistance and low expansion.

According to the present invention, it is preferable that the polyimide resin composition contains a polyimide precursor. Because a polyimide obtained after ring-closure does not dissolve easily in a solvent, it is preferable to use a polyimide precursor.

Furthermore, according to the present invention, it is preferable that the ratio of the amount of carbon (C) element relative to the total amount of elements detected by X-ray photoelectron spectrophotometry (XPS) from the metal base material surface after the process of surface treatment of the metal base material be 0.25 or less. It is because when the ratio of the amount of carbon (C) element relative to the total amount of elements detected is in the range described above, the contact angle of the metal base material surface with respect to the solvent included in the polyimide resin composition decreases, and the coating properties of the polyimide resin composition on the metal base material can be ameliorated.

To attain the above-mentioned objects, the present invention also provides a method for manufacturing a substrate for a thin film element, comprising steps of: a degassing step of degassing a polyimide resin composition so that the relative dissolved oxygen saturation calculated by a method described below is adjusted to 95% or less; and an insulating layer forming step of applying the polyimide resin composition on a metal base material and thereby forming an insulating layer, characterized in that the surface roughness Ra of the insulating layer is 30 nm or less.

<Method for Calculating Relative Dissolved Oxygen Saturation>

First, using a dissolved oxygen-saturated solvent prepared by bubbling air for 30 minutes or more into the solvent included in the polyimide resin composition, calibration of a dissolved oxygen meter is performed such that the measured value of the dissolved oxygen content of the above-mentioned solvent which contains no dissolved oxygen is designated as 0, and the measured value of the dissolved oxygen content of the dissolved oxygen-saturated solvent is designated as 100. Subsequently, the relative value of the dissolved oxygen content of a reference polyimide resin composition prepared by leaving the polyimide resin composition to stand for one hour or longer in air, and the relative value of the dissolved oxygen content of a degassed polyimide resin composition prepared by degassing the polyimide resin composition are measured with the calibrated dissolved oxygen meter. Then, the relative value of the dissolved oxygen content of the degassed polyimide resin composition determined when the relative value of the dissolved oxygen content of the reference polyimide resin composition is designated as 100%, is designated as the relative dissolved oxygen saturation.

If a gas is dissolved in a polyimide resin composition, there are occasions in which the dissolved gas in the polyimide resin composition appears in the form of foam, as a result of change in the temperature or pressure. Accordingly, in order to reduce air bubbles in the insulating layer, it is important to remove any dissolved gas in the polyimide resin composition. Furthermore, most of the gas dissolved in the polyimide resin composition is nitrogen or oxygen. Since nitrogen is an inert gas, measurement thereof is difficult, but oxygen is measurable, and the ratio of the solubilities of oxygen and nitrogen in a solvent is almost constant. Therefore, it is possible to estimate the amount of the dissolved gas as a mixture of nitrogen and oxygen, by determining the dissolved oxygen content. Furthermore, regarding the dissolved oxygen content, it is difficult to measure the absolute value in a solvent other than water.

Thus, according to the present invention, the dissolved oxygen content is estimated as a relative value (relative dissolved oxygen saturation) based on the dissolved oxygen content of a dissolved oxygen-saturated solvent prepared by bubbling air for 30 minutes or more into the solvent that is included in the polyimide resin composition, and the polyimide resin composition is degassed so that the relative dissolved oxygen saturation is adjusted to 95% or less. When the relative dissolved oxygen saturation is 95% or less, it does not occur that the dissolved oxygen content exceeds the saturation amount immediately after a change in the temperature or pressure, and therefore, the generation of air bubbles can be suppressed. As a result, the generation of air bubbles having a size in the order of micrometers as well as air bubbles having a size in the order of nanometers can be suppressed. Therefore, an insulating layer having excellent surface smoothness with a surface roughness Ra of 30 nm or less can be formed, and it is possible to produce a substrate for a thin film element which is capable of preventing the deterioration of the characteristics of thin film elements caused by fine surface irregularities.

According to the invention described above, it is preferable to perform the degassing step immediately before the insulating layer forming step. It is because air bubbles included in the insulating layer can be effectively reduced thereby.

Furthermore, according to the present invention, it is preferable that the coefficient of hygroscopic expansion of the insulating layer be in the range of 0 ppm/% RH to 15 ppm/% RH. The coefficient of hygroscopic expansion is an index of water absorbency, and a smaller coefficient of hygroscopic expansion means lower water absorbency. Therefore, when the coefficient of hygroscopic expansion is in the range described above, high reliability can be realized in the presence of moisture. Furthermore, as the coefficient of hygroscopic expansion of the insulating layer is smaller, the dimensional stability of the insulating layer is enhanced. Since the coefficient of hygroscopic expansion of the metal base material is almost close to zero, if the coefficient of hygroscopic expansion of the insulating layer is too large, there is a risk that the adhesiveness of the insulating layer and the metal base material may be decreased.

Also, according to the present invention, it is preferable that the coefficient of linear thermal expansion of the insulating layer be in the range of 0 ppm/° C. to 25 ppm/° C. It is because when the coefficient of linear thermal expansion of the insulating layer is in the range described above, the coefficients of linear thermal expansion of the insulating layer and the metal base material may be adjusted to be close to each other, so that warpage of the substrate for a thin film element can be suppressed, and also, the adhesiveness between the insulating layer and the metal base material can be increased.

According to the present invention, it is preferable that the difference between the coefficient of linear thermal expansion of the insulating layer and the coefficient of linear thermal expansion of the metal base material be 15 ppm/° C. or less. As described above, it is because, as the coefficients of linear thermal expansion of the insulating layer and the metal base material are closer to each other, warpage of the substrate for a thin film element can be suppressed, and also, the adhesiveness between the insulating layer and the metal base material is increased.

Furthermore, according to the present invention, it is preferable to have a contact adhesive layer forming step of forming a contact adhesive layer containing an inorganic compound on the insulating layer, after the insulating layer forming step. By forming a contact adhesive layer, a substrate for a thin film element which has satisfactory adhesiveness to the thin film element unit and can prevent the occurrence of detachment or cracking in the thin film element unit, can be obtained.

In the case described above, it is preferable that the inorganic compound constituting the contact adhesive layer be at least one selected from the group consisting of silicon oxide, silicon nitride, silicon oxynitride, aluminum oxide, aluminum nitride, aluminum oxynitride, chromium oxide and titanium oxide. It is because when these materials are used, a film having satisfactory adhesiveness, smoothness, heat resistance, insulation properties and the like may be obtained.

Furthermore, in the case described above, it is preferable that the contact adhesive layer be a multilayer film. In this case, it is preferable that the contact adhesive layer be formed on the insulating layer, and has: a first contact adhesive layer formed from at least one selected from the group consisting of chromium, titanium, aluminum, silicon, silicon nitride, silicon oxynitride, aluminum oxide, aluminum nitride, aluminum oxynitride, chromium oxide and titanium oxide; and a second contact adhesive layer formed on the first contact adhesive layer and formed from silicon oxide. The first contact adhesive layer can increase the adhesiveness between the insulating layer and the second contact adhesive layer, and the second contact adhesive layer can increase the adhesiveness between the insulating layer and the thin film element unit. Furthermore, by employing such a configuration, a contact adhesive layer having excellent adhesiveness, smoothness, heat resistance, insulation properties and the like can be obtained.

The present invention also provides a method for manufacturing a thin film element, comprising a thin film element unit forming step of forming a thin film element unit on a substrate for a thin film element produced by the method for manufacturing a substrate for a thin film element described above.

According to the present invention, since the substrate for a thin film element described above is used, it is possible to obtain a thin film element having excellent characteristics.

The present invention also provides a method for manufacturing a TFT, comprising a TFT forming step of forming a TFT on a substrate for a thin film element produced by the method for manufacturing a substrate for a thin film element described above.

According to the present invention, since the substrate for a thin film element described above is used, it is possible to obtain a TFT having satisfactory electrical performance.

In regard to the invention described above, it is preferable that the TFT have an oxide semiconductor layer. Oxide semiconductors are such that the electrical characteristics vary under the influence of water or oxygen. However, since permeation of water vapor or oxygen can be suppressed by the substrate for a thin film element, deterioration of the characteristics of the semiconductors can be prevented.

Advantageous Effects of Invention

According to the present invention, since a planarizing layer is formed on a metal foil, the surface irregularities of the metal foil surface can be planarized. Therefore, deterioration of the electrical performance of a TFT can be prevented, and also, since a contact adhesive layer is formed, the adhesiveness between the substrate for a flexible device and the TFT is satisfactory, and there is obtained an effect that the occurrence of detachment or cracking in the TFT can be prevented.

Furthermore, according to the present invention, since the wettability of a polyimide resin composition to a metal base material can be improved by subjecting the metal base material to a chemical treatment, when the polyimide resin composition is applied on the metal base material, the polyimide resin composition can be uniformly applied. Also, the occurrence of repelling or foaming can be suppressed, and there is obtained an effect that it is possible to obtain a substrate for a thin film element having excellent surface smoothness.

In addition, according to the present invention, when the polyimide resin composition is degassed so that the relative dissolved oxygen saturation calculated by a predetermined method is adjusted to 95% or less, it is possible to suppress the generation of air bubbles having a size in the order of micrometers as well as air bubbles having a size in the order of nanometers, and an insulating layer having excellent surface smoothness with a surface roughness Ra of 30 nm or less can be formed. Thus, there is obtained an effect that deterioration of the characteristics of thin film elements caused by fine surface irregularities can be prevented.

DESCRIPTION OF EMBODIMENTS

Hereinafter, detailed descriptions will be given on the substrate for a flexible device, the TFT substrate for a flexible device, the flexible device, the organic EL display apparatus, the electronic paper, the substrate for a thin film element, the thin film element, the TFT, the method for manufacturing a substrate for a thin film element, the method for manufacturing a thin film element, and the method for manufacturing a TFT of the present invention.

A. Substrate for a Flexible Device

First, the substrate for a flexible device of the present invention will be explained.

The substrate for a flexible device of the present invention comprises: a metal foil, a planarizing layer which is formed on the metal foil and contains polyimide, and a contact adhesive layer which is formed on the planarizing layer and contains an inorganic compound.

The substrate for a flexible device of the present invention will be described while making reference to the attached drawings.

Figure 1:
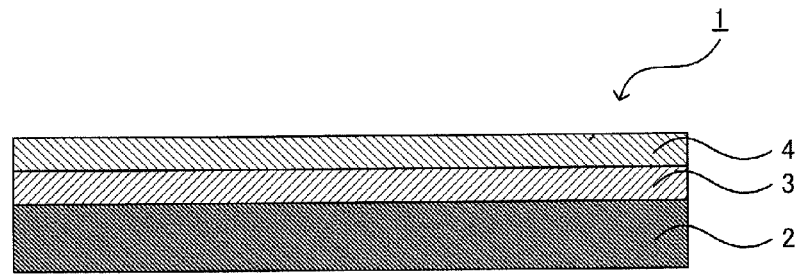
FIG. 1 is a schematic cross-sectional diagram showing an example of the substrate for a flexible device of the present invention.

FIG. 1 is a schematic cross-sectional diagram showing an example of the substrate for a flexible device of the present invention. The substrate for a flexible device 1 illustrated in FIG. 1 comprises: a metal foil 2, a planarizing layer 3 which is formed on the metal foil 2 and contains polyimide, and a contact adhesive layer 4 which is formed on the planarizing layer 3 and contains an inorganic compound.

FIG. 2A to FIG. 4B are schematic cross-sectional diagrams showing exemplary TFT substrates, each of which include the substrate for a flexible device of the present invention.

Figure 2A:
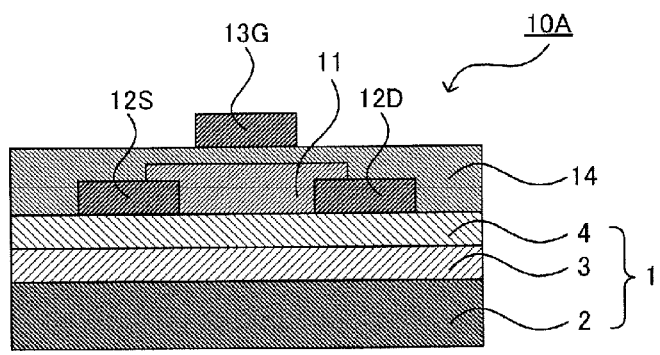
FIGS. 2A and 2B are each a schematic cross-sectional diagram showing an example of the TFT substrate for a flexible device of the present invention.

The TFT substrate 10A illustrated in FIG. 2A includes a TFT having a top gate/bottom contact structure, and comprises: a source electrode 12S, a drain electrode 12D and a semiconductor layer 11 formed on a contact adhesive layer 4 of the substrate for a flexible device 1; a gate insulating film 14 formed on the source electrode 12S, the drain electrode 12D and the semiconductor layer 11; and a gate electrode 13G formed on the gate insulating film 14.

Figure 2B:
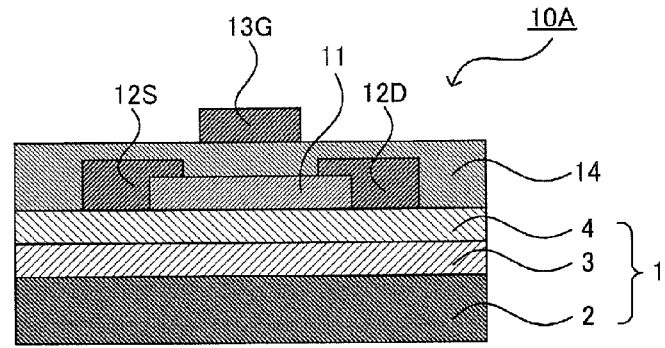

The TFT substrate 10A illustrated in FIG. 2B includes a TFT having a top gate/top contact structure, and comprises: a semiconductor layer 11, a source electrode 12S and a drain electrode 12D formed on a contact adhesive layer 4 of the substrate for a flexible device 1; a gate insulating film 14 formed on the semiconductor layer 11, the source electrode 12S and the drain electrode 12D; and a gate electrode 13G formed on the gate insulating film 14.

Figure 3A:
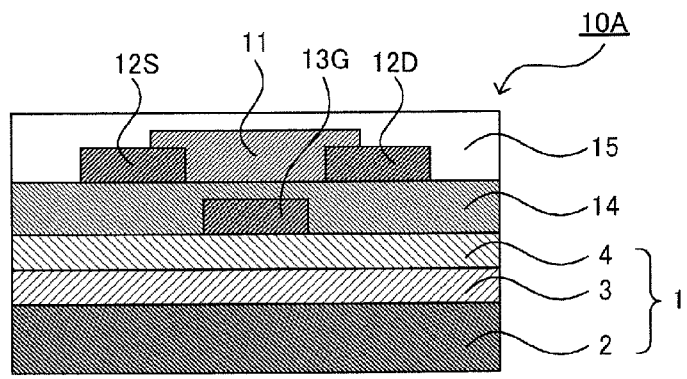
FIGS. 3A and 3B are each a schematic cross-sectional diagram showing another example of the TFT substrate for a flexible device of the present invention.

The TFT substrate 10A illustrated in FIG. 3A includes a TFT having a bottom gate/bottom contact structure, and comprises: a gate electrode 13G formed on a contact adhesive layer 4 of the substrate for a flexible device 1; a gate insulating film 14 formed so as to cover the gate electrode 13G; a source electrode 12S, a drain electrode 12D and a semiconductor layer 11 formed on the gate insulting film 14; and a protecting film 15 formed on the source electrode 12S, the drain electrode 12D and the semiconductor layer 11.

Figure 3B:
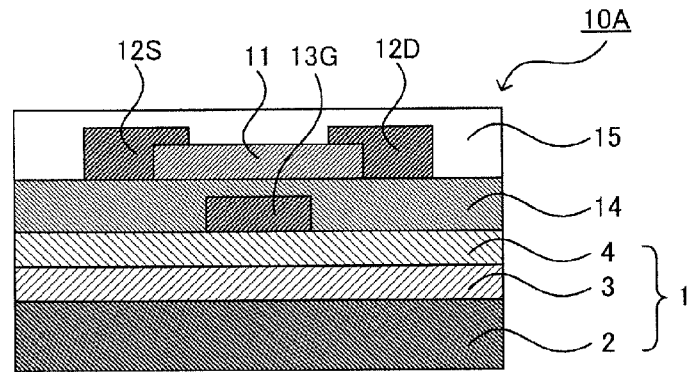

The TFT substrate 10A illustrated in FIG. 3B includes a TFT having a bottom gate/top contact structure, and comprises: a gate electrode 13G formed on a contact adhesive layer 4 of the substrate for a flexible device 1; a gate insulating film 14 formed so as to cover the gate electrode 13G; a semiconductor layer 11, a source electrode 12S and a drain electrode 12D formed on the gate insulating film 14; and a protecting film 15 formed on the semiconductor layer 11, the source electrode 12S and the drain electrode 12D.

Figure 4A:
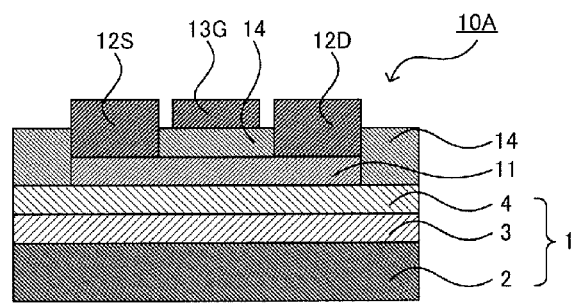
FIGS. 4A and 4B are each a schematic cross-sectional diagram showing still another example of the TFT substrate for a flexible device of the present invention.

The TFT substrate 10A illustrated in FIG. 4A includes a TFT having a coplanar type structure, and comprises: a semiconductor layer 11 formed on a contact adhesive layer 4 of the substrate for a flexible device 1; a source electrode 12S and a drain electrode 12D formed on the semiconductor layer 11; a gate insulating film 14 formed on the semiconductor layer 11; and a gate electrode 13G formed on the gate insulating film 14.

Figure 4B:
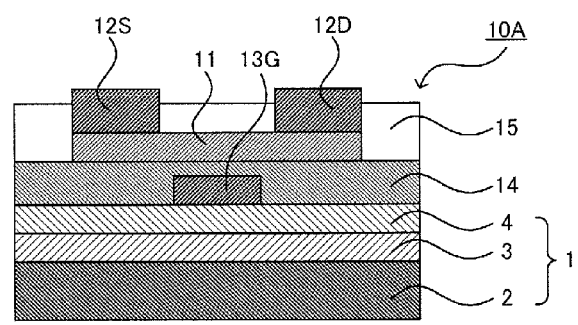

The TFT substrate 10A illustrated in FIG. 4B also includes a TFT having a coplanar type structure, and comprises: a gate electrode 13G formed on a contact adhesive layer 4 of the substrate for a flexible device 1; a gate insulating film 14 formed on the gate electrode 13G; a semiconductor layer 11 formed on the gate insulating film 14; a source electrode 12S and a drain electrode 12D formed on the semiconductor layer 11; and a protecting film 15 formed on the semiconductor layer 11.

According to the present invention, since a planarizing layer containing polyimide is formed on a metal foil, the surface irregularities of the metal foil surface can be planarized, and deterioration of the electrical performance of the TFT can be prevented. Also, according to the present invention, since a contact adhesive layer is formed on the planarizing layer, the adhesive between the substrate for a flexible device and the TFT is excellent. Thus, even when moisture or heat is applied during the production of the TFT substrate, and the dimension of the planarizing layer containing polyimide undergoes a change, the occurrence of detachment or cracking in the electrodes or the semiconductor layer constituting the TFT can be prevented.

Furthermore, since the substrate for a flexible device of the present invention has a metal foil, permeation of moisture or oxygen can be reduced. Therefore, when an organic EL display apparatus is produced using the substrate for a flexible device of the present invention, the deterioration of the EL layer caused by moisture or oxygen can be suppressed. Also, when an electronic paper of a liquid crystal display system is produced using the substrate for a flexible device of the present invention, liquid crystals can be prevented from being exposed to water vapor. Furthermore, according to the present invention, since metal foils generally have excellent heat conductivity, metal foils can be used as substrates for flexible devices having heat dissipation properties. Therefore, when an organic EL display apparatus is produced using the substrate for a flexible device of the present invention, deterioration of the EL layer as a result of heat generation upon light emission of the organic EL display apparatus, and the consequent occurrence of luminance unevenness or shortening of the element lifetime, can be suppressed.

Furthermore, since the substrate for a flexible device of the present invention has a metal foil, the strength can be increased. Therefore, when an organic EL display apparatus or an electronic paper is produced using the substrate for a flexible device of the present invention, durability can be enhanced.

Hereinafter, the various configurations of the substrate for a flexible device of the present invention will be explained.

1. Contact Adhesive Layer

The contact adhesive layer according to the present invention is a layer formed on a planarizing layer and containing an inorganic compound, and is a layer provided in order to obtain sufficient adhesive power between a planarizing layer containing polyimide and a TFT produced on the substrate for a flexible device of the present invention.

It is preferable that the contact adhesive layer have smoothness. It is desirable that the surface roughness Ra of the contact adhesive layer be smaller than the surface roughness Ra of the metal foil, and specifically, the surface roughness of the contact adhesive layer is preferably 25 nm or less, and more preferably 10 nm or less. It is because if the surface roughness Ra of the contact adhesive layer is too large, when a TFT is produced on the substrate for a flexible device of the present invention, there is a risk that the electrical performance of the TFT may deteriorate.

Meanwhile, the surface roughness Ra is a value measured by using an atomic force microscope (AFM) or a scanning white light interferometer. For example, in the case of measuring the value using an AFM, Ra can be determined by taking an image of the surface morphology using Nanoscope V Multimode™ (manufactured by Veeco Instruments, Inc.) in a tapping mode, under the conditions of cantilever: MPP11100, scan range: 50 μm×50 μm, and scan speed: 0.5 Hz, and calculating the discrepancy of the average from the center line of a roughness curve calculated from the image thus obtained. Furthermore, in the case of measuring the value using a scanning white light interferometer, Ra can be determined by taking an image of the surface morphology of an area having a size of 50 μm×50 μm using New View 5000™ (manufactured by Zygo Corp.) under the conditions of object lens: 100 times, zoom lens: 2 times, and scan length: 15 μm, and calculating the discrepancy of the average from the center line of a roughness curve calculated from the image thus obtained.

Furthermore, it is preferable that the contact adhesive layer have heat resistance. It is because in the case of producing a TFT on the substrate for a flexible device of the present invention, the TFT is usually subjected to a high temperature treatment during the production of the TFT. In regard to the heat resistance of the contact adhesive layer, it is preferable that the 5% weight loss temperature of the contact adhesive layer be 300° C. or higher.

Meanwhile, for the measurement of the 5% weight loss temperature, a thermogravimetric differential thermal analysis (TG-DTA) was carried out using a thermal analyzer (DTG-60™, manufactured by Shimadzu Corp.) under the conditions of atmosphere: nitrogen atmosphere, temperature range: 30° C. to 600° C., and rate of temperature increase: 10° C./min, and the temperature at which the weight of the sample decreased by 5% was designated as the 5% weight loss temperature (° C.).

The contact adhesive layer usually has insulation properties. It is because when a TFT is produced on the substrate for a flexible device of the present invention, insulation properties are required of the substrate for a flexible device.

Furthermore, when a TFT is produced on the substrate for a flexible device of the present invention, it is preferable that the contact adhesive layer be capable of preventing the diffusion of impurity ions or the like that are contained in the planarizing layer containing polyimide into the semiconductor layer of the TFT. Specifically, the ion permeability of the contact adhesive layer is preferably such that the iron (Fe) ion concentration is 0.1 ppm or less, or the sodium (Na) ion concentration is 50 ppb or less. Meanwhile, as the method for measuring the concentration of Fe ions or Na ions, a method of extracting a layer formed on the contact adhesive layer through sampling, and then analyzing the ion concentration by an ion chromatographic method, is used.

There are no particular limitations on the inorganic compound constituting the contact adhesive layer as long as the inorganic compound satisfies the characteristics described above, and examples include silicon oxide, silicon nitride, silicon oxynitride, aluminum oxide, aluminum nitride, aluminum oxynitride, chromium oxide, and titanium oxide. These may be used singly, or two or more kinds may be used together.

The contact adhesive layer may be a single layer or may be a multilayer.

When the contact adhesive layer is a multilayer film, plural layers formed from the inorganic compound described above may be laminated, or layers formed from the inorganic compound described above and layers formed from a metal may be laminated. The metal used in this case is not particularly limited as long as a contact adhesive layer which satisfies the characteristics described above can be obtained, and examples of the metal include chromium, titanium aluminum and silicon.

Furthermore, when the contact adhesive layer is a multilayer, it is preferable that the outermost layer of the contact adhesive layer be a silicon oxide film. That is, when a TFT is produced on the substrate for a flexible device of the present invention, it is preferable to produce the TFT on a silicon oxide film. It is because the silicon oxide film sufficiently satisfies the characteristics described above. The silicon oxide in this case is preferably $SiO_X$ (wherein X is in the range of 1.5 to 2.0).

Figure 5:
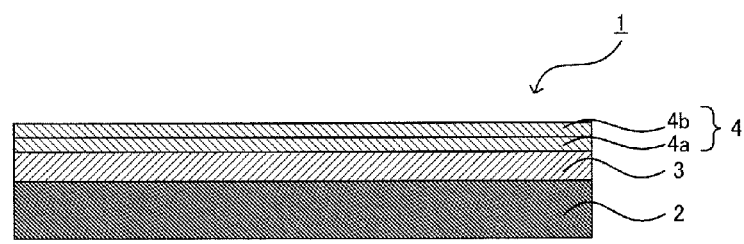
FIG. 5 is a schematic cross-sectional diagram showing yet another example of the substrate for a flexible device of the present invention.

Among them, it is preferable that the contact adhesive layer 4 contains, as illustrated in FIG. 5, a first contact adhesive layer 4a that is formed on the planarizing layer 3 and is formed from at least one selected from the group consisting of chromium, titanium, aluminum, silicon, silicon nitride, silicon oxynitride, aluminum oxide, aluminum nitride, aluminum oxynitride, chromium oxide and titanium oxide; and a second contact adhesive layer 4b which is formed on the first contact adhesive layer 4a and formed from silicon oxide. It is because the first contact adhesive layer can increase the adhesiveness between the planarizing layer and the second contact adhesive layer, and the second contact adhesive layer can increase the adhesiveness between the planarizing layer and the TFT produced on the substrate for a flexible device of the present invention. It is also because the second contact adhesive layer formed from silicon oxide sufficiently satisfies the characteristics described above.

The thickness of the contact adhesive layer is not particularly limited as long as it is a thickness which can satisfy the characteristics described above, but specifically, it is preferable that the thickness of the contact adhesive layer be in the range of 1 nm to 500 nm. Inter alia, when the contact adhesive layer has the first contact adhesive layer and the second contact adhesive layer as described above, it is preferable that the thickness of the second contact adhesive layer be greater than that of the first contact adhesive layer, and that the first contact adhesive layer be relatively thinner, while the second contact adhesive layer be relatively thicker. In this case, the thickness of the first contact adhesive layer is preferably in the range of 0.1 nm to 50 nm, more preferably in the range of 0.5 nm to 20 nm, and even more preferably in the range of 1 nm to 10 nm. Furthermore, the thickness of the second contact adhesive layer is preferably in the range of 10 nm to 500 nm, more preferably 50 nm to 300 nm, and even more preferably in the range of 80 nm to 120 nm. It is because if the thickness is too small, there is a risk that sufficient adhesiveness may not be obtained, and if the thickness is too large, there is a risk that cracks may occur in the contact adhesive layer.

Figure 6A:
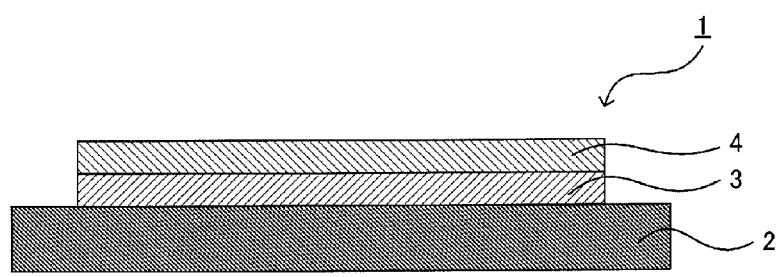
FIGS. 6A and 6B are each a schematic cross-sectional diagram and a plan view showing another example of the substrate for a flexible device of the present invention.

The contact adhesive layer may be formed over the entire surface of the metal foil, or may be partially formed on the metal foil. Among others, when the planarizing layer is partially formed on the metal foil as will be described below, as illustrated in FIG. 6A, it is preferable that the contact adhesive layer 4 be also partially formed on the metal foil 2, similarly to the planarizing layer 3. It is because if a contact adhesive layer containing an inorganic compound is formed directly on the metal foil, cracks and the like may occur in the contact adhesive layer. That is, it is preferable that the contact adhesive layer and the planarizing layer have the same morphology.

The method for forming the contact adhesive layer is not particularly limited as long as it is a method capable of forming a layer formed from the inorganic compound described above or a layer formed from the metal described above, and examples include a DC (direct current) sputtering method, an RF (high frequency) Magnetron sputtering method, and a plasma CVD (chemical vapor deposition) method. Among them, in the case of forming a layer formed from the inorganic compound described above and in the case of forming a layer containing aluminum or silicon, it is preferable to use a reactive sputtering method. It is because a film having excellent adhesiveness to the planarizing layer may be obtained.

2. Planarizing Layer

The planarizing layer according to the present invention is a layer which is formed on a metal foil and contains polyimide, and is a layer which is provided in order to planarize the surface irregularities of the metal foil surface.

It is desirable if the surface roughness Ra of the planarizing layer is smaller than the surface roughness Ra of the metal foil, but specifically, the surface roughness Ra is preferably 25 nm or less, and more preferably 10 nm or less. Meanwhile, the method for measuring the surface roughness is the same as the method for measuring the surface roughness of the contact adhesive layer.

The planarizing layer contains polyimide, and preferably, the planarizing layer contains polyimide as a main component. Generally, polyimides are water-absorbent. Since many of semiconductor materials used in TFTs or organic EL display apparatuses are sensitive to moisture, it is preferable that the planarizing layer be relatively less water-absorbent, in order to reduce moisture inside the element and to realize high reliability in the presence of moisture. As one of the indices for water absorbency, the coefficient of hygroscopic expansion is available. Therefore, it is preferable that the coefficient of hygroscopic expansion of the planarizing layer be smaller, and specifically, the coefficient of hygroscopic expansion is preferably in the range of 0 ppm/% RH to 15 ppm/% RH, more preferably in the range of 0 ppm/% RH to 12 ppm/% RH, and even more preferably in the range of 0 ppm/% RH to 10 ppm/% RH. As the coefficient of hygroscopic expansion is smaller, water absorbency decreases. For example, in the case of using the substrate for a flexible device of the present invention in an organic EL display apparatus, since organic EL display apparatuses are sensitive to moisture, it is preferable that the coefficient of hygroscopic expansion be relatively small in order to reduce moisture inside the element. Furthermore, when the coefficient of hygroscopic expansion of the planarizing layer is in the range described above, the water absorbency of the planarizing layer can be sufficiently decreased, and the storage of the substrate for a flexible device is facilitated. In the case of producing, for example, a TFT substrate or an organic EL display apparatus using the substrate for a flexible device, the production process is simplified. In addition, as the coefficient of hygroscopic expansion is smaller, the dimensional stability is enhanced. If the coefficient of hygroscopic expansion of the planarizing layer is large, there are occasions in which the substrate for a flexible device is warped along with an increase in humidity, or the adhesiveness of the planarizing layer and the metal foil decreases, due to the difference in the coefficient of expansion with the coefficient of expansion of the metal foil whose coefficient of hygroscopic expansion is almost close to zero. Therefore, it is preferable that the coefficient of hygroscopic expansion be small even in the case of performing wet processes during the production process.

Meanwhile, the coefficient of hygroscopic expansion is measured as follows. First, a film of the planarizing layer only is produced. The method for producing a planarizing layer film may be a method of producing a planarizing layer film on a heat resistant film (Upilex S 50S™ (manufactured by Ube Industries, Ltd.)) or a glass substrate, and then detaching the planarizing layer film; and a method of producing a planarizing layer film on a metal substrate, and then removing the metal by etching to obtain a planarizing layer film. Subsequently, the planarizing layer film thus obtained is cut to a size of 5 mm in width×20 mm in length, and this is used as an evaluation sample. The coefficient of hygroscopic expansion is measured with an adjustable humidity mechanical analyzer (Thermo Plus TMA8310™ (manufactured by Rigaku Corp.)). For example, the temperature is set constant at 25° C., and first, a sample is brought to a stabilized state in an environment at a humidity of 15% RH and is maintained in that state for approximately 30 minutes to 2 hours. Subsequently, the humidity of the measurement site is adjusted to 20% RH, and the sample is maintained in that state for 30 minutes to 2 hours until the sample is stabilized. Thereafter, the humidity is changed to 50% RH, and the difference between the sample length obtainable when the sample is stabilized at the humidity and the sample length obtainable when the sample is stabilized at 20% RH is determined. The value calculated by dividing the difference of sample length by the change of humidity (in this case, 50−20=30), and dividing this value by the sample length, is designated as the coefficient of hygroscopic expansion (C.H.E.). At the time of measurement, the tensile load is set to 1 g/25,000 μm² so that the load per cross-sectional area of the evaluation sample is uniform.

Furthermore, from the viewpoint of dimensional stability, the coefficient of linear thermal expansion of the planarizing layer is preferably such that the difference with the coefficient of linear thermal expansion of the metal foil is 15 ppm/° C. or less, more preferably 10 ppm/° C. or less, and even more preferably 5 ppm/° C. or less. As the coefficients of linear thermal expansion of the planarizing layer and the metal foil are closer to each other, warpage of the substrate for a flexible device is suppressed, and also, when the thermal environment of the substrate for a flexible device is changed, the stress at the interface between the planarizing layer and the metal foil is decreased, so that adhesiveness is enhanced. Also, it is preferable that the substrate for a flexible device of the present invention does not warp in an environment at a temperature in the range of 0° C. to 100° C. upon handling; however, because the coefficient of linear thermal expansion of the planarizing layer is large, if the coefficients of linear thermal expansion of the planarizing layer and the metal foil differ from each other to a large extent, the substrate for a flexible device is warped as a result of changes in the thermal environment.

Meanwhile, the phrase "warpage does not occur in the substrate for a flexible device" implies that when a sample is obtained by cutting the substrate for a flexible device into a strip having a size of 10 mm in width and 50 mm in length, and one of the short edges of the sample is fixed on a horizontally smooth platform, the levitation distance of the other short edge of the sample from the surface of the platform is 1.0 mm or less.

Specifically, the coefficient of linear thermal expansion of the planarizing layer is preferably in the range of 0 ppm/° C. to 30 ppm/° C., more preferably in the range of 0 ppm/° C. to 25 ppm/° C., even more preferably in the range of 0 ppm/° C. to 18 ppm/° C., particularly preferably in the range of 0 ppm/° C. to 12 ppm/° C., and most preferably in the range of 0 ppm/° C. to 7 ppm/° C., from the viewpoint of dimensional stability.

Meanwhile, the coefficient of linear thermal expansion is measured as follows. First, a film of the planarizing layer only is produced, the method for producing a planarizing layer film is as described above. Subsequently, the planarizing layer thus obtained is cut to a size of 5 mm in width×20 mm in length, and this is used as an evaluation sample. The coefficient of linear thermal expansion is measured with a thermomechanical analyzer (for example, Thermo Plus TMA8310™ (manufactured by Rigaku Corp.)). For the measurement conditions, the rate of temperature increase is set to 10° C./min, and the tensile load is set to 1 g/25,000 μm² so that the load per cross-sectional area of the evaluation sample is uniform. The average coefficient of linear thermal expansion in the temperature range of 100° C. to 200° C. is designated as the coefficient of linear thermal expansion (C.T.E.).

The planarizing layer has insulation properties. Specifically, the volume resistance of the planarizing layer is $1.0 \times 10^9$ Ω·m or greater, more preferably $1.0 \times 10^{11}$ Ω·m or greater, and even more preferably $1.0 \times 10^{11}$ Ω·m or greater.

Meanwhile, the volume resistance can be measured by a technique equivalent to the standard specifications such as JIS K6911, JIS C2318 and ASTM D257.

The polyimide that constitutes the planarizing layer is not particularly limited as long as it satisfies the characteristics described above. For example, it is possible to control the coefficient of hygroscopic expansion or the coefficient of linear thermal expansion by appropriately selecting the structure of the polyimide.

The polyimide is preferably polyimide containing an aromatic skeleton, from the viewpoint of adjusting the coefficient of linear thermal expansion or the coefficient of hygroscopic expansion of the planarizing layer suitable for the substrate for a flexible device of the present invention. Among polyimides, polyimide containing an aromatic skeleton is derived from a rigid skeleton having high planarity, and has excellent heat resistance and insulation properties as a thin film, so that the coefficient of linear thermal expansion is also low. Therefore, such polyimide is used with preference in the planarizing layer of the substrate for a flexible device of the present invention.

Since it is demanded that the polyimide exhibit low hygroscopic expansion and low linear thermal expansion, polyimide having a repeating unit represented by the following formula (I) is preferred. Such polyimide exhibits high heat resistance and insulation properties originating from its rigid skeleton, and also exhibits linear thermal expansion that is equivalent to that of a metal. Also, the coefficient of hygroscopic expansion can be made small.

[Chemical Formula 1]

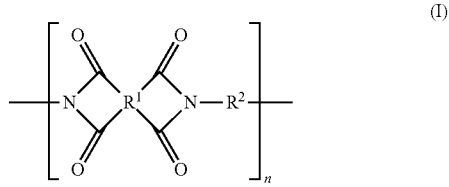

(I)

In the formula (I), $R^1$ represents a tetravalent organic group; $R^2$ represents a divalent organic group; repeating $R^1$s and $R^2$s may be respectively identical with or different from each other; and n represents a natural number of 1 or greater.

In the formula (I), generally, $R^1$ is a structure derived from a tetracarboxylic acid dianhydride, and $R^2$ is a structure derived from a diamine.

Examples of the tetracarboxylic acid dianhydride that can be applied to the polyimide include aliphatic tetracarboxylic acid dianhydrides such as ethylenetetracarboxylic acid dianhydride, butanetetracarboxylic acid dianhydride, cyclobutanetetracarboxylic acid dianhydride, methylcyclobutanetetracarboxylic acid dianhydride, and cyclopentanetetracarboxylic acid dianhydride; and aromatic tetracarboxylic acid dianhydrides such as pyromellitic dianhydride, 3,3',4,4'-benzophenonetetracarboxylic acid dianhydride, 2,2',3,3'-benzophenonetetracarboxylic acid dianhydride, 2,3',3,4'-benzophenonetetracarboxylic acid dianhydride, 3,3',4,4'-biphenyltetracarboxylic acid dianhydride, 2,2',3,3'-biphenyltetracarboxylic acid dianhydride, 2,3',3,4'-biphenyltetracarboxylic acid dianhydride, 2,2',6,6'-biphenyltetracarboxylic acid dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 2,2-bis{4-[4-(1,2-dicarboxy)phenoxy]phenyl}-1,1,1,3,3,3-hexafluoropropane dianhydride, 2,2-bis{4-[3-(1,2-dicarboxy)phenoxy]phenyl}-1,1,1,3,3,3-hexafluoropropane dianhydride, 2,3,6,7-naphthalenetetracarboxylic acid dianhydride, 1,1,1,3,3,3-hexafluoro-2,2-bis(2,3- or 3,4-dicarboxyphenyl)propane dianhydride, 1,4,5,8-naphthalenetetracarboxylic acid dianhydride, 1,2,5,6-naphthalenetetracarboxylic acid dianhydride, 1,2,3,4-benzenetetracarboxylic acid dianhydride, 3,4,9,10-perylenetetracarboxylic acid dianhydride, 2,3,6,7-anthracenetetracarboxylic acid dianhydride, 1,2,7,8-phenanthrenetetracarboxylic acid dianhydride, pyridinetetracarboxylic acid dianhydride, sulfonyldiphthalic dianhydride, m-terphenyl-3,3',4,4'-tetracarboxylic acid dianhydride, p-terphenyl-3,3',4,4'-tetracarboxylic acid dianhydride, 9,9-bis(trifluoromethyl)xanthenetetracarboxylic acid dianhydride, 9-phenyl-9-(trifluoromethyl)xanthenetetracarboxylic acid dianhydride, 12,14-diphenyl-12,14-bis(trifluoromethyl)-12H,14H-5,7-dioxa pentacene-2,3,9,10-tetracarboxylic acid dianhydride, 1,4-bis(3,4-dicarboxytrifluorophenoxy)tetrafluorobenzene dianhydride, 1,4-bis(trifluoromethyl)-2,3,5,6-benzenetetracarboxylic acid dianhydride, 1-(trifluoromethyl)-2,3,5,6-benzenetetracarboxylic acid dianhydride, p-phenylenebistrimellitic acid monoester acid dianhydride, and p-biphenylenebistrimellitic acid monoester acid dianhydride.

These are used singly or as mixtures of two or more kinds.

A tetracarboxylic acid dianhydride that is used with preference from the viewpoints of the heat resistance, coefficient of linear thermal expansion and the like of the polyimide, is an aromatic tetracarboxylic acid dianhydride. Examples of tetracarboxylic acid dianhydride that are particularly preferably used include pyromellitic dianhydride, mellophanic dianhydride, 3,3',4,4'-benzophenonetetracarboxylic acid dianhydride, 3,3',4,4'-biphenyltetracarboxylic acid dianhydride, 2,3,3',4'-biphenyltetracarboxylic acid dianhydride, 2,3,2',3'-biphenyltetracarboxylic acid dianhydride, 2,2',6,6'-biphenyltetracarboxylic acid dianhydride, bis(3,4-dicarboxyphenyl)ether dianhydride, 2,2-bis(3,4-dicarboxyphenyl)-1,1,1,3,3,3-hexafluoropropane dianhydride, and bis(3,4-dicarboxyphenyl)ether dianhydride.

Among them, from the viewpoint of decreasing the coefficient of hygroscopic expansion, 3,3',4,4'-biphenyltetracarboxylic acid dianhydride, 2,3,3',4'-biphenyltetracarboxylic acid dianhydride, 2,3,2',3'-biphenyltetracarboxylic acid dianhydride, and bis(3,4-dicarboxyphenyl)ether dianhydride are particularly preferred.

When a tetracarboxylic acid dianhydride having fluorine introduced therein is used as a tetracarboxylic acid dianhydride that is used in combination, the coefficient of hygroscopic expansion of the polyimide is decreased. However, a polyimide precursor having a skeleton containing fluorine does not easily dissolve into a basic aqueous solution, and it is needed to perform development with a mixed solution of an organic solvent such as an alcohol and a basic aqueous solution.

Furthermore, when a rigid tetracarboxylic acid dianhydride such as pyromellitic dianhydride, mellophanic dianhydride, 3,3',4,4'-biphenyltetracarboxylic acid dianhydride, 2,3,3',4'-biphenyltetracarboxylic acid dianhydride, 2,3,2',3'-biphenyltetracarboxylic acid dianhydride, or 1,4,5,8-naphthalenetetracarboxylic acid dianhydride is used, the coefficient of linear thermal expansion of the polyimide is decreased, which is preferable. Among them, from the viewpoint of the balance between the coefficient of linear thermal expansion and the coefficient of hygroscopic expansion, 3,3',4,4'-biphenyltetracarboxylic acid dianhydride, 2,3,3',4'-biphenyltetracarboxylic acid dianhydride, and 2,3,2',3'-biphenyltetracarboxylic acid dianhydride are particularly preferred.

When the tetracarboxylic acid dianhydride has an alicyclic skeleton, transparency of the polyimide precursor is enhanced, and therefore, a photosensitive polyimide precursor having high sensitivity is obtained. On the other hand, the resulting polyimide tends to have inferior heat resistance and insulation properties as compared with aromatic polyimides.

When an aromatic tetracarboxylic acid dianhydride is used, there is an advantage that a polyimide exhibiting excellent heat resistance and a low coefficient of linear thermal expansion is obtained. Therefore, in regard to the polyimide, it is preferable that 33 mol % or more of $R^1$s in the formula (I) have any of structures represented by the following formulas:

[Chemical Formula 2]

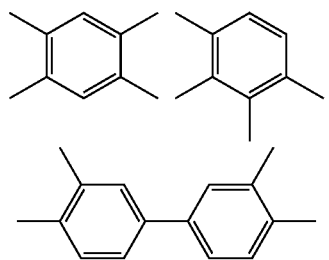

-continued

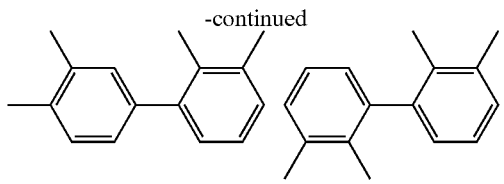

If the polyimide contains any of the structures of the formulas shown above, the polyimide exhibits low linear thermal expansion and low hygroscopic expansion due to these rigid skeletons. Also, it is advantageous that such polyimides are easily commercially available, and less expensive.

A polyimide having a structure such as described above is a polyimide exhibiting high heat resistance and a low coefficient of linear thermal expansion. Accordingly, it is more preferable if the content of the structure represented by the formula described above is closer to 100 mol % of $R^1$s in the formula (I), but it is desirable that the polyimide contains the structure in an amount of 33% or more of $R^1$s in the formula (I). Among others, the content of the structure represented by the formula described above is preferably 50 mol % or more, and more preferably 70 mol % or more, of $R^1$s in the formula (I).

On the other hand, the diamine component that can be applied to the polyimide can also be used such that one kind of diamine may be used alone, or two or more kinds of diamines may be used in combination. There are no particular limitations on the diamine component to be used, and examples include aromatic amines such as p-phenylenediamine, m-phenylendiamine, o-phenylenediamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis-4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, 4,4'-bis[4-(4-aminophenoxy)phenoxy]diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobi indane, and 6,6'-bis(4-aminophenoxy)-3,3,3',3'-tetramethyl-1,1'-spirobiindane; aliphatic amines such as 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl) ether, bis(2-aminoethyl)ether, bis(3-aminopropyl)ether, bis(2-aminomethoxy)ethyl]ether, bis[2-(2-aminoethoxy)ethyl]ether, bis[2-(3-aminoprotoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, triethylene glycol bis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane; and alicyclic diamines such as 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2.2.1]heptane, and 2,5-bis(aminomethyl)bicyclo[2.2.1]heptane. Examples of guanamines include acetoguanamine and benzoguanamine. Also, diamines in which a portion or all of the hydrogen atoms on the aromatic rings of the diamines described above have been substituted with substituents selected from a fluoro group, a methyl group, a methoxy group, a trifluoromethyl group, and a trifluoromethoxy group, can also be used.

Furthermore, according to the purpose, diamines in which a portion or all of the hydrogen atoms on the aromatic rings of the diamines described above have been substituted with any one kind or two or more kinds of cross-linking point (s) selected from an ethynyl group, a benzocyclobuten-4'-yl group, a vinyl group, an allyl group, a cyano group, an isocyanato group and an isopropenyl group, can also be used.

The diamine can be selected on the basis of intended properties, and when a rigid diamine such as p-phenylenediamine is used, the polyimide acquires a low coefficient of expansion. Examples of the rigid diamine include, as diamines in which two amino groups are bonded to the same aromatic ring, p-phenylenediamine, m-phenylenediamine, 1,4-diaminonaphthalene, 1,5-diaminonaphthalene, 2,6-diaminonaphthalene, 2,7-diaminonaphthalene, and 1,4-diaminoanthracene.

Furthermore, a diamine in which two or more aromatic rings are bonded through single bonds, and two or more amino groups are respectively bonded to different aromatic rings directly or as a part of a substituent, may be used, and examples include diamines represented by the following formula (II). Specific examples include benzidine.

[Chemical Formula 3]

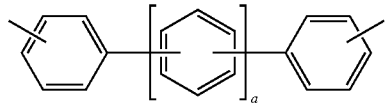

(II)

In the formula (II), "a" represents 0 or a natural number of 1 or greater; and the amino groups are bonded at the meta-position or the para-position relative to the bonding between the benzene rings.

Furthermore, in the formula (II), a diamine which has a substituent at a position on the benzene ring where an amino group is not substituted, irrespective of the bonding to the other benzene ring, can also be used. These substituents are monovalent organic groups, and they may be bonded to each other. Specific examples include 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, and 3,3'-dimethyl-4,4'-diaminobiphenyl.

Also, when fluorine is introduced into the aromatic ring as a substituent, the coefficient of hygroscopic expansion can be lowered. However, a polyimide precursor, particularly a polyamic acid, containing fluorine does not easily dissolve into a basic aqueous solution, and when the planarizing layer is partially formed on the metal foil, it may be necessary to perform development using a mixed solution with an organic solvent such as an alcohol at the time of processing of the planarizing layer.

On the other hand, when a diamine having a siloxane skeleton such as 1,3-bis(3-aminopropyl)tetramethyldisiloxane is used as the diamine, the adhesiveness to the metal foil may be improved, or the elastic modulus of the polyimide may decrease, so that the glass transition temperature may decrease.

Here, the diamine to be selected is preferably an aromatic diamine from the viewpoint of heat resistance, but according to the intended properties, a diamine other than an aromatic diamine, such as an aliphatic diamine or a siloxane-based diamine, may also be used to the extent that does not exceed 60 mol %, preferably 40 mol %, of the total amount of the diamine.

In regard to the polyimide, it is preferable that 33 mol % or more of $R^2$s in the formula (I) has any of structures represented by the following formula:

[Chemical Formula 4]

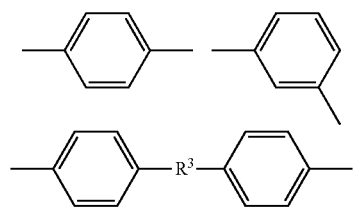

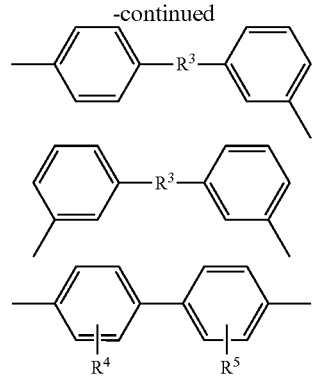

wherein $R^3$ represents a divalent organic group, an oxygen atom, a sulfur atom or a sulfone group; and $R^4$ and $R^5$ each represent a monovalent organic group or a halogen atom.

If the polyimide contains any of the structures of the formulas shown above, the polyimide exhibits low linear thermal expansion and low hygroscopic expansion due to these rigid skeletons. Also, it is advantageous that such polyimides are easily commercially available, and less expensive.

When the polyimide has a structure such as described above, heat resistance of the polyimide is enhanced, and the coefficient of linear thermal expansion is decreased. Accordingly, it is more preferable if the content of the structure represented by the formula described above is closer to 100 mol % of $R^2$s in the formula (I), but it is desirable that the content of the structure be at least 33% or more of $R^2$s in the formula (I). Among others, the content of the structure represented by the formula described above is preferably 50 mol % or more, and more preferably 70 mol % or more, of $R^2$s in the formula (I).

Generally, since the coefficient of linear thermal expansion of the metal foil, that is, the coefficient of linear thermal expansion of a metal, is definite to a certain extent, it is preferable to decide the coefficient of linear thermal expansion of the planarizing layer in accordance with the coefficient of linear thermal expansion of the metal foil used, and appropriately select the structure of the polyimide.

Furthermore, in the case of producing a TFT substrate using the substrate for a flexible device of the present invention, it is preferable to decide the coefficient of linear thermal expansion of the metal foil in accordance with the coefficient of linear thermal expansion of the TFT, decide the coefficient of linear thermal expansion of the planarizing layer in accordance with the coefficient of linear thermal expansion of the metal foil, and appropriately select the structure of the polyimide.

In the case of producing an organic EL display apparatus or an electronic paper using the substrate for a flexible device of the present invention, it is preferable to decide the coefficient of linear thermal expansion of the metal foil in accordance with the coefficient of linear thermal expansion of the organic EL display apparatus or the electronic paper, decide the coefficient of linear thermal expansion of the planarizing layer in accordance with the coefficient of linear thermal expansion of the metal foil, and appropriately select the structure of the polyimide.

According to the present invention, it is acceptable if the planarizing layer contains polyimide having a repeating unit represented by the formula (I) shown above, and if necessary, this polyimide may be used as the planarizing layer appropriately in the form of being laminated or combined with another polyimide.

Also, the polyimide having a repeating unit represented by the formula (I) may be photosensitive polyimide or polyimide obtainable by using a photosensitive polyimide precursor. Photosensitive polyimides can be obtained by using known techniques. For example, an ethylenic double bond is introduced into the carboxyl group of polyamic acid via an ester bond or an ionic bond to obtain a polyimide precursor, the polyimide precursor is mixed with a photoradical initiator, and this mixture can be used as a solvent-developable negative type photosensitive polyimide precursor. Also, for example, a naphthoquinone diazide compound is added to polyamic acid or a partial esterification product thereof, and the mixture is used as an alkali-developable positive type photosensitive polyimide precursor. Alternatively, a photo base generator is added to polyamic acid, and the resulting mixture can be used as an alkali-developable negative type photosensitive polyimide precursor, by adding a nifedipine-based compound to polyamic acid, and using this mixture as an alkali-developable negative type photosensitive polyimide precursor.

These photosensitive polyimide precursors contain 15% to 35% of added photosensitivity-imparting components relative to the weight of the polyimide component. Accordingly, even if the polyimide is heated to 300° C. to 400° C. after pattern formation, residues originating from the photosensitivity-imparting components remain in the polyimide. Since these residues cause an increase in the coefficient of linear thermal expansion or the coefficient of hygroscopic expansion, when a photosensitive polyimide precursor is used, the reliability of the element tends to decrease as compared with the case where a non-photosensitive polyimide precursor is used. However, a photosensitive polyimide precursor prepared by adding a photo base generator to a polyamic acid is capable of pattern formation, even if the amount of addition of the additive photo base generator is decreased to 15% or less. Therefore, such a photosensitive polyimide precursor is most preferable as a photosensitive polyimide precursor applicable to the present invention, because even after converted to polyimide, there occurs less decomposition residue originating from the additive, deterioration of the characteristics such as the coefficient of linear thermal expansion or the coefficient of hygroscopic expansion is less, and less outgas is produced.

It is preferable if the polyimide precursor used in the polyimide can be developed by a basic aqueous solution, from the viewpoints of securing safety of the work environment and reduction of the process cost, when the planarizing layer is partially formed on the metal foil. The basic aqueous solution is available at low cost, and the cost for waste liquid treatment or the facility cost for securing work safety is low. Thus, production can be achieved at lower cost.

The planarizing layer may be any layer containing polyimide, but among others, a planarizing layer containing polyimide as a main component is preferred. When polyimide is contained as a main component, it is possible to obtain a planarizing layer having excellent insulation properties and heat resistance. Also, when polyimide is contained as a main component, thickness reduction of the planarizing layer is made possible, and heat conductivity of the planarizing layer is enhanced. Thus, a substrate for a flexible device having excellent heat conductivity can be obtained.

Meanwhile, the phrase "the planarizing layer contains polyimide as a main component" implies that the planarizing layer contains polyimide to the extent that the characteristics described above are satisfied. Specifically, it means that the content of polyimide in the planarizing layer is 75% by mass or greater, and preferably 90% by mass or greater, and it is particularly preferable that the planarizing layer be composed only of polyimide. When the content of the polyimide in the planarizing layer is in the range described above, the planarizing layer can exhibit characteristics sufficient to achieve the objects of the present invention, and as the content of the polyimide increases, the characteristics intrinsic to the polyimide, such as heat resistance and insulation properties, are improved.

The planarizing layer may also contain, if necessary, additives such as a leveling agent, a plasticizer, a surfactant and a defoamant.

The planarizing layer may be formed over the entire surface of the metal foil, or may be formed partially on the metal foil. That is, it is still acceptable that on the surface where the planarizing layer and the contact adhesive layer are formed on the metal foil, a metal foil-exposed region where the planarizing layer and the contact adhesive layer do not exist, and the metal foil is exposed, may be provided. In the case of having such a metal foil-exposed region, when an organic EL display apparatus is produced using the substrate for a flexible device of the present invention is used, a sealing member and the metal foil can be directly adhered, and the penetration of moisture into the organic EL display apparatus can be more strongly prevented. Furthermore, when sealing areas are selectively formed on the metal foil-exposed region, it is possible to compartmentalize the organic EL display apparatus in plane or to seal the organic EL display apparatus in a multifaceted state. Thus, it is advantageous that elements can be produced with high productivity. Also, the metal foil-exposed region can serve as a through-hole intended for penetrating through the planarizing layer and the contact adhesive layer and achieving electrical conduction to the metal foil.

Figure 6B:
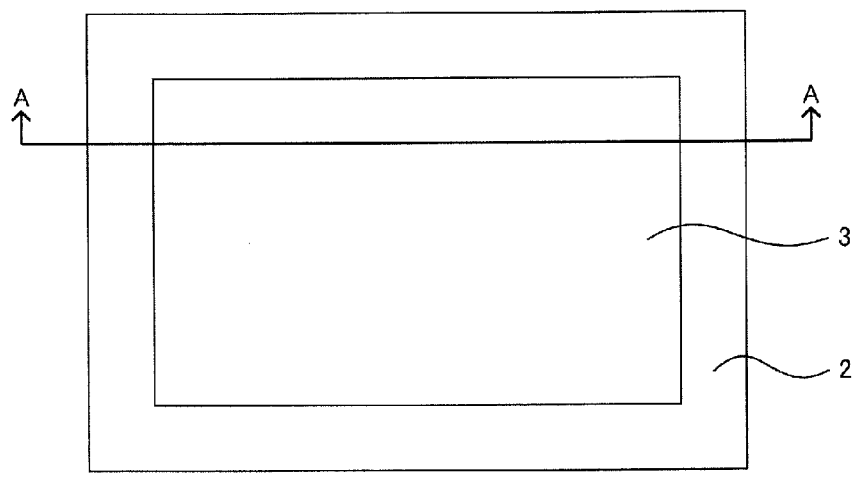

When the planarizing layer is partially formed on the metal foil, as illustrated in FIG. 6A and FIG. 6B, the planarizing layer 3 may be formed in an area excluding at least the outer peripheral area of the metal foil 2. Meanwhile, FIG. 6A is an A-A line cross-sectional diagram of FIG. 6B, and in FIG. 6B, the contact adhesive layer is not shown. When an organic EL display apparatus or an electronic paper is produced using the substrate for a flexible device of the present invention, if the planarizing layer is formed over the entire surface of the metal foil so that the edge areas of the planarizing layer are exposed, since polyimides generally exhibit hygroscopic properties, there is a risk that moisture may penetrate into the element through the cross-sections of the planarizing layer at the time of production or at the time of driving. This moisture may cause deterioration of the element performance or a change in the dimension of the planarizing layer. Accordingly, it is preferable that the planarizing layer be not formed at the outer peripheral area of the metal foil, and that the portion in which the planarizing layer containing polyimide is directly exposed to external air, be reduced as much as possible.

Meanwhile, according to the present invention the phrase "the planarizing layer is partially formed on the metal foil" means that the planarizing layer is not formed over the entire surface of the metal foil.

The planarizing layer may be formed on one surface of the metal foil except for the outer peripheral area of the metal foil, or may be formed even in a pattern form on the metal foil except for the outer peripheral area of the metal foil.

The thickness of the planarizing layer is not particularly limited as long as it is a thickness that can satisfy the characteristics described above, but specifically, the thickness is preferably in the range of 1 μm to 1,000 μm, more preferably in the range of 1 μm to 200 μm, and even more preferably in the range of 1 μm to 100 μm. It is because if the thickness of the planarizing layer is too small, insulation properties may not be maintained, or it may be difficult to planarize the surface irregularities of the metal foil surface. Also, it is because if the thickness of the planarizing layer is too large, flexibility may decrease or become excessive, drying may be difficult at the time of film formation, or the production cost may increase because the use amount of the material increases. Furthermore, in the case of imparting a heat dissipation function to the substrate for a flexible device of the present invention, if the thickness of the planarizing layer is too large, heat conductivity is decreased because polyimides have lower heat conductivity than metals.

As the method for forming the planarizing layer, there are no particular limitations as long as the method is a method capable of obtaining a planarizing layer having satisfactory smoothness, and for example, a method of applying a polyimide solution or a polyimide precursor solution on a metal foil, a method of bonding a metal foil and a polyimide film with an adhesive interposed therebetween, or a method of hot pressing a metal foil and a polyimide film can be used. Among them, a method of applying a polyimide solution or a polyimide precursor solution is preferred. It is because a planarizing layer having excellent smoothness can be obtained. Particularly, a method of applying a polyimide precursor solution is suitable. It is because polyimides generally lack solubility in solvents. It is also because polyimide having high solubility in a solvent is deteriorated in properties such as heat resistance, the coefficient of linear thermal expansion, and the coefficient of hygroscopic expansion.

The coating method is not particularly limited as long as it is a method capable of obtaining a planarizing layer having satisfactory smoothness, and for example, a spin coating method, a die coating method, a dip coating method, a bar coating method, a gravure printing method, or a screen printing method can be used.

When a polyimide solution or a polyimide precursor solution is applied, fluidity of the film may be increased and smoothness of the film may be ameliorated by heating the solution to a temperature equal to or higher than the glass transition temperature of the polyimide or the polyimide precursor after the application.

Furthermore, when the planarizing layer is partially formed on the metal foil, as the method forming the planarizing layer, a printing method, a photolithographic method, or a method of directly processing with a laser or the like can be used. Examples of the photolithographic method include: a method of forming a film of polyamic acid as a polyimide precursor on a metal foil, subsequently forming a photosensitive resin film on the polyamic acid film, forming a photosensitive resin film pattern by a photolithographic method, thereafter using the pattern as a mask to remove the polyamic acid film at the pattern opening areas, subsequently removing the photosensitive resin film pattern, and imidizing the polyamic acid; a method of developing the polyamic acid film simultaneously with the formation of the photosensitive resin film pattern as described above, subsequently removing the photosensitive resin film pattern, and imidizing the polyamic acid; a method of forming a photosensitive resin film pattern on the planarizing layer in the state of a laminate of the metal foil and the planarizing layer, etching the planarizing layer according to the pattern by a wet etching method or a dry etching method, and then removing the photosensitive resin pattern; a method of patterning one of the metal foils of a laminate in which a metal foil, a planarizing layer and a metal foil are laminated, using the pattern as a mask to etch the planarizing layer, and then removing the metal pattern; and a method of directly forming a pattern of the planarizing layer on the metal foil using photosensitive polyimide or a photosensitive polyimide precursor. Examples of the printing method include methods using known printing technologies such as gravure printing, flexo printing, screen printing, and inkjet method.

3. Metal Foil

The metal foil according to the present invention is to support the planarizing layer and the contact adhesive layer described above.

The coefficient of linear thermal expansion of the metal foil is preferably in the range of 0 ppm/° C. to 25 ppm/° C., more preferably in the range of 0 ppm/° C. to 18 ppm/° C., even more preferably in the range of 0 ppm/° C. to 12 ppm/° C., and particularly preferably in the range of 0 ppm/° C. to 7 ppm/° C., from the viewpoint of dimensional stability. Meanwhile, the method for measuring the coefficient of linear thermal expansion is the same as the method for measuring the coefficient of linear thermal expansion of the planarizing layer, except that the metal foil is cut to a size of 5 mm in width×20 mm in length, and this is used as an evaluation sample.

Furthermore, it is preferable that the metal foil has oxidation resistance. It is because when a TFT is produced on the substrate for a flexible device of the present invention, usually, the TFT is subjected to a high temperature treatment at the time of production of the TFT. Particularly, when the TFT has an oxide semiconductor layer, since an annealing treatment is carried out at a high temperature in the presence of oxygen, it is preferable that the metal foil has oxidation resistance.

There are no particular limitation on the metal material constituting the metal foil as long as the metal material can form a foil and can satisfy the characteristics described above, and examples include aluminum, copper, a copper alloy, phosphor bronze, stainless steel (SUS), gold, a gold alloy, nickel, a nickel alloy, silver, a silver alloy, tin, a tin alloy, titanium, iron, an iron alloy, zinc, and molybdenum. Among them, in the case of applying the metal foil to a large-sized element, SUS is preferred. SUS has excellent oxidation resistance and also has excellent heat resistance, while SUS has a smaller coefficient of linear thermal expansion as compared with copper or the like, and has excellent dimensional stability. Furthermore, SUS304 is particularly advantageous in that it is easily available, and SUS430 is also advantageous in that it is easily available and has a smaller coefficient of linear thermal expansion than SUS304. On the other hand, in the case of producing a TFT substrate using the substrate for a flexible device of the present invention, when the coefficients of linear thermal expansion of the metal foil and the TFT are considered, from the viewpoint of the coefficient of linear thermal expansion, titanium or invar is preferred, which both have lower coefficients of linear thermal expansion than SUS430. However, it is desirable to select the metal material while also taking into consideration of the coefficient of linear thermal expansion as well as oxidation resistance, heat resistance, foil processability attributable to the malleability and ductility of the metal foil, and the production cost.

The thickness of the metal foil is not particularly limited as long as it is a thickness that can satisfy the characteristics described above, but specifically, the thickness is preferably in the range of 1 μm to 1,000 μm, more preferably in the range of 1 μm to 200 μm, and even more preferably in the range of 1 μm to 100 μm. If the thickness of the metal foil is too small, there is a risk that the gas barrier properties against oxygen or water vapor may deteriorate, or the strength of the substrate for a flexible device may decrease. Also, if the thickness of the metal foil is too large, flexibility may decrease or become excessive, or the production cost may increase.

The surface roughness Ra of the metal foil is larger than the surface roughness Ra of the contact adhesive layer and the planarizing layer described above, and for example, the surface roughness is about 50 nm to 200 nm. Meanwhile, the method for measuring the surface roughness is the same as the method for measuring the surface roughness of the contact adhesive layer.

The metal foil may be a rolled foil or may be an electrolytic foil, and the metal foil is appropriately selected according to the type of the metal material. Usually, metal foils are produced by rolling.

Figure 10:
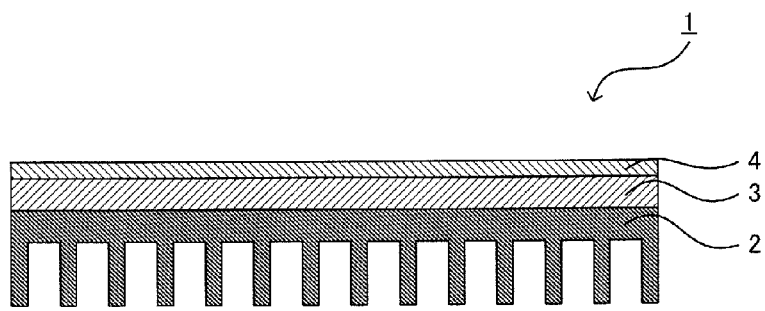
FIG. 10 is a schematic cross-sectional diagram showing another example of the substrate for a flexible device of the present invention.

The metal foil may have surface irregularities on the surface that is brought into contact with air, as illustrated in FIG. 10. When the metal foil has surface irregularities on the surface that is brought into contact with air, heat diffusion is improved, and heat dissipation properties can be increased.

Examples of the method for forming surface irregularities include a method of subjecting the surface of the metal foil directly to processing such as emboss processing, etching process, sand blast processing, frost processing, or stamp processing; a method of forming a surface irregularity pattern using a photoresist or the like; a plating method, and a method of bonding a metal layer having surface irregularities with the surface of a metal layer in the form of foil. In the case of emboss processing, for example, a reduction roll having surface irregularities on the surface may also be used. In the case of etching processing, the chemical is selected according to the type of the metal foil. In the case of the method of bonding a metal layer in a foil form and a metal layer having surface irregularities on the surface, the metal layers can be bonded with each other by, for example, brazing, welding or soldering, or the metal layers can be bonded with each other using an adhesive such as an epoxy resin. In this case, the metal layer in a foil form and the metal layer having surface irregularities may be composed of the same metal material, or may be composed of different metal materials.

Among them, in view of the production cost, emboss processing and etching processing are used with preference.

The dimension or shape of the surface irregularities is not particularly limited as long as the surface of the metal foil that is brought into contact with air is roughened, and the surface area can be increased. The width, height, pitch and the like of the surface irregularities are appropriately selected in accordance with the type of the metal foil, the use of the substrate for a flexible device, or the like, and for example, ranges thereof suitable for heat conduction can be determined by simulation.

A substrate for a flexible device having a metal foil partially formed thereon can also be obtained by forming a planarizing layer containing polyimide on a metal foil, and then patterning the metal foil. That is, the metal foil may be formed over the entire surface of the planarizing layer, or may be formed partially relative to the planarizing layer. In other words, the metal foil may be formed over the entire surface of the substrate for a flexible device, or may be formed partially on the substrate for a flexible device. When the metal foil is formed over the entire surface of the substrate for a flexible device, gas barrier properties against oxygen or water vapor can be imparted, and heat dissipation properties can be increased. On the other hand, when the metal foil is formed partially, weight reduction can be attempted by removing unnecessary parts of the metal foil.

As the method for patterning the metal foil, a photolithographic method, or a method of directly processing with a laser can be used. Examples of the photolithographic method include a method of laminating a dry film resist on a metal foil in the state of a laminate of a metal foil and a planarizing layer, patterning the dry film resist, etching the metal foil in accordance with the pattern, and then removing the dry film resist, may be used.

4. Other Configurations

According to the present invention, an intermediate layer may be formed between the metal foil and the planarizing layer. For example, an intermediate layer formed from an oxide film which results from oxidation of the metal constituting the metal foil, may be formed between the metal foil and the planarizing layer. Thereby, the adhesiveness of the metal foil and the planarizing layer can be increased. This oxide film is formed as the metal foil surface is oxidized.

Furthermore, the oxide film may also be formed on the surface opposite to the surface where the planarizing layer of the metal foil is formed.

5. Use

The substrate for a flexible device of the present invention is suitably used in the TFT substrates illustrated in FIG. 2A to FIG. 4B.

Meanwhile, since the TFT substrate will be described in the Section "B. TFT substrate for a flexible device" that will be described below, further description will not be given here.

Figure 7A:
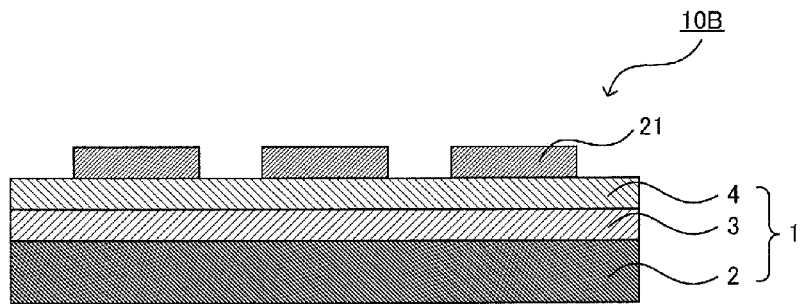
FIGS. 7A and 7B are each a schematic cross-sectional diagram showing an example of an electrode substrate which includes the substrate for a flexible device of the present invention.
Figure 7B:
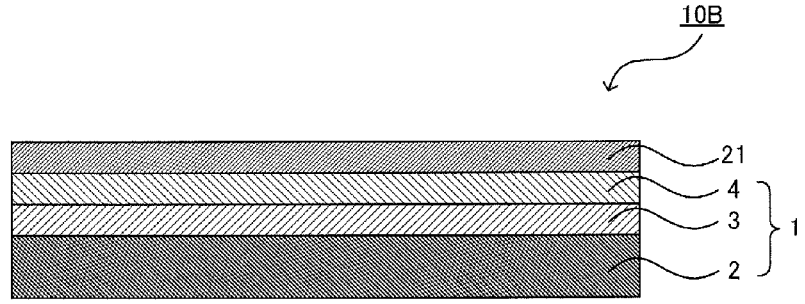

Furthermore, the substrate for a flexible device of the present invention can be applied to the electrode substrates illustrated in FIG. 7A and FIG. 7B. FIG. 7A and FIG. 7B are schematic cross-sectional diagrams each showing an example of an electrode substrate which includes the substrate for a flexible device of the present invention. The electrode substrate 10B illustrated in FIG. 7A has an electrode layer 21 formed in a pattern form on the contact adhesive layer 4 of the substrate for a flexible device 1, and the electrode substrate 10B illustrated in FIG. 7B has an electrode layer 21 formed on one surface on the contact adhesive layer 4 of the substrate for a flexible device 1. The electrode substrate illustrated in FIG. 7A can be applied to, for example, passive matrix-driven, top emission type organic EL display apparatuses. Also, the electrode substrate illustrated in FIG. 7B can be used in top emission type organic EL display devices, and can be applied for illumination applications.

Furthermore, the substrate for a flexible device of the present invention can also be applied to passive matrix type electronic papers.

B. TFT Substrate for a Flexible Device

Next, the TFT substrate for a flexible device of the present invention (hereinafter, may be simply referred to as TFT substrate) will be explained.

The TFT substrate of the present invention comprises the substrate for a flexible device described above and a TFT formed on the contact adhesive layer of the substrate for a flexible device.

The TFT substrate of the present invention will be described while making reference to the attached drawings.

FIG. 2A to FIG. 4B are schematic cross-sectional diagrams each showing an example of the TFT substrate of the present invention. The TFT substrate 10A illustrated in FIG. 2A includes a TFT having a top gate/bottom contact structure, and the TFT substrate 10A illustrated in FIG. 2B includes a TFT having a top gate/top contact structure. The TFT substrate 10A illustrated in FIG. 3A includes a TFT having a bottom gate/bottom contact structure, and the TFT substrate 10A illustrated in FIG. 33 includes a TFT having a bottom gate/top contact structure. The TFT substrate 10A illustrated in each of FIG. 4A and FIG. 4B includes a TFT having a coplanar type structure. Meanwhile, since the various configurations of the TFT substrates shown in FIG. 2A to FIG. 4B have been described above in the Section "A. Substrate for a flexible device," further description will not be repeated here.

According to the present invention, since the substrate for a flexible device described above is used, the surface irregularities of the metal foil surface can be planarized by the planarizing layer. Therefore, deterioration of the electrical performance of the TFT due to surface irregularities can be suppressed. Also, according to the present invention, since the substrate for a flexible device described above is used, the adhesiveness between the substrate for a flexible device and the TFT is excellent. Therefore, at the time of production of the TFT substrate of the present invention, even if moisture or heat is applied and the dimension of the planarizing layer containing polyimide is changed thereby, the occurrence of detachment or cracks in the electrodes or the semiconductor layer can be prevented.

Furthermore, since the TFT substrate of the present invention has a metal foil, the TFT substrate has gas barrier properties against oxygen or water vapor. Therefore, when an organic EL display apparatus is produced using the TFT substrate of the present invention, deterioration of the element performance due to moisture or oxygen can be suppressed. Also, when an electronic paper of a liquid crystal display system is produced using the substrate for a flexible device of the present invention, the exposure of the liquid crystals to water vapor can be suppressed. Furthermore, since the TFT substrate of the present invention has a metal foil, and since metal foils generally have excellent heat conductivity, the TFT substrate has heat dissipation properties. Therefore, when an organic EL display apparatus is produced using the TFT substrate of the present invention, deterioration of the element performance due to the heat generation of the organic EL display apparatus can be suppressed.

Furthermore, since the TFT substrate of the present invention is supported by a metal foil, a TFT substrate having excellent durability can be obtained.

Meanwhile, since the substrate for a flexible device has been described above in detail in the Section "A. Substrate for a flexible device," further description will not be repeated here. Hereinafter, other configurations of the TFT substrate of the present invention will be explained.

The TFT according to the present invention is formed on the contact adhesive layer of the substrate for a flexible device.

Examples of the structure of TFT include a top gate structure (forward staggered type), a bottom gate structure (reverse staggered type), and a coplanar type structure. In the cases of the top gate structure (forward staggered type) and the bottom gate structure (reverse staggered type), further examples include a top contact structure and a bottom contact structure. These structures are appropriately selected according to the type of the semiconductor layer constituting the TFT.

The semiconductor layer that constitutes the TFT is not particularly limited if the semiconductor layer can be formed on the substrate for a flexible device, and for example, silicon, an oxide semiconductor, or an organic semiconductor is used.

As the silicon, polysilicon or amorphous silicon can be used.

Examples of the oxide semiconductor that can be used include zinc oxide (ZnO), titanium oxide (TiO), magnesium zinc oxide ($Mg_xZn_{1-x}O$), cadmium zinc oxide ($Cd_xZn_{1-x}O$), cadmium oxide (CdO), indium oxide ($In_2O_3$), gallium oxide ($Ga_2O_3$), tin oxide ($SnO_2$), magnesium oxide (MgO), tungsten oxide (WO), an InGaZnO system, an InGaSnO system, an InGaZnMgO system, an InAlZnO system, an InFeZnO system, an InGaO system, a ZnGaO system, and an InZnO system.

Examples of the organic semiconductor include aromatic compounds of π-electron conjugated systems, aliphatic compounds, organic pigments, and organic silicon compounds. More specific examples pentacene, tetracene, thiophene oligomer derivatives, phenylene derivatives, phthalocyanine compound, polyacetylene derivatives, polythiophene derivatives, and cyanine dyes.

Among them, the semiconductor layer is preferably an oxide semiconductor layer formed from the oxide semiconductors described above. Oxide semiconductors are such that their electrical characteristics change under the influence of water or oxygen, but since the TFT substrate of the present invention has gas barrier properties against water vapor as described above, the deterioration of the characteristics of semiconductor can be suppressed. Furthermore, for example, when the TFT substrate of the present invention is used in an organic EL display apparatus, the organic EL display apparatus has poor resistance to water or oxygen; however, since permeation of oxygen and water vapor can be suppressed by the metal foil, deterioration of the element performance can be suppressed.

In regard to the method for forming a semiconductor layer and the thickness of the semiconductor layer, those methods and thicknesses that are generally used can be applied.

The gate electrode, source electrode and drain electrode that constitute the TFT are not particularly limited as long as the electrodes have desired conductivity, and any electroconductive material that is generally used in TFTs can be used. Examples of such a material include inorganic materials such as Ta, Ti, Al, Zr, Cr, Nb, Hf, Mo, Au, Ag, Pt, a Mo—Ta alloy, a W—Mo alloy, ITO, and IZO; and organic materials having electroconductivity such as PEDOT/PSS.

In regard to the method for forming the gate electrode, source electrode and drain electrode and the thicknesses of the electrodes, those methods and thicknesses that are generally used can be applied.

As the gate insulating film that constitutes the TFT, the same film as the gate insulating film for general TFTs can be used, and for example, insulating inorganic materials such as silicon oxide, silicon nitride, aluminum oxide, tantalum oxide, barium strontium titanate (BST), and lead titanate zirconate (PZT); and insulating organic materials such as an acrylic resin, a phenolic resin, a fluoro resin, an epoxy resin, a cardo resin, a vinyl resin, an imide resin, and a novolac resin can be used.

In regard to the method for forming a gate insulating film and the thickness of the film, the same methods and thicknesses that are generally used can be applied.

A protective film may be formed on the TFT. The protective film is provided in order to protect the TFT. For example, the protective film can prevent the semiconductor layer from being exposed to the moisture contained in air, or the like. As a protective film is formed, deterioration over time of the TFT performance can be reduced. As such a protective film, for example, insulating inorganic materials such as silicon oxide and silicon nitride; and insulating organic materials such as an acrylic resin, a phenolic resin, a fluoro resin, an epoxy resin, a cardo resin, a vinyl resin, an imide resin, and a novolac resin are used.

In regard to the method for forming a protective film and the thickness of the film, the same methods and thicknesses that are generally used can be applied.

When the semiconductor layer is an oxide semiconductor layer, if a protective film is formed on the oxide semiconductor layer by a sputtering method or the like, there is a risk that the oxide semiconductor may be deprived of oxygen. However, deprived oxygen can be supplemented by performing an annealing treatment in the presence of oxygen after the protective film is formed. Since this annealing treatment is carried out at a high temperature of several hundred degrees Celsius, there is a concern about dimensional alteration of the planarizing layer containing polyimide. However, since a contact adhesive layer is formed in the present invention, even if the dimension of the planarizing layer is altered by the annealing treatment, the adhesiveness between the planarizing layer and the TFT can be maintained, and detachment or cracks of the TFT can be suppressed.

C. Flexible Device

Next, the flexible device of the present invention will be described.

The flexible device of the present invention comprises the TFT substrate described above.

According to the present invention, since the TFT substrate described above is used, deterioration of the electrical performance of the TFT due to the surface irregularities of the metal foil surface can be prevented, and also, the occurrence of detachment or cracks in the electrodes or the semiconductor layer at the time of the production or use of the flexible device of the present invention can be prevented.

Furthermore, when the flexible device of the present invention is an organic EL display apparatus, since the substrate for flexible device has gas barrier properties against water vapor or oxygen, an organic EL display apparatus having satisfactory element performance can be obtained. Also, when the flexible device of the present invention is an organic EL display apparatus, since the substrate for a flexible device has heat dissipation properties, deterioration of performance due to the heat generation of the organic EL display apparatus can be suppressed.

According to the present invention, since the flexible device is supported by a metal foil, a flexible device having excellent durability can be obtained.

The flexible device of the present invention is not particularly limited as long as it is any device which includes a TFT and has flexibility, but among others, it is preferable that the flexible device be a flexible display. Examples of the flexible display include an organic EL display apparatus, an electronic paper, and a reflective liquid crystal display apparatus. Particularly, the flexible device of the present invention is preferably an organic EL display apparatus or an electronic paper. Examples of devices other than a flexible display include circuits such as RFID, and sensors.

Meanwhile, since the organic EL display apparatus will be described in detail in the Section "D. Organic EL display apparatus" that will be described below, and the electronic paper will be described in detail in the Section "E. Electronic paper" that will be described below, further description will not be given here. Also, since the TFT substrate has been described above in detail in the Section "B. TFT substrate for a flexible device," further description will not be repeated here.

D. Organic EL Display Apparatus

The organic EL display apparatus of the present invention includes the TFT substrate described above. That is, the organic EL display apparatus comprises the substrate for a flexible device described above. Specifically, the organic EL display apparatus of the present invention comprises: a substrate for a flexible device having a metal foil, a planarizing layer which is formed on the metal foil and contains polyimide, and a contact adhesive layer which is formed on the planarizing layer and contains an inorganic compound; a back surface electrode layer and a TFT formed on the contact adhesive layer of the substrate for a flexible device; an EL layer which is formed on the back surface electrode layer and contains at least an organic light emitting layer; and a transparent electrode layer formed on the EL layer.

Figure 8:
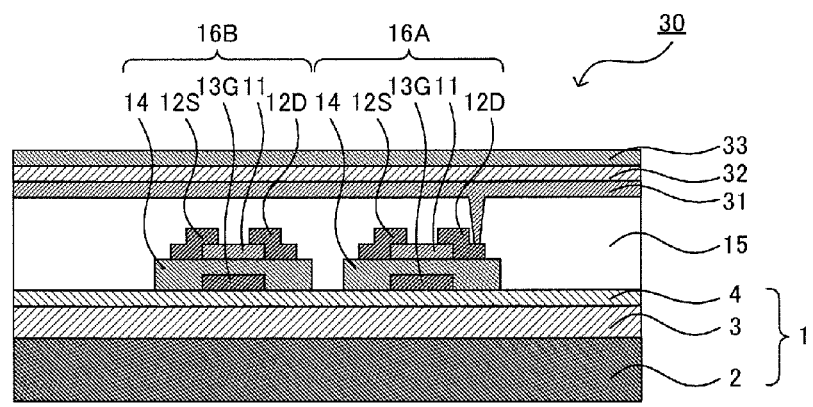
FIG. 8 is a schematic cross-sectional diagram showing an example of the organic EL display apparatus of the present invention.

FIG. 8 is a schematic cross-sectional diagram showing an example of the organic EL display apparatus of the present invention. The organic EL display apparatus 30 illustrated in FIG. 8 comprises: a substrate for a flexible device 1; a driving TFT 16A and a switching TFT 16B formed on the contact adhesive layer 4 of the substrate for a flexible device 1; a protective film 15 formed to cover the driving TFT 16A and the switching TFT 16B; a back surface electrode layer (pixel electrode) 31 which is formed on the protective film 15 and is electrically connected to the drain electrode 12D of the driving TFT 16A via through-holes; an EL layer 32 which is formed on the back surface electrode layer 31 and includes an organic light emitting layer; and a transparent electrode layer 33 formed on the EL layer 32. The substrate for a flexible device 1 comprises: a metal foil 2; a planarizing layer 3 which is formed on the metal foil 2 and contains polyimide; and a contact adhesive layer 4 which is formed on the planarizing layer 3 and contains an inorganic compound. The driving TFT 16A and the switching TFT 16B both have a bottom gate/top contact structure, and respectively have: a gate electrode 13G formed on the contact adhesive layer 4 of the substrate for a flexible device 1; a gate insulating film 14 formed on the gate electrode 13G; and a semiconductor layer 11, a source electrode 12S and a drain electrode 12D formed on the gate insulating film 14.

According to the present invention, since the substrate for a flexible device described above is used, deterioration of the electrical performance of the TFT due to the surface irregularities of the metal foil surface can be prevented, and also, the occurrence of detachment or cracks in the TFT at the time of production or use of the organic EL display apparatus of the present invention can be prevented. Furthermore, since the substrate for a flexible device has gas barrier properties against water vapor or oxygen, the element performance can be maintained satisfactorily. Also, the substrate for a flexible device has heat dissipation properties, performance deterioration due to the heat generation of the organic EL display apparatus can be suppressed. Also, since the organic EL display apparatus of the present invention is supported by a metal foil, the organic EL display apparatus can have excellent durability.

Meanwhile, since the substrate for a flexible device has been described above in detail in the Section "A. Substrate for a flexible device," further description will not be repeated here. Hereinafter, other configurations of the organic EL display apparatus of the present invention will be explained.

1. TFT

The TFT according to the present invention is formed on the contact adhesive layer of the substrate for a flexible device. Generally, in an organic EL display apparatus, two TFTs such as a driving TFT and a switching TFT are provided in each pixel.

Meanwhile, since the TFT has been described above in the Section "B. TFT substrate for a flexible device," further description will not be repeated here.

2. Back Surface Electrode Layer

The back surface electrode layer according to the present invention is a pixel electrode which is formed on the contact adhesive layer of the substrate for a flexible device, and is electrically connected to the drain electrode of the TFT.

The material of the back surface electrode layer is not particularly limited as long as it is an electroconductive material, and examples include elemental metals such as Au, Ta, W, Pt, Ni, Pd, Cr, Cu, Mo, alkali metals, and alkaline earth metals; oxides of these metals; and alloys including Al alloys such as AlLi, AlCa and AlMg, Mg alloys such as MgAg, Ni alloys, Cr alloys, alloys of alkali metals, and alloys of alkaline earth metals. These electroconductive materials may be used singly, two or more kinds may be used in combination, or two or more kinds may be used to form a laminate. Furthermore, electroconductive oxides such as indium tin oxide (ITO), indium zinc oxide (IZO), tin oxide, zinc oxide, indium oxide, and aluminum zinc oxide (AZO) can also be used.

In regard to the method for forming the back surface electrode layer and the thicknesses of the layer, those methods and thicknesses that are used in the electrodes for general organic EL display apparatuses can be applied.

3. EL Layer

The EL layer according to the present invention is formed on the back surface electrode layer, includes an organic light emitting layer, and has one or plural organic layers including at least an organic light emitting layer. That is, an EL layer means a layer which includes at least an organic light emitting layer, and a layer composed of one or more organic layers. Usually, when an EL layer is formed by a coating method, it is difficult to laminate a large number of layers due to the effect of solvent, and therefore, an EL layer frequently has one or two organic layers. However, it is also possible to provide a larger number of layers by designing the organic materials such that they have different solubilities in a solvent, or by combining a vacuum deposition method.

Examples of layers that are formed inside the EL layer other than the organic light emitting layer, include a hole injection layer, a hole transport layer, an electron injection layer and an electron transport layer. The hole injection layer and the hole transport layer may be integrated. Similarly, the electron injection layer and the electron transport layer may be integrated. In addition to them, another layer that is formed inside the EL layer may be a layer which is intended to increase the recombination efficiency by preventing the penetration of holes or electrons, such as in a carrier blocking layer, further preventing the diffusion of excitons, and confining excitons within the light emitting layer.

Such an EL layer frequently has a laminated structure in which various layers are laminated, and there are many types of laminated structures.

In regard to the various layers constituting the EL layer, the same ones that are used in general organic EL display apparatuses can be used.

4. Transparent Electrode Layer

The transparent electrode layer according to the present invention is formed on the EL layer. In the organic EL display apparatus of the present invention, the transparent electrode layer is transparent in order to extract light through the transparent electrode layer side.

The material of the transparent electrode layer is not particularly limited as long as it is an electroconductive material capable of forming a transparent electrode, and for example, electroconductive oxides such as indium tin oxide (ITO), indium zinc oxide (IZO), tin oxide, zinc oxide, indium oxide, and aluminum zinc oxide (AZO) can be used.

In regard to the method for forming a transparent electrode layer and the thickness of the layer, those methods and thicknesses that are used in the electrodes for general organic EL display apparatuses can be used.

5. Other Configurations

The organic EL display apparatus of the present invention may have, in addition to the configurations described above, an insulation layer, a barrier wall, a sealing member and the like as necessary.

E. Electronic Paper

The electronic paper of the present invention includes the TFT substrate described above. That is, the electronic paper comprises the substrate for a flexible device described above.

Specifically, the electronic paper of the present invention comprises: a substrate for a flexible device having a metal roil, a planarizing layer which is formed on the metal foil and contains polyimide, and a contact adhesive layer which is formed on the planarizing layer and contains an inorganic compound; a back surface electrode and a TFT formed on the contact adhesive layer of the substrate for a flexible device; a display layer formed on the back surface electrode layer; and a transparent electrode layer formed on the display layer.

Figure 9:
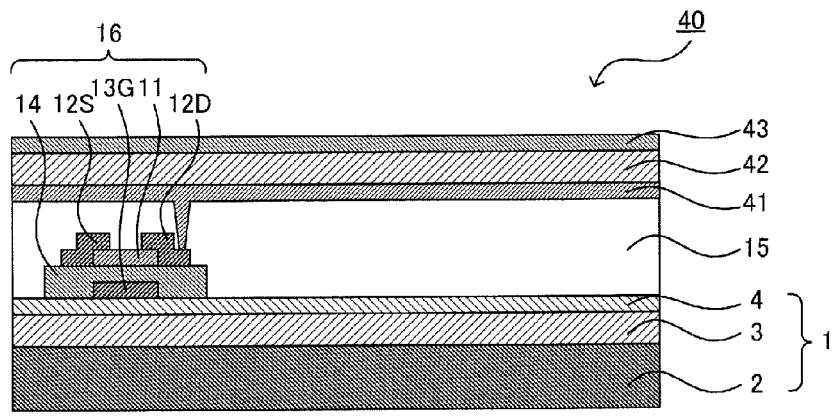
FIG. 9 is a schematic cross-sectional diagram showing an example of the electronic paper of the present invention.

FIG. 9 is a schematic cross-sectional diagram showing an example of the electronic paper of the present invention. The electronic paper 40 illustrated in FIG. 9 comprises: a substrate for a flexible device 1; a TFT 16 formed on the contact adhesive layer 4 of the substrate for a flexible device 1; a protective film 15 formed to cover the TFT 16; a back surface electrode layer (pixel electrode) 41 which is formed on the protective film 15 and is electrically connected to the drain electrode 12D of the TFT 16 via a through hole; a display layer 42 formed on the back surface electrode layer 41; and a transparent electrode layer 43 formed on the display layer 42. The substrate for a flexible device 1 comprises: a metal foil 2; a planarizing layer 3 which is formed on the metal foil 2 and contains polyimide; and a contact adhesive layer 4 which is formed on the planarizing layer 3 and contains an inorganic compound. The TFT 16 has a bottom gate/top contact structure, and has: a gate electrode 13G formed on the contact adhesive layer 4 of the substrate for a flexible device 1; a gate insulating film 14 formed on the gate electrode 13G; and a semiconductor layer 11, a source electrode 12S and a drain electrode 12D formed on the gate insulating film 14.

According to the present invention, since the substrate for a flexible device described above is used, deterioration of the electrical performance of the TFT due to the surface irregularities of the metal foil surface can be prevented, and also, the occurrence of detachment or cracks in the TFT at the time of production or use of the electronic paper of the present invention can be prevented. Furthermore, since the electronic paper of the present invention is supported by the metal foil, an electronic paper having excellent durability can be obtained.

As the display system of the electronic paper, any known system can be applied, and for example, an electrophoretic system, a twist ball system, a powder movement system (electronic liquid powder system, charged toner system), a liquid crystal display system, a thermal system (color development system, light scattering system), an electrodeposition system, a movable film system, an electrochromic system, an electrowetting system, and a magnetophoretic system.

The display force that constitutes the electronic paper is appropriately selected according to the display system of the electronic paper.

In regard to the back surface electrode layer and the transparent electrode layer, the same ones as the back surface electrode layer and the transparent electrode layer for the organic EL display apparatus described above can be applied.

Meanwhile, the substrate for a flexible device has been described above in detail in the Section "A. Substrate for a flexible device," while the TFT has been described above in the Section "B. TFT substrate for a flexible device," and therefore, further description will not be repeated here.

F. Substrate for Thin Film Element

The substrate for thin film element of the present invention is a substrate for thin film element comprising: a metal base material, and an insulating layer which is formed on the metal base material and contains polyimide, and is characterized in that the surface roughness Ra of the insulating layer is 30 nm or less.

Figure 16:
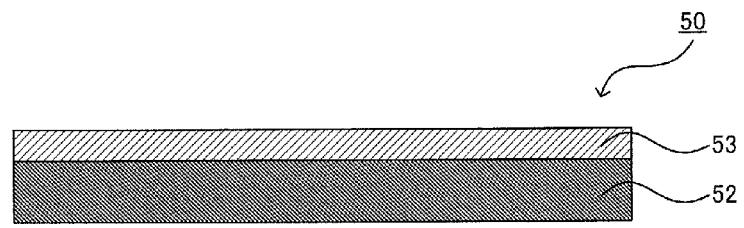
FIG. 16 is a schematic cross-sectional diagram showing an example of the substrate for a thin film element of the present invention.

FIG. 16 is a schematic cross-sectional diagram showing an example of the substrate for thin film element of the present invention. The substrate for thin film element 50 shown in FIG. 16 comprises: a metal base material 52, and an insulating layer 53 which is formed on the metal base material 52 and contains polyimide, and the surface roughness Ra of the insulating layer 53 is 30 nm or less.

According to the present invention, since the insulating layer has excellent surface smoothness, deterioration of the characteristics of the thin film element due to fine surface irregularities can be prevented by using the substrate for thin film element of the present invention.

Furthermore, according to the present invention, since penetration of moisture or oxygen can be reduced by the metal base material, deterioration of the thin film element unit due to moisture or oxygen can be suppressed, the humidity inside the element can be maintained, and deterioration of the characteristics due to humidity change can be suppressed.

Also, since metal base materials generally have excellent heat conductivity, a substrate for a thin film element having heat dissipation properties can be obtained. That is, a substrate for a thin film element which has high moisture blocking properties and can rapidly conduct or dissipate heat can be obtained. For example, when the substrate for a thin film element is used in an organic EL element, the adverse effect caused by heat generation upon light emission of the organic EL element can be suppressed, and the luminescence characteristics can be stably maintained over a long time period. Also, uniform light emission without emission unevenness can be realized, and shortening of the service life or destruction of the element can be reduced.

Also, since the substrate has a metal base material, a substrate for a thin film element having high strength can be obtained, and therefore, durability can be enhanced.

Hereinafter, the various configurations of the substrate for a thin film element of the present invention will be explained.

1. Insulating Layer

The insulating layer according to the present invention is formed on the metal base material, contains polyimide, and has a surface roughness Ra of 30 nm or less.

The surface roughness Ra of the insulating layer is 30 nm or less when measured in an area of 50 μm×50 μm, and preferably, the surface roughness Ra is 30 nm or less when measured in an area of 100 μm×100 μm.

Meanwhile, the surface roughness Ra is a value measured using an atomic force microscope (AFM) or a scanning white light interferometer. For example, in the case of making the measurement in an area of 50 μm×50 μm, Ra can be calculated using an AFM or a scanning white light interferometer. Also, when the measurement is made in an area of 100 μm×100 μm, Ra is 30 nm or less. When the measurement is made in an area where the insulating layer has a smoothness such as described above, Ra can be calculated using a scanning white light interferometer. Specifically, in the case of making the measurement using an AFM, Ra can be determined by taking an image of the surface morphology using Nanoscope V Multimode™ (manufactured by Veeco Instruments, Inc.) in a tapping mode, under the conditions of cantilever: MPP11100, scan range: 50 μm×50 μm, and scan speed: 0.5 Hz, and calculating the discrepancy of the average from the center line of a roughness curve calculated from the image thus obtained. Furthermore, in the case of measuring the value using a scanning white light interferometer, Ra can be determined by taking an image of the surface morphology of an area having a size of 50 μm×50 μm using New View 5000™ (manufactured by Zygo Corp.) under the conditions of object lens: 100 times, zoom lens: 2 times, and scan length: 15 μm, or taking an image of the surface morphology of an area having a size of 100 μm×100 μm under the conditions of object lens: 100 times, zoom lens: 1 time, and scan length: 15 μm, and calculating the discrepancy of the average from the center line of a roughness curve calculated from the image thus obtained.

In order to adjust the surface roughness Ra of the insulating layer to 30 nm or less, it is preferable to produce the substrate for a thin film element by the method for manufacturing a substrate for a thin film element described in the Section "I. Method for manufacturing substrate for a thin film element" that will be described below.

The insulating layer contains polyimide, and preferably contains polyimide as a main component. The characteristics of the insulating layer are the same as the characteristics of the planarizing layer described above in the Section "A. Substrate for a flexible device, 2. Planarizing layer."

The polyimide constituting the insulating layer is not particularly limited as long as it satisfies the characteristics described above. The polyimide is the same as the polyimide obtainable by the polyimide resin composition described in the Section "I. Method for manufacturing substrate for a thin film element" that will be described below.

Meanwhile, since the method for forming an insulating layer will be described in the Section "I. Method for manufacturing substrate for a thin film element" that will be described below, further description will not be repeated here. Furthermore, since other factors of the insulating layer are the same as those of the planarizing layer described above in the Section "A. Substrate for a flexible device, 2. Planarizing layer," further description will not be repeated here.

2. Metal Base Material

The metal base material according to the present invention is a material that supports the insulating layer described above.

The characteristics of the metal base material, and the metal material constituting the metal base material are the same as the characteristics of the metal foil and the metal material constituting the metal foil described above in the Section "A. Substrate for a flexible device, 3. Metal foil."

Among others, the metal base material is preferably an alloy. It is because a wide variety of characteristics can be applied in accordance with the composition, as compared with pure metals. Furthermore, since a metal base material of an alloy system is usually produced by rolling, and organic components such as rolling oil that is used in the rolling process are adhering to the metal base material as described above, chemical treatments are useful.

Particularly, it is preferable that the metal base material contain iron as a main component. It is because there have been developed a wide variety of compositions of the metal base material containing iron as a main component, and a suitable composition having the characteristics required for the use can be selected. Also, a metal base material containing iron as a main component has high chemical resistance, and various chemical treatments can be applied. Furthermore, a metal base material containing iron as a main component is also advantageous in that the base material is excellent in terms of properties such as heat resistance, oxidation resistance, and low expansion.

Meanwhile, the phrase "the metal base material contains iron as a main component" implies that the iron content in the metal base material is 30% by mass or more.

Examples of a metal component contained in the metal base material other than iron include chromium (Cr), nickel (Ni), molybdenum (Mo), manganese (Mn), copper (Cu), titanium (Ti), niobium (Nb), vanadium (V), tungsten (W), aluminum (Al), cobalt (Co), and tin (Sn). Also, examples of a non-metal component contained in the metal base material include carbon (C), silicon (Si), phosphorus (P), sulfur (S), nitrogen (N), oxygen (O), and boron (B).

Specific examples of the metal base material containing iron as a main component include carbon steel, nickel chromium steel, nickel chromium molybdenum steel, chromium steel, chromium molybdenum steel, manganese molybdenum steel, SUS, invar, 42 alloy, and kovar. Among them, the metal base material containing iron as a main component is preferably SUS. SUS has excellent oxidation resistance and has superior heat resistance. Also, SUS has a smaller coefficient of linear thermal expansion as compared with copper, and has excellent dimensional stability. Furthermore, SUS304 is particularly advantageous in that the material is easily available, and SUS430 is also advantageous in that the material is easily available and has a coefficient of linear thermal expansion that is smaller than that of SUS304. On the other hand, when the coefficients of linear thermal expansion of the metal base material and the thin film element unit are considered, from the viewpoint of the coefficient of linear thermal expansion, invar which has a coefficient of linear thermal expansion that is lower than that of SUS430 is preferred. However, it is desirable to select the metal base material while taking into consideration of the coefficient of linear thermal expansion as well as oxidation resistance, heat resistance, processability attributable to malleability and ductility of the metal base material, or the production cost.

The contact angle of the metal base material surface with respect to the solvent included in the polyimide resin composition is preferably 30° or less, more preferably 20° or less, and even more preferably 10° or less. It is because if the contact angle is too large, when the polyimide resin composition is applied on the metal base material, uniform application is difficult, repelling or foaming occurs, and there is a possibility that the coating film surface is roughened and thereby the smoothness of the insulating layer may be adversely affected. Furthermore, it is because there is a risk that pinholes or craters may occur and a uniform film may not be obtained.

Meanwhile, the contact angle is a value obtained by measuring the contact angle with the solvent included in the polyimide resin composition using a contact angle analyzer (Model DM500, manufactured by Kyowa Interface Science Co., Ltd.) (2 seconds after dropping 1.5 µL of liquid droplets from a microsyringe).

Furthermore, in the metal base material surface, the ratio of the amount of carbon (C) element relative to the total amount of elements detected by X-ray photoelectron spectrophotometer (XPS) is preferably 0.25 or less, and more preferably 0.20 or less. It is because when the ratio of the amount of carbon (C) element relative to the total amount of detected elements is in the range described above, the contact angle of the metal base material surface with respect to the solvent included in the polyimide resin composition is small, and the coating properties of the polyimide resin composition on the metal base material can be ameliorated. The carbon component can be considered to originate from organic components such as rolling oil used during the production of the metal base material, or those organic components contained in the atmosphere. It can be speculated that if a large amount of carbon components remain on the surface of the metal base material, there will be adverse effects on the contact angle of the metal base material surface with respect to the solvent included in the polyimide resin composition, or the coating properties of the polyimide resin composition on the metal base material.

Meanwhile, in regard to the analysis by X-ray photoelectron spectrophotometer (XPS), for example, the measured values of various elements can be determined using Quantum 2000™ (manufactured by Ulvac-PHI, Inc.), by performing charge neutralization at Ion/Electron 20 µA under the X-ray conditions of Al mono 200 µmϕ×30 W, 15 kV, and a photoelectron incident angle of 45°.

The thickness of the metal base material is not particularly limited as long as it is a thickness that can satisfy the characteristics described above, and the thickness is appropriately selected in accordance with the use. As the thickness of the metal base material is smaller, the metal base material has sufficient flexibility. On the other hand, as the thickness of the metal base material is larger, the gas barrier properties against oxygen or water vapor, or heat diffusion in the plane direction become excellent. Specifically, the thickness of the metal base material is the same as the thickness of the metal foil described above in the Section "A. Substrate for a flexible device, 3. Metal foil."

The shape of the metal base material is not particularly limited, and for example, a foil form or a plate form may also be used.

Furthermore, the morphology of the metal base material may be a morphology having surface irregularities on the surface that is brought into contact with air. When the metal base material has surface irregularities on the surface that is brought into contact with air, heat diffusion is improved, and heat dissipation properties can be enhanced. Meanwhile, the method for forming surface irregularities, and the dimension or shape of surface irregularities are the same as described above in the Section "A. Substrate for a flexible device, 3. Metal foil."

As the method for producing the metal base material, any general method can be used, and the method is appropriately selected in accordance with the type of the metal material or the thickness of the metal base material. If the metal base material is a metal foil, the metal foil may be a rolled foil, or may be an electrolytic foil; however, a rolled foil is preferred in view of having satisfactory gas barrier properties.

Other factors regarding the metal base material are the same as those of the metal foil described above in the Section "A. Substrate for a flexible device, 3. Metal foil."

3. Contact Adhesive Layer

According to the present invention, a contact adhesive layer containing an inorganic compound may be formed on the insulating layer, or may not be formed thereon.

Meanwhile, since the contact adhesive layer is the same as described above in the Section "A. Substrate for a flexible device, 1. Contact adhesive layer," further description will not be repeated here.

G. Thin Film Element

The thin film element of the present invention comprises the substrate for a thin film element described above, and a thin film element unit formed on the substrate for a thin film element.

According to the present invention, since the substrate for a thin film element described above is used, it is possible to obtain a thin film element having excellent characteristics.

Furthermore, since the substrate for a thin film element has gas barrier properties against oxygen or water vapor, deterioration of the element performance due to moisture or oxygen can be suppressed, the humidity inside the element is maintained constant, and deterioration of the characteristics due to humidity change can be suppressed. In addition, since the substrate for a thin film element has gas barrier properties as well as heat dissipation properties, for example, when an organic EL element is produced as the thin film element unit, the luminescence characteristics can be maintained stably over a long time period, and also uniform light emission without emission unevenness is realized. Also, shortening of the service life or destruction of the element can be reduced.

Meanwhile, the "thin film element" means an electronic element having a functional layer having a thickness of 150 nm or less. That is, the "thin film element unit" means an electronic element area having a functional layer having a thickness of 150 nm or less. The thickness of the functional layer is preferably 100 nm or less.

Examples of the functional layer include an insulating layer, an electrode layer, a semiconductor layer, a dielectric layer, a contact adhesive layer, and a seed layer. Among them, the functional layer is preferably an insulating layer, an electrode layer, a semiconductor layer, or a dielectric layer. It is because it is particularly preferable that these layers have high smoothness, because there occurs inconvenience that seriously affects the operation of the element, such as disconnection, short circuit and defects, due to surface irregularities in the order of nanometers.

The functional layer may be formed directly on the substrate for a thin film element, or may be formed on the substrate for a thin film element with an intermediate layer interposed therebetween. The intermediate layer is not particularly limited as long as it does not significantly change the surface roughness of the substrate for a thin film element.

The thin film element unit is not particularly limited as long as it is an electronic element area having the functional layers described above, and examples include TFTs, thin film solar cells, EL elements, RFID (Radio Frequency IDentification: IC tag), and memories.

Meanwhile, since the TFT is the same as described above in the Section "B. TFT substrate for a flexible device," further description will not be repeated here.

Examples of the thin film solar cells include CIGS (Cu (copper), In (indium), Ga (gallium), Se (selenium)) solar cells, and organic thin film solar cells.

The EL element may be any of an organic EL element and an inorganic EL element.

The thin film element unit may be formed directly on the insulating layer of the substrate for a thin film element. That is, a thin film element unit may be formed directly on the insulating layer of the substrate for a thin film element, without a contact adhesive layer being formed on the substrate for a thin film element.

The method for forming a thin film element unit is appropriately selected according to the type of the thin film element unit, and any general method can be employed.

H. TFT

The TFT of the present invention comprises the substrate for a thin film element described above, and a TFT formed on the substrate for thin film element.

According to the present invention, since the substrate for a thin film element described above can be used, it is possible to obtain a TFT having satisfactory electrical performance.

Furthermore, since the substrate for a thin film element has gas barrier properties against oxygen or water vapor, when an organic EL display apparatus is produced using a TFT, deterioration of the element performance due to moisture or oxygen can be suppressed. Furthermore, when an electronic paper is produced using a TFT, the humidity inside the element is maintained constant, and deterioration of the display characteristics due to humidity change can be suppressed. Furthermore, since the substrate for a thin film element has gas barrier properties as well as heat dissipation properties, an organic EL display apparatus is produced using a TFT, the luminescence characteristics can be maintained stably over a long time period, and uniformly light emission without emission unevenness can be realized. On the other hand, shortening of service life or destruction of the element can be reduced.

Meanwhile since the TFT is the same as described above in the Section "B. TFT substrate for a flexible device," further description will not be repeated here.

The TFT may be formed directly on the insulating layer of the substrate for a thin film element. That is, the TFT may be formed directly on the insulating layer of the substrate for a thin film element, without a contact adhesive layer being formed on the substrate for a thin film element. In this case, it is preferable that those layers that are in contact with the insulating layers, such as the semiconductor layer, electrodes and the gate insulating film that constitute the TFT, have satisfactory adhesiveness to the insulating layer. For example, when the semiconductor layer is in contact with the insulating layer, the semiconductor layer is preferably an organic semiconductor layer. Here, the insulating layer according to the present invention has excellent surface smoothness, when a semiconductor layer is formed directly on the insulating layer of the substrate for a thin film element, the adhesiveness tends to decrease. On the contrary, when an organic semiconductor layer is used as the semiconductor layer, the adhesiveness between the insulating layer and the organic semiconductor layer can be ameliorated. Also, since an organic semiconductor layer has flexibility as compared with semiconductor layers formed from silicon or oxide semiconductors, even if moisture or heat is applied during the production of the TFT, and the dimension of the insulating layer containing polyimide is changed, the occurrence of detachment or cracks in the organic semiconductor layer can be prevented.

The TFT of the present invention can be used in, for example, organic EL display apparatuses, electronic papers, reflective liquid crystal display apparatuses, circuits such as RFID, and sensors. Among them, organic EL display apparatuses and electronic papers are suitable.

I. Method for Manufacturing Substrate for a Thin Film Element

The method for manufacturing a substrate for a thin film element of the present invention has two embodiments. Hereinafter, each of the embodiments will be explained.

(I) First Embodiment

The first embodiment of the method for manufacturing a substrate for a thin film element of the present invention comprises steps of: a metal base material surface treatment step of subjecting a metal base material to a chemical treatment, and an insulating layer forming step of applying a polyimide resin composition on the metal base material and thereby forming an insulating layer, and is characterized in that the surface roughness Ra of the insulating layer is 30 nm or less.

The method for manufacturing a substrate for a thin film element of the present invention will be described with reference to the attached drawings.

Figure 11A:
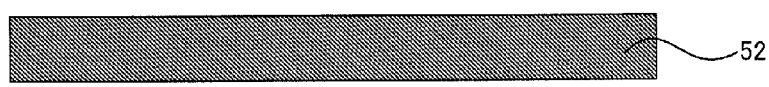
FIGS. 11A to 11C are a process flow diagram showing an example of the method for manufacturing a substrate for a thin film element of the present invention.
Figure 11B:
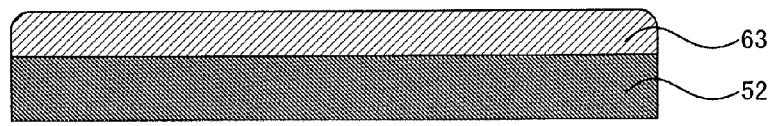
Figure 11C:
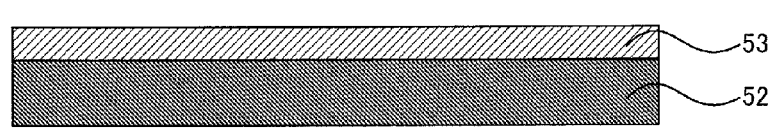

FIG. 11A to FIG. 11C are process flow diagrams showing an example of the method for manufacturing the substrate for a thin film element of the present invention. First, as shown in FIG. 11A, the surface of the metal base material 52 is washed with a chemical (not depicted) (metal base material surface treatment step), and then a polyimide resin composition 63 is applied on the metal base material 52 (FIG. 11B). The polyimide resin composition is imidized by a heat treatment to form an insulating layer 53 (FIG. 11C) (insulating layer forming step). At this time, an insulating layer having a surface roughness Ra of 30 nm or less is formed. Thereby, a substrate for a thin film element 50 is obtained.

According to the present invention, when the metal base material is subjected to a chemical treatment, those organic components described above remaining on the surface of the metal base material can be removed, and wettability of the polyimide resin composition to the metal base material can be improved. Therefore, when the polyimide resin composition is applied on the metal base material, the resin composition can be uniformly applied, and the occurrence of repelling or foaming can be suppressed. Accordingly, the uniformly of the coating film is enhanced, and pinholes or craters are reduced, so that an insulating layer having excellent surface smoothness can be formed. Furthermore, even if surface irregularities exist on the surface of the metal base material, the surface irregularities on the metal base material surface can be planarized by forming the insulating layer on the metal base material, and thus the surface smoothness of the substrate for a thin film element can be improved. Therefore, according to the present invention, deterioration of the characteristics of the thin film element can be prevented.

Figure 12A:
FIGS. 12A to 12D are a process flow diagram showing another example of the method for manufacturing a substrate for a thin film element of the present invention.
Figure 12B:
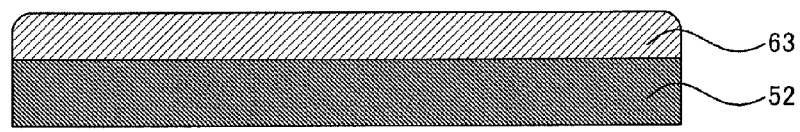
Figure 12C:
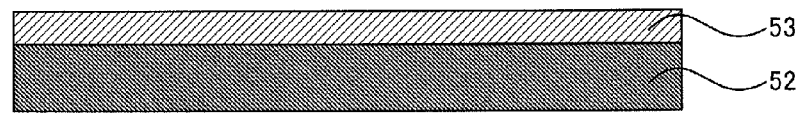
Figure 12D:
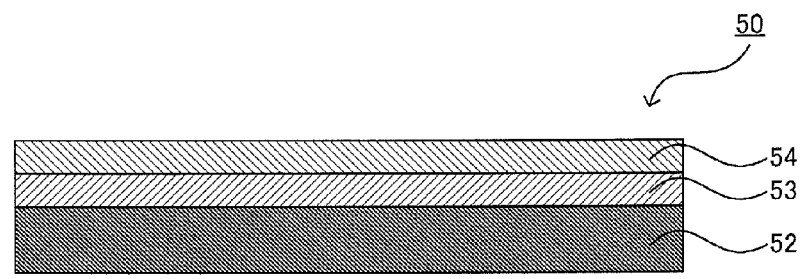
Figure 13A:
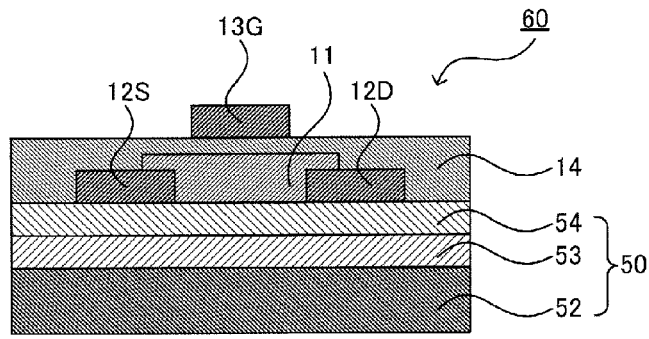
FIGS. 13A and 13B are each a schematic cross-sectional diagram showing an example of a TFT which includes the substrate for a thin film element of the present invention.
Figure 13B:
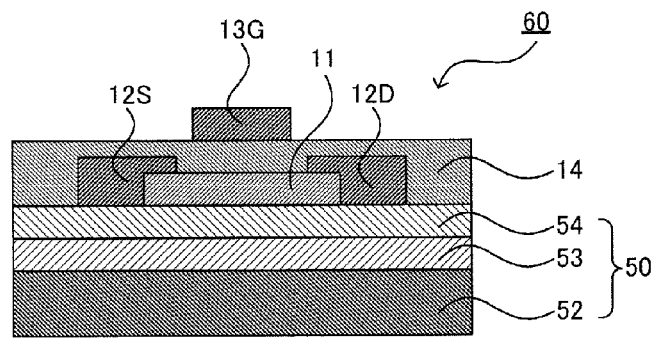
Figure 14A:
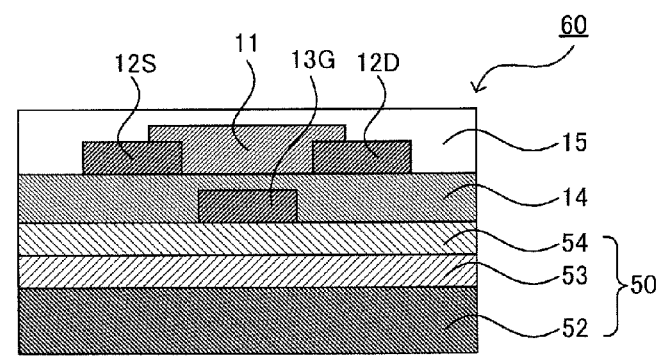
FIGS. 14A and 14B are each a schematic cross-sectional diagram showing another example of a TFT which includes the substrate for a thin film element of the present invention.
Figure 14B:
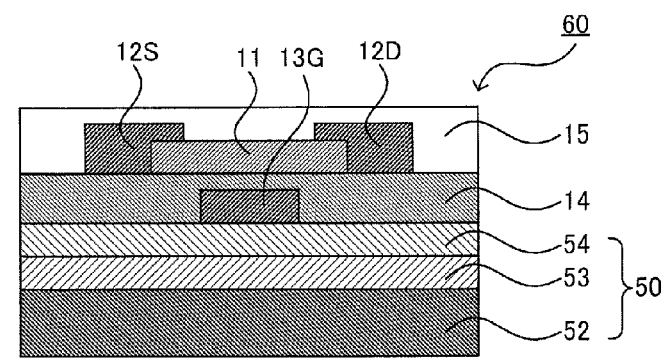
Figure 15A:
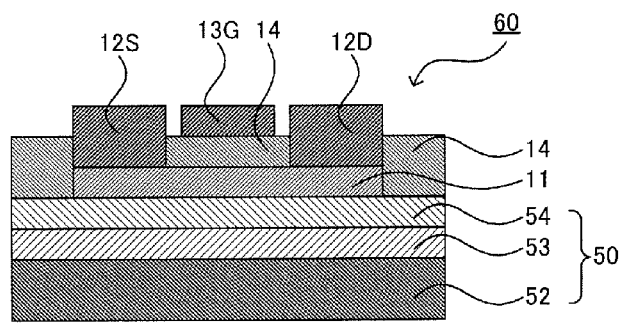
FIGS. 15A and 15B are each a schematic cross-sectional diagram showing another example of a TFT which includes the substrate for a thin film element of the present invention.
Figure 15B:
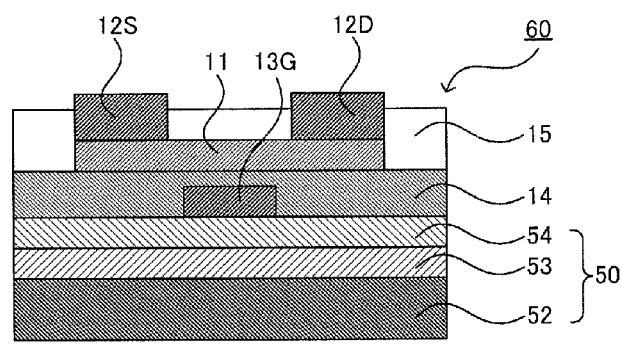

FIG. 12A to FIG. 12D are process flow diagrams showing another example of the method for manufacturing the substrate for a thin film element of the present invention. FIG. 12A to FIG. 12C are the same as FIG. 11A to FIG. 11C. In the method for manufacturing a substrate for a thin film element shown in FIG. 12A to FIG. 12D, after the insulating layer forming step, as shown in FIG. 12D, a contact adhesive layer 54 containing an inorganic compound is formed on the insulating layer 53 (contact adhesive layer forming step). Thereby, a substrate for a thin film element 50 is obtained.

According to the present invention, when a contact adhesive layer is formed on the insulating layer, a substrate for a thin film element having excellent contact adhesive layer with the thin film element unit can be obtained. Therefore, even if moisture or heat is applied at the time of the production of a thin film element, and the dimension of the insulating layer is changed, the occurrence of detachment or cracks in the member constituting the thin film element, for example, an electrode or a semiconductor layer constituting a TFT, can be prevented.

According to the present invention, since the permeation of moisture or oxygen can be reduced by the metal base material, deterioration of the thin film element unit due to moisture or oxygen can be suppressed, the humidity inside the element is maintained, and deterioration of the characteristics due to humidity change can be suppressed.

Furthermore, since metal base materials generally have excellent heat conductivity, a substrate for a thin film element having heat dissipation properties can be obtained. That is, a substrate for a thin film element which has high moisture blocking properties and can also rapidly conduct or dissipate heat can be obtained. For example, in the case of using the substrate for a thin film, element in an organic EL element, the adverse effect caused by heat generation upon light emission of the organic EL element can be suppressed, and the luminescence characteristics can be maintained stably over a long time period. Also, uniform light emission without emission unevenness can be realized, and shortening of the service life or destruction of the element can be reduced.

Also, a substrate for a thin film element having high strength can be obtained by having a metal base material, and durability can be enhanced.

The substrate for a thin film element produced by the present invention is used, for example, as follows. FIG. 13A to FIG. 15B are schematic cross-sectional diagrams each showing an example of a TFT which includes the substrate for a thin film element produced by the method for manufacturing a substrate for a thin film element of the present invention. Meanwhile, the structure of the TFT 60 illustrated in FIG. 13A to FIG. 15B is the same as the structure of the TFT substrate 10A illustrated in FIG. 2A to FIG. 4B described above in the Section "A. Substrate for a flexible device."

Hereinafter, the various steps of the method for manufacturing a substrate for a thin film element of the present invention will be explained.

1. Metal Base Material Surface Treatment Step

The metal base material surface treatment step according to the present invention is a step of subjecting a metal base material to a chemical treatment.

The method for a chemical treatment of the metal base material is not particularly limited as long as it is a method capable of improving the wettability of the polyimide resin composition to the metal base material, and examples include alkali washing, electrolytic degreasing, and acid washing.

Alkali washing is a method of washing the surface of a metal base material through elution, by immersing the metal base material into an alkaline liquid chemical, or applying a paste-like alkali detergent on the surface. Although the surface does not become glossy, large-sized products can be dealt with at low cost. Since glossy areas also turn into an deluster state, if the external appearance is not of problem such as in the case of taking black charcoal resulting from welding burn, alkali washing can be applied.

Electrolytic degreasing is a method of eluting the projections (micrometer level) on the surface of the metal base material by passing electricity in a liquid chemical, and thereby making the surface smooth and glossy. Since this method removes any fouling impurities adhering on the surface of the metal base material and reinforces the coating film, corrosion resistance can be enhanced. This can be considered to be because iron on the surface of the metal base material dissolves first by electrolysis, metal components other than iron (for example, chromium) are relatively concentrated, and the passive film is strengthened.

Acid washing is a method of washing the surface of a metal base material through elution by immersing the metal base material in a strongly acidic liquid chemical or applying a paste-like acid detergent. Although the surface does not become glossy, large-sized products can be dealt with at low cost. Since glossy areas also turn into an deluster state, if the external appearance is not of problem such as in the case of taking black charcoal resulting from welding burn, acid washing can be applied.

According to the present invention, it is preferable to apply a chemical treatment such that the contact angle of the metal base material surface with respect to the solvent included in the polyimide resin composition is lowered. Specifically, it is preferable to apply a chemical treatment such that the contact angle of the metal base material surface with respect to the solvent included in the polyimide resin composition is 30° or less. The contact angle of the metal base material surface with respect to the solvent included in the polyimide resin composition after a chemical treatment is preferably 30° or less, more preferably 20° or less, and even more preferably 10° or less.

Furthermore, for the surface of the metal base material after the chemical treatment described above, the ratio of the amount of carbon (C) element relative to the total amount of elements detected by X-ray photoelectron spectrophotometer (XPS) is preferably 0.25 or less, and more preferably 0.20 or less.

Meanwhile, since other factors of the metal base material are the same as described above in the Section "F. Substrate for a thin film element, 2. Metal base material," further description will not be repeated here.

2. Insulating Layer Forming Step

The insulating layer forming step according to the present invention is a step of applying the polyimide resin composition described on the metal base material described above and thereby forming an insulating layer.

Hereinafter, the polyimide resin composition and the method for forming an insulating layer will be explained.

(1) Polyimide Resin Composition

The polyimide resin composition used in the present invention contains polyimide component and a solvent.

Hereinafter, the various components of the polyimide resin composition will be explained.

(a) Polyimide Component

The polyimide component may be any of polyimide and a polyimide precursor. Specific examples include polyimide having a structure represented by the following formula (1), and polyimide precursors having structures represented by the following formulas (2) and (3).

[Chemical Formula 5]

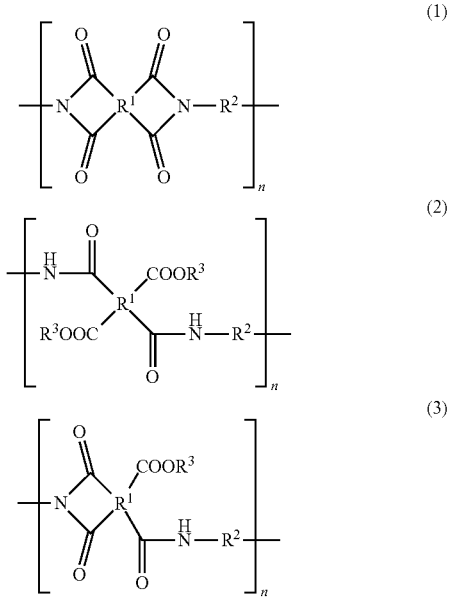

In the formulas (1) to (3), $R^1$ represents a tetravalent organic group; $R^2$ represents a divalent organic group; $R^3$ represents a hydrogen atom or a monovalent organic group; repeating $R^1$s, $R^2$s and $R^3$s may be respectively identical with or different from each other; and "n" represents a natural number of 1 or greater.

Furthermore, the formula (3) is left-right asymmetric, but one polymer molecular chain may contain structures having different left-right directions.

As the polyimide component according to the present invention, only those polymers having only the respective structures of the formula (1), formula (2) and formula (3) may be used; a mixture of polymers having only the respective structures of the formula (1), formula (2) and formula (3) may be used; or a polymer having a mixture of structures of the formula (1), formula (2) and formula (3) in one polymer molecular chain may be used.

In the formulas (1) to (3), generally, $R^1$ represents a structure derived from a tetracarboxylic acid dianhydride, and $R^2$ represents a structure derived from a diamine.

As the method for manufacturing the polyimide component used in the present invention, any conventionally known technique can be applied. For example, examples of the method for forming a polyimide precursor having a structure represented by the formula (2) include, but are not limited to, (i) a technique of synthesizing polyamic acid from acid dianhydride and diamine; and (ii) a technique of forming the polyimide component by allowing the carboxylic acid of ester acid or amide acid monomer synthesized by allowing acid dianhydride to react with a monohydric alcohol, an amino compound, an epoxy compound or the like, to react with a diamino compound or a derivative thereof.

Also, as the method for forming a polyimide precursor having a structure represented by the formula (3) or polyimide represented by the formula (1), a method of imidizing a polyimide precursor represented by the formula (2) by heating may be used.

As the tetracarboxylic acid dianhydride that can be applied to the polyimide component in the present invention, those described above in the Section "A. Substrate for a flexible device" may be used. These are used singly or as mixtures of two or more kinds.

On the other hand, also for the diamine component that can be applied to the polyimide component, one kind of diamine can be used alone, or two or more kinds of diamines can be used in combination. As the diamine component to be used, those described above in the Section "A. Substrate for a flexible device" may be used.

In order to enhance the heat resistance and insulation properties of the polyimide resin composition according to the present invention, it is preferable that the polyimide component contain an aromatic skeleton. It is because a polyimide resin obtainable by heating and curing a polyimide component containing an aromatic skeleton originates from its rigid and highly planar skeleton, has excellent heat resistance and excellent insulation properties in a thin film, and produces less outgas, and therefore, the polyimide component is used with preference in the insulating layer of the substrate for a thin film element of the present invention.

Furthermore, it is desirable that the acid dianhydride-derived moiety of the polyimide component has an aromatic structure, and the diamine-derived moiety also contain an aromatic structure. Therefore, it is preferable that the diamine component-derived structure be also a structure derived from an aromatic diamine. Particularly, it is preferable that both the acid dianhydride-derived moiety and the diamine-derived moiety be total aromatic polyimides or total aromatic polyimide precursors containing aromatic structures.

Here, a total aromatic polyimide precursor is a polyimide precursor obtainable by copolymerization of an aromatic acid component and an aromatic amine component or by polymerization of aromatic acid/amino component, or a derivative thereof. Furthermore, the aromatic acid component is a compound in which four acid groups forming a polyimide skeleton are all substituting on the aromatic ring, and the aromatic amine component is a compound in which two amino groups forming a polyimide skeleton are both substituting on the aromatic ring. The aromatic acid/amino component is a compound in which the acid group and the amino group forming a polyimide skeleton are both substituting on the aromatic ring. However, as it is obvious from the specific examples of the above-described raw material aromatic acid dianhydride and aromatic diamine, it is not necessary that all acid groups or amino groups be present on the same aromatic ring.

From the reasons described above, the polyimide precursor is such that when heat resistance and dimensional stability are required of the polyimide resin that is eventually obtained, it is preferable that the copolymerization proportion of the aromatic acid component and/or aromatic amine component be as large as possible. Specifically, the proportion of the aromatic acid component in the acid components that constitute repeating units having an imide structure, is preferably 50 mol % or more, and particularly preferably 70 mol % or more. The proportion of the aromatic amine component in the amine components that constitute repeating units having an imide structure, is preferably 40 mol % or more, and particularly preferably 60 mol % or more. It is preferable that the polyimide precursor be total aromatic polyimide or a total aromatic polyimide precursor.

Furthermore, the moieties having a cyclic structure after imidization contained in the formula (1) and formula (3) have lower solubility in solvents than the carboxylic acid moieties before imidization contained in the formula (2) and formula (3), and therefore, it is desirable to use a polyimide precursor which contains a large amount of structure before imidization and is highly soluble. A polyimide precursor having acid anhydride-derived carboxyl groups (or esters thereof) at a proportion of 50% or more of the total amount of carboxyl groups is preferred, and a polyimide precursor having such carboxyl groups at a proportion of 75% or more of the total amount of carboxyl groups is more preferred. It is preferable that the polyimide precursor be entirely polyamic acid represented by the formula (2) (and derivatives thereof).

Furthermore, it is particularly preferable that the polyamic acid represented by the formula (2) (and derivatives thereof) be polyamic acid in which $R^3$s are all hydrogen atoms, from the viewpoints of the ease of synthesis and high solubility in alkali developer solutions.

According to the present invention, among others, it is preferable that 33 mol % or more of $R^1$s in the polyimide components having structures represented by the formulas (1) to (3) have any of structures represented by the following formulas. It is because there is an advantage that polyimide resins having excellent heat resistance and exhibiting low coefficients of linear thermal expansion are obtained.

[Chemical Formula 6]

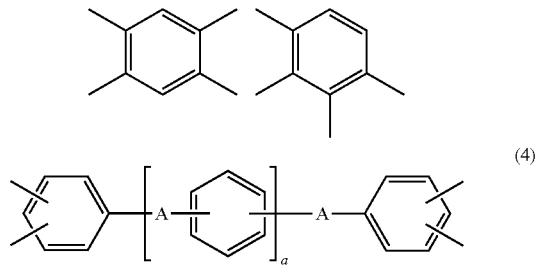

(4)

In the formula (4), "a" represents 0 or a natural number of 1 or greater; A represents any of a single bond (biphenyl structure), an oxygen atom (ether bond) and an ester bond, while all of A's may be identical with or different from each other; and the bonding group is bonded to the 2-position and 3-position or the 3-position and 4-position of the aromatic ring as viewed from the bonded site of the aromatic ring.

According to the present invention, particularly, when a polyimide component having a structure represented by any one of the formulas (1) to (3) contains a structure represented by the formula (4), the polyimide resin exhibits low hygroscopic expansion. There is also an advantage that the polyimide resin is easily commercially available, and the production cost is low.

The polyimide component having a structure such as described above is capable of forming a polyimide resin exhibiting high heat resistance and a low coefficient of linear thermal expansion. Accordingly, it is more preferable that the content of the structures represented by the formulas described above be closer to 100 mol % of $R^1$s in the formulas (1) to (3), but it is desirable that the content of the structures be at least 33% or more of $R^1$s in the formulas (1) to (3). Inter alia, the content of the structures represented by the formulas described above is preferably 50 mol % or more, and more preferably 70 mol % or more, of $R^1$s in the formulas (1) to (3).

According to the present invention, examples of the structure of the acid dianhydride that makes the polyimide resin less hygroscopic include a structure represented by the following formula (5).

[Chemical Formula 7]

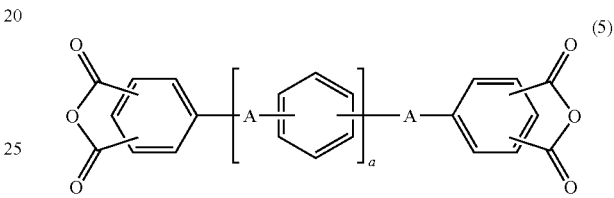

(5)

In the formula (5), "a" represents 0 or a natural number of 1 or greater; A represents any of a single bond (biphenyl structure), an oxygen atom (ether bond) and an ester bond, while all of A's may be identical with or different from each other; and the acid anhydride skeleton (—CO—O—CO—) is bonded to the 2-position and 3-position or the 3-position and 4-position of the aromatic ring as viewed from the bonding site of the adjacent aromatic ring.

In the formula (5), examples of the acid dianhydride in which A represents a single bond (biphenyl structure) or an oxygen atom (ether bond) include 3,3',4,4'-biphenyltetracarboxylic acid dianhydride, 2,3,3',4'-biphenyltetracarboxylic acid dianhydride, 2,3,2',3'-biphenyltetracarboxylic acid dianhydride, and bis(3,4-dicarboxyphenyl)ether dianhydride. These are preferred from the viewpoint of lowering the coefficient of hygroscopic expansion and from the viewpoint of broadening the choice of the diamine.

In the formula (5) described above, a phenyl ester-based acid dianhydride in which A is an ester bond is particularly preferred from the viewpoint of making the polyimide resin less hygroscopic. For example, acid dianhydride represented by the following formula may be mentioned. Specific examples include p-phenylenebistrimellitic acid monoester acid dianhydride, and p-biphenylenebistrimellitic acid monoester acid dianhydride. These are particularly preferred from the viewpoint of lowering the coefficient of hygroscopic expansion and from the viewpoint of broadening the choice of the diamine.

[Chemical Formula 8]

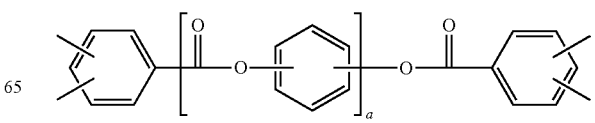

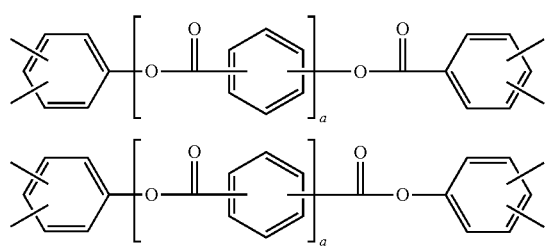

In the above Formula, "a" represents 0 or a natural number of 1 or greater; and the acid anhydride skeleton (—CO—O—CO—) is bonded to the 2-position and 3-position or the 3-position and 4-position of the aromatic ring as viewed from the bonding site of the adjacent aromatic ring.

In the case of the above-described tetracarboxylic acid dianhydride having a low coefficient of hygroscopic expansion, the diamine that will be described below can be selected from a wide range.

As the tetracarboxylic acid dianhydride that is used in combination, a tetracarboxylic acid dianhydride represented by the following formula and having at least one fluorine atom can be used. When a tetracarboxylic acid dianhydride containing fluorine is used, the coefficient of hygroscopic expansion of the polyimide resin that is finally obtained is decreased. Among others, the tetracarboxylic acid dianhydride having at least one fluorine atom preferably has a fluoro group, a trifluoromethyl group, or a trifluoromethoxy group. A specific example may be 2,2-bis(3,4-dicarboxyphenyl)-1,1,1,3,3,3-hexafluoropropane dianhydride. However, when the polyimide precursor contained as the polyimide component has a skeleton containing fluorine, the polyimide precursor tends to be not easily dissoluble in a basic aqueous solution. Thus, when patterning is carried out using a resist or the like while the polyimide component is in the form of polyimide precursor, it may be necessary to perform development using a mixed solution of an organic solvent such as alcohol and a basic aqueous solution.

[Chemical Formula 9]

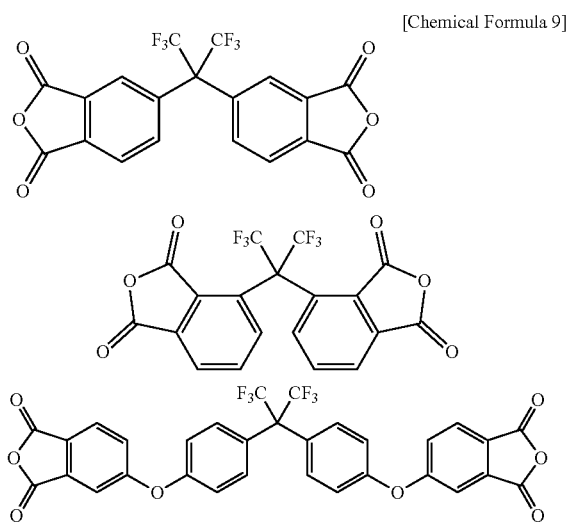

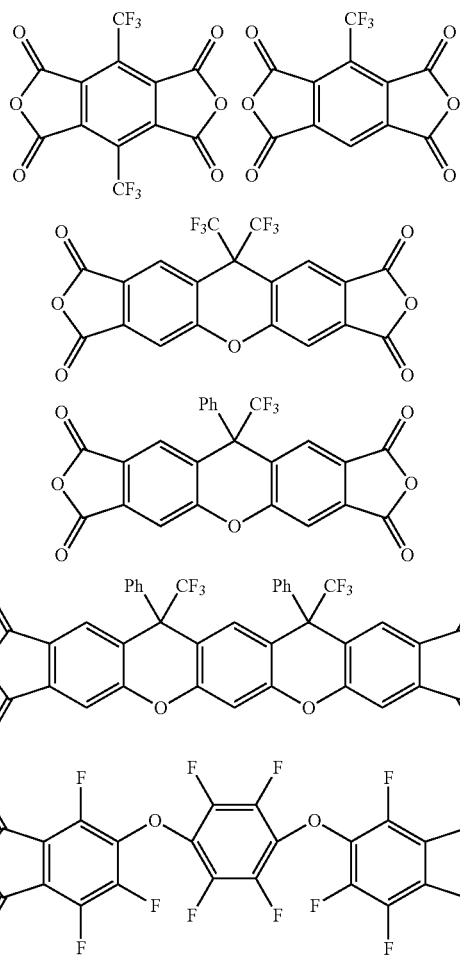

Here, the selected diamine is preferably an aromatic diamine from the viewpoint of heat resistance, that is, reduced outgas production; however, a diamine other than an aromatic diamine, such as an aliphatic diamine or a siloxane-based diamine, may also be used to the extent that does not exceed 60 mol %, and preferably 40 mol %, of the total amount of the diamines, according to the intended properties.

Furthermore, in regard to the polyimide component, it is preferable that the 33 mol % or more of $R^2$s in the formulas (1) to (3) have any of structures represented by the following formulas.

[Chemical Formula 10]

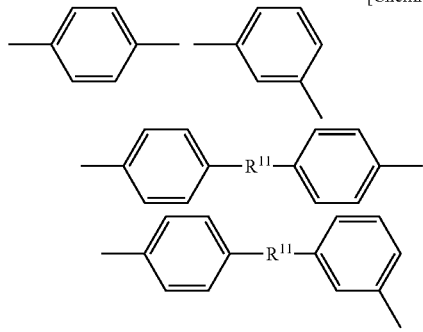

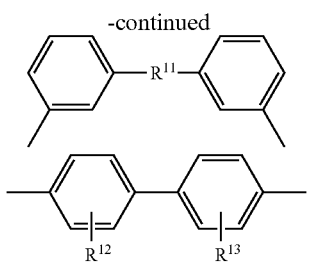

Here, $R^{11}$ represents a divalent organic group, an oxygen atom, a sulfur atom, or a sulfone group; and $R^{12}$ and $R^{13}$ each represent a monovalent organic group or a halogen atom.

When the polyimide component contains any of the structures of the above-described formulas, the polyimide component exhibits low linear thermal expansion and low hygroscopic expansion due to these rigid skeletons. Also, it is also advantageous that the polyimide component is easily commercially available, and the production cost is low.

When the polyimide component has a structure such as described above, the polyimide resin has enhanced heat resistance and a decreased coefficient of linear thermal expansion. Accordingly, it is more preferable that the content of the structure be closer to 100 mol % of $R^2$s in the formulas (1) to (3), but it is desirable that the content be at least 33% or more of $R^2$s in the formulas (1) to (3). Inter alia, the content of the structure represented by the formulas described above is preferably 50 mol % or more, and more preferably 70 mol % or more, of $R^2$s in the formula (1).

From the viewpoint of making the polyimide resin capable of less hygroscopic expansion, it is preferable that the structure of the diamine be represented by any of the following formulas (6-1) to (6-3) and formula (7).

[Chemical Formula 11]

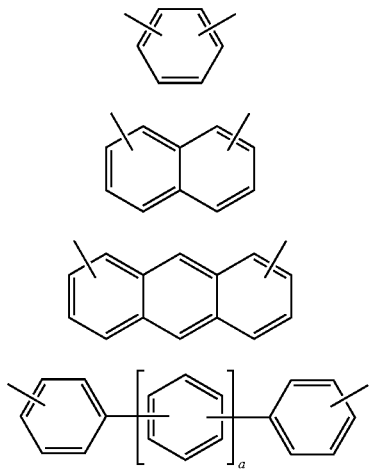

In the formulas (6-2) to (6-3), two amino groups may be bonded to the same aromatic ring.

In the formula (7), "a" represents 0 or a natural number of 1 or greater; the amino group is bonded to the meta-position or the para-position relative to the bond between benzene rings; and a portion or all of the hydrogen atoms on the aromatic ring may be substituted with a fluoro group, a methyl group, a methoxy group, a trifluoromethyl group, or a trifluoromethoxy group.

Specific examples of the diamines represented by the formulas (6-1) to (6-3) include p-phenylenediamine, m-phenylenediamine, 1,4-diaminonaphthalene, 1,5-diaminonaphthalene, 2,6-diaminonaphthalene, 2,7-diaminonaphthalene, and 1,4-diaminoanthracene.

Specific examples of the diamine represented by the formula (7) include 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, and 3,3'-dimethyl-4,4'-diaminobiphenyl.

furthermore, when fluorine is introduced as a substituent into the aromatic ring, the coefficient of hygroscopic expansion of the polyimide resin can be lowered. Examples of a structure to which fluorine is introduced among the diamines represented by the formula (7) include those structures represented by the following formulas. However, a polyimide precursor, particularly polyamic acid, containing fluorine does not easily dissolve in a basic aqueous solution, and when a photosensitive polyimide insulating layer producing less outgas is partially formed on the substrate, it may be necessary to carry out development with a mixed solution with an organic solvent such as alcohol at the time of processing the insulating layer.

[Chemical Formula 12]

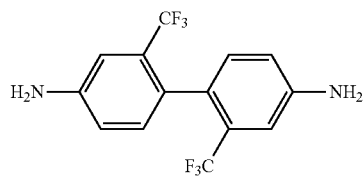

When the polyimide resin composition used in the present invention is imparted with photosensitivity and used as a photosensitive polyimide resin composition, in order to obtain a pattern shape which accurately reproduces the mask pattern by increasing sensitivity, it is preferable that the polyimide resin composition exhibit a transmittance of at least 5% or greater, and more preferably a transmittance of 15% or greater, to the exposure wavelength when produced into a film having a thickness of 1 μm.

Furthermore, when the polyimide composition is exposed using a high pressure mercury lamp, which is a general exposure light source, when the polyimide component is formed into a film having a thickness of 1 μm, the transmittance to an electromagnetic wave having a single wavelength at least among electromagnetic waves having wavelengths of 436 nm, 405 nm and 365 nm is preferably 5% or greater, more preferably 15% or greater, and even more preferably 50% or greater.

When it is said that the transmittance of the polyimide component to the exposure wavelength is high, it implies that the loss of light is that much small. Thus, a photosensitive polyimide resin composition having high sensitivity can be obtained.

In order for the polyimide component to have a transmittance, it is preferable to use acid dianhydride containing fluorine or acid dianhydride having an alicyclic skeleton as the acid dianhydride. However, when acid dianhydride having an alicyclic skeleton is used, there is a risk that heat resistance may decrease, and the ability to produce less outgas may be impaired. Thus, the acid dianhydride may be used in combination while caution is taken on the copolymerization proportion.

According to the present invention, it is more preferable to use aromatic acid dianhydride containing fluorine as the acid dianhydride in order to give a transmittance, from the viewpoint that hygroscopic expansion can be reduced while heat resistance is maintained (since it is aromatic).

As the tetracarboxylic acid dianhydride having at least one fluorine atom used in the present invention, those tetracarboxylic acid dianhydrides having fluorine atoms described above can be used, and among them, those tetracarboxylic acid dianhydrides having a fluoro group, a trifluoromethyl group or a trifluoromethoxy group are preferred. Specific examples include 2,2-bis(3,4-dicarboxyphenyl)-1,1,1,3,3,3-hexafluoropropane dianhydride.

However, a polyimide precursor having a skeleton containing fluorine tends to be not easily dissoluble in a basic aqueous solution. Thus, when patterning is carried out using a resist or the like while the polyimide component is in the form of a polyimide precursor, it may be necessary to perform development using a mixed solution of an organic solvent such as alcohol and a basic aqueous solution.

Furthermore, when rigid acid dianhydride such as pyromellitic anhydride, 3,3',4,4'-biphenyltetracarboxylic acid dianhydride, or 1,4,5,8-naphthalenetetracarboxylic acid dianhydride is used, the coefficient of linear thermal expansion of the polyimide resin that is finally obtained is small. However, the acid dianhydride tends to inhibit an enhancement of transparency, the acid dianhydride may be used in combination while caution is taken on the copolymerization proportion.

In order for the polyimide component to have a transmittance, it is preferable to use diamine containing fluorine or diamine having an alicyclic skeleton as the diamine. However, when diamine having an alicyclic skeleton is used, there is a risk that heat resistance may decrease, and the low outgas producibility may be impaired. Thus, the acid dianhydride may be used in combination while caution is taken on the copolymerization proportion.

it is more preferable to use aromatic diamine containing fluorine as the diamine in order to give a transmittance, from the viewpoint that hygroscopic expansion can be reduced while heat resistance is maintained (since it is aromatic).

As the aromatic diamine containing fluorine, specifically, those diamines having the above-described structures containing fluorine may be used, and specific examples include 2,2'-ditrifluoromethyl-4,4'-diaminobiphenyl, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,2-bis[3-(3-aminophenoxy)phenyl]-1,1,1,3,3,3-hexafluoropropane, and 2,2-bis[4-(4-aminophenoxy)phenyl]-1,1,1,3,3,3-hexafluoropropane.

However, a polyimide precursor, particularly polyamic acid, containing fluorine does not easily dissolve in a basic aqueous solution, and when a photosensitive polyimide insulating layer producing less outgas is partially formed on the substrate, it may be necessary to develop using a mixed solution with an organic solvent such as alcohol at the time of processing of the insulating layer.

Furthermore, the moieties having a cyclic structure after imidization contained in the formula (1) and formula (3) tend to have lower transmittances than the carboxylic acid moieties before imidization contained in the formula (2) and formula (3), and therefore, it is desirable to use a polyimide precursor which contains a large amount of structure before imidization and is highly soluble. A polyimide precursor having acid anhydride-derived carboxyl groups (or esters thereof) at a proportion of 50% or more of the total amount of carboxyl groups is preferred, and a polyimide precursor having such carboxyl groups at a proportion of 75% or more of the total amount of carboxyl groups is more preferred. It is preferable that the polyimide precursor be entirely polyamic acid represented by the formula (2) (and derivatives thereof).

Furthermore, when development is carried out using an alkali developer solution, the solubility in the alkali developer solution can be changed by the residual amount of the carboxylic acid moieties before imidization contained in the formulas (2) and (3). From the viewpoint of increasing the rate of development, it is preferable to use a highly soluble polyimide precursor which contains a large amount of structures before imidization, and it is preferable that the polyimide precursor be polyamic acid in which $R^3$s in the formulas (2) and (3) are all hydrogen atoms. However, if the rate of development is so fast that the solubility of the residual pattern area is too high, the dissolution rate can be decreased by using a polyimide precursor that has begun with imidization, or by introducing a monovalent organic group to $R^3$s in the formulas (2) and (3).

On the other hand, when diamine having a siloxane skeleton such as 1,3-bis(3-aminopropyl)tetramethyldisiloxane is used as the diamine, the adhesiveness to the substrate can be improved, or the elastic modulus of the polyimide resin decreases so that the glass transition temperature can be decreased.

The weight average molecular weight of the polyimide component used in the present invention is, depending on the use, preferably in the range of 3,000 to 1,000,000, more preferably in the range of 5,000 to 500,000, and even more preferably in the range of from 10,000 to 500,000. If the weight average molecular weight is less than 3,000, it is difficult to obtain sufficient strength when the polyimide component is produced into a coating or a film. Also, when the polyimide component is made to have a high molecular weight, such as in a polyimide resin, through a heating treatment, the strength of the film is decreased. On the other hand, the weight average molecular weight exceeds 1,000,000, the viscosity increases, and solubility also decreases. Therefore, it is difficult to obtain a coating or film having smooth surface and a uniform film thickness.

The molecular weight as used herein may be a value obtained by gel permeation chromatography (GPC) relative to polystyrene standards, or may be the molecular weight of the polyimide precursor itself, or may be the molecular weight after performing a chemical imidization treatment with acetic anhydride.

The content of the polyimide component used in the present invention is preferably 50% by weight or more relative to the total solids content of the polyimide resin, from the viewpoints of the film properties of the resulting pattern, particularly the film strength and heat resistance, and among others, the content of the polyimide component is preferably 70% by weight or more.

Meanwhile, the solid content of the polyimide resin composition means all the components other than the solvent, and liquid monomer components are also included in the solid content.

(b) Solvent

As the solvent that dissolves, disperses or dilutes the polyimide precursor or the polyimide, various general-purpose solvents can be used. Furthermore, when the polyimide resin composition contains polyimide precursor, the solution obtained by the synthesis reaction of polyamic acid is used as received, and other components may incorporated thereinto as necessary.

Examples of the general-purpose solvent that can be used include: ethers such as diethyl ether, tetrahydrofuran, dioxane, ethylene glycol dimethyl ether, ethylene glycol diethyl ether, propylene glycol dimethyl ether, and propylene glycol diethyl ether; glycol monoethers (so-called cellosolves) such as ethylene glycol monomethyl ether, ethylene glycol monoethyl ether, propylene glycol monomethyl ether, propylene glycol monoethyl ether, diethylene glycol monomethyl ether, and diethylene glycol monoethyl ether; ketones such as methyl ethyl ketone, acetone, methyl isobutyl ketone, cyclopentanone, and cyclohexanone; esters such as ethyl acetate, butyl acetate, n-propyl acetate, i-propyl acetate, n-butyl acetate, i-butyl acetate, acetic acid esters of the glycol monoethers described above (for example, methyl cellosolve acetate and ethyl cellosolve acetate), methoxypropyl acetate, ethoxypropyl acetate, dimethyl oxalate, methyl lactate, and ethyl lactate; alcohols such as ethanol, propanol, butanol, hexanol, cyclohexanol, ethylene glycol, diethylene glycol, and glycerin; halogenated hydrocarbons such as methylene chloride, 1,1-dichloroethane, 1,2-dichloroethylene, 1-chloropropane, 1-chlorobutane, 1-chloropentane, chlorobenzene, bromobenzene, o-dichlorobenzene and m-dichlorobenzene; amides such as N,N-dimethylformamide, N,N-diethylformamide, N,N-dimethylacetamide, and N,N-diethylacetamide; pyrrolidones such as N-methylpyrrolidone; lactones such as γ-butyrolactone; sulfoxides such as dimethyl sulfoxide; and other organic polar solvents. Further examples include aromatic hydrocarbons such as benzene, toluene and xylene; and other organic non-polar solvents. These solvents are used singly or in combination.

Among them, polar solvents such as N-methyl-2-pyrrolidone, N,N-dimethylformamide, N,N-dimethylacetamide, N,N-diethylformamide, N,N-diethylacetamide, N,N-dimethylmethoxyacetamide, dimethyl sulfoxide, hexamethyl phosphamide, N-acetyl-2-pyrrolidone, pyridine, dimethylsulfone, tetramethylenesulfone, dimethyltetramethylenesulfone, diethylene glycol dimethyl ether, cyclopentanone, γ-butyrolactone, and α-acetyl-γ-butyrolactone may be suitably used.

Furthermore, as will be described below, in the case of performing a degassing step before the insulating layer forming step where the polyimide resin composition is degassed in a vacuum, the vapor pressure of the solvent at normal temperature is preferably 25,000 Pa or less, and among others, the vapor pressure is preferably in the range of 10,000 Pa to 1 Pa, and particularly preferably in the range of 1,000 Pa to 10 Pa. It is because if the vapor pressure of the solvent is high, there is a risk that the solvent may evaporate at the time of degassing, and the concentration or viscosity of the polyimide resin composition may change. Also, it is because if the vapor pressure of the solvent is too low, it is difficult to remove the solvent at the time of drying the polyimide resin composition.

(c) Other Components

It is desirable that the polyimide resin composition used in the present invention contains at least a polyimide precursor or polyimide, and a solvent.

The polyimide resin composition may be a photosensitive polyimide resin composition. Meanwhile, in regard to the photosensitive polyimide resin composition, the same photosensitive polyimide and photosensitive polyimide precursor as described above in the Section "A. Substrate for a flexible device, 2. Planarizing layer" may be used.

It is preferable that the polyimide resin composition be developable by a basic aqueous solution.

The polyimide resin composition may contain, if necessary, additives such as a leveling agent, a plasticizer, a surfactant and a defoamant.

(2) Method for Forming Insulating Layer

According to the present invention, a polyimide resin composition is applied on a metal base material to form an insulating layer.

The method for applying a polyimide resin composition on a metal base material is the same as described above in the Section "A. Substrate for a flexible device, 2. Planarizing layer."

After the application of the polyimide resin composition, the solvent is removed by a heat treatment. At this time, when the polyimide resin composition contains a polyimide precursor, imidization of the polyimide precursor is also carried out by a heat treatment.

When the polyimide precursor is imidized, a preferred temperature range of the heat treatment is usually about 200° C. to 400° C. If the heat treatment temperature is lower than 200° C., the imidization process does not completely proceed, and unsatisfactory properties are obtained. On the other hand, if the heat treatment temperature is a high temperature, the properties of the final cured film tends to improve, but if the temperature rises to a temperature higher than 400° C., there is a risk that adverse effects may be exerted on other constituent members. Therefore, it is preferable to determine the imidization temperature after taking the heat resistance of the other constituent members into consideration. Furthermore, preliminary heating may also be carried out, before the heat treatment, at a temperature lower than the heat treatment temperature, such as 50° C. to 200° C. As the heat treatment, specifically, heating can be carried out at 250° C. to 350° C. for 10 minutes to 120 minutes.

This heat treatment may be carried out by any known method, and specific examples include heating in a circulating oven or on a hot plate in an atmosphere of air or nitrogen.

Furthermore, when the insulating layer is partially formed on the metal base material, the method for forming the insulating layer is the same as described above in the Section "A. Substrate for a flexible device, 2. Planarizing layer."

The surface roughness Ra of the insulating layer is the same as described in the Section "F. Substrate for a thin film element, 1. Insulating layer," and therefore, further description will not be repeated here.

Furthermore, other factors of the insulating layer are the same as those of the planarizing layer as described above in the Section "A. Substrate for a flexible device, 2. Planarizing layer," and therefore, further description will not be repeated here.

3. Contact Adhesive Layer Forming Step

The contact layer forming step according to the present invention is a step of forming a contact adhesive layer containing an inorganic compound on the insulating layer. The contact adhesive layer is a layer provided to obtain sufficient adhesive power between the insulating layer and the thin film element unit.

Meanwhile, the contact adhesive layer is the same as that described above in the Section "A. Substrate for a flexible device, 1. Contact adhesive layer," and therefore, further description will not be repeated here.

4. Degassing Step

According to the present invention, it is preferable to carry out a degassing step of degassing the polyimide resin composition, before the insulating layer forming step, so that the relative dissolved oxygen saturation calculated by a predetermined method is adjusted to 95% or less.

Meanwhile, the degassing step is the same as will be described below in the section of the second embodiment, and therefore, further description will not be given here.

(II) Second Embodiment

The second embodiment of the method for manufacturing a substrate for a thin film element of the present invention comprises steps of: a degassing step of degassing a polyimide resin composition so that the relative dissolved oxygen saturation calculated by a method described below is adjusted to 95% or less; and an insulating layer forming step of applying the polyimide resin composition on the metal base material and thereby forming an insulating layer, and is characterized in that the surface roughness Ra of the insulating layer is 30 nm or less.

<Method for Calculating Relative Dissolved Oxygen Saturation>

First, using a dissolved oxygen-saturated solvent prepared by bubbling air for 30 minutes or more into the solvent included in the polyimide resin composition, calibration of a dissolved oxygen meter is performed such that the measured value of the dissolved oxygen content of the above-mentioned solvent which contains no dissolved oxygen is designated as 0, and the measured value of the dissolved oxygen content of the dissolved oxygen-saturated solvent is designated as 100. Subsequently, the relative value of the dissolved oxygen content of a reference polyimide resin composition prepared by leaving the polyimide resin composition to stand for one hour or longer in air, and the relative value of the dissolved oxygen content of a degassed polyimide resin composition prepared by degassing the polyimide resin composition are measured with the calibrated dissolved oxygen meter. Then, the relative value of the dissolved oxygen content of the degassed polyimide resin composition determined when the relative value of the dissolved oxygen content of the reference polyimide resin composition is designated as 100%, is designated as the relative dissolved oxygen saturation.

Here, foam in a liquid is in a state where a gas is mixed in a liquid while being in a gaseous form. This foam is not only incorporated from the outside, but is also very frequently generated from the liquid. On the other hand, a dissolved gas means a gas that is dissolved in a liquid, and this dissolved gas is not visible to the eye as in the case of the foam. The present invention is to remove this "dissolved gas" in a liquid.

The amount of a gas dissolved in a liquid varies with the type of the liquid, temperature or pressure, and the material to be wetted, and the dissolved gas in excess of the saturation amount is converted to foam and emerges. That is, even a liquid in a state without any foam may generate foam when the temperature or pressure changes. On the other hand, even if foam is present in the liquid, when the liquid is at a predetermined temperature or pressure, or when the amount of gas dissolved therein is lower than the saturation value, the foam does not remain dissolved in the liquid. That is, simply removing the foam is not sufficient, and it is important to remove any dissolved gas.

Therefore, in a state where a polyimide resin composition has been in contact with the atmosphere for a sufficient time, and air has been steadily dissolved in the polyimide resin composition, it is predicted that any dissolved gas in excess of the saturation amount is converted to foam with a slight change in the pressure or temperature. However, when the amount of dissolved gas in a polyimide resin composition that is in a state where air has been steadily dissolved thereinto is designated as 100%, if the amount of dissolved gas in a polyimide resin composition is about 95%, the amount of the dissolved gas does not immediately exceed the saturation amount with a change in the pressure or temperature. Accordingly, the generation of foam can be suppressed.

In regard to the dissolved gas, in a situation where a polyimide resin composition is in contact with the atmosphere, most of the gas dissolved in the polyimide resin composition is nitrogen or oxygen (because even the abundance in the atmosphere of argon, which is most abundant next to oxygen, is 1/20 or less of the abundance of oxygen). Since nitrogen is an inert gas, measurement thereof is difficult, but oxygen is measurable. Also, in connection with many solvents, the ratio of the solubilities of oxygen and nitrogen in a solvent under the same temperature and the same pressure is 1.4 to 2.0 (oxygen is more likely to dissolve), and the partial pressure of nitrogen in the atmosphere is higher by about 3.7 times than the partial pressure of oxygen. Therefore, it can be speculated, from Henry's Law, that nitrogen is dissolved in an amount of 1.9 to 2.7 times the amount of oxygen, in a state where the solvent is in contact with the atmosphere. When the pressure is not so high, this ratio is constant if the type of the solvent is the same, and even if the type of the solvent is changed, the fluctuation range is about 1.9 to 2.7 times, which is not so large. Therefore, it is possible to estimate the amount of the dissolved gas as a mixture of nitrogen and oxygen, by determining the dissolved oxygen content.

In regard to the dissolved oxygen content, it is difficult to measure the absolute value in a solvent other than water. Thus, according to the present invention, the dissolved oxygen content is estimated as a relative value (relative dissolved oxygen saturation) based on the dissolved oxygen content of a dissolved oxygen-saturated solvent prepared by bubbling air for 30 minutes or more into the solvent that is included in the polyimide resin composition.

The method for manufacturing a substrate for a thin film element of the present invention will be explained while making reference to the attached drawings.

FIG. 16 is a schematic cross-sectional diagram showing an example of the substrate for a thin film element produced by the method for manufacturing a substrate for a thin film element of the present invention. According to the present invention, the polyimide resin composition is degassed so that the relative dissolved oxygen saturation calculated by a predetermined method is adjusted to 95% or less, and then the polyimide resin composition is applied on the metal base material and is imidized by a heat treatment. Thus, an insulating layer 53 is formed on the metal base material 52, as illustrated in FIG. 16. In this case, the insulating layer 53 is formed such that the surface roughness Ra is 30 nm or less. In this manner, a substrate for thin film 50 is obtained.

In the case of forming an insulating layer by applying the polyimide resin composition, there is a risk that when the polyimide resin composition is applied and dried, a skin layer may be produced on the surface of the coating film, and the skin layer may make it difficult for solvents or water to evaporate, or may make it difficult for any gas to be eliminated. Accordingly, if air bubbles are included in the polyimide resin composition, or a gas is dissolved in the polyimide resin composition, an insulating layer containing air bubbles is formed as a result.

In this regard, according to the present invention, since the polyimide resin composition is degassed before the insulating layer is formed, the air bubbles within the insulating layer can be reduced. Particularly, since the polyimide resin composition is degassed such that the relative dissolved oxygen saturation calculated by a predetermined method is adjusted to 95% or less, air bubbles having a size in the order of micrometers as well as air bubbles having a size in the order of nanometers in the insulating layer can be reduced. Thereby, it is possible to form an insulating layer having excellent surface smoothness with a surface roughness Ra of 30 nm or less. Furthermore, even if surface irregularities exist on the surface of the metal base material, the surface irregularities on the metal base material surface can be planarized by forming an insulating layer on the metal base material, and the surface smoothness of the substrate for a thin film element can be improved. Therefore, it is possible to obtain a thin film element having satisfactory characteristics by using the substrate for a thin film element produced by the present invention.

Figure 17:
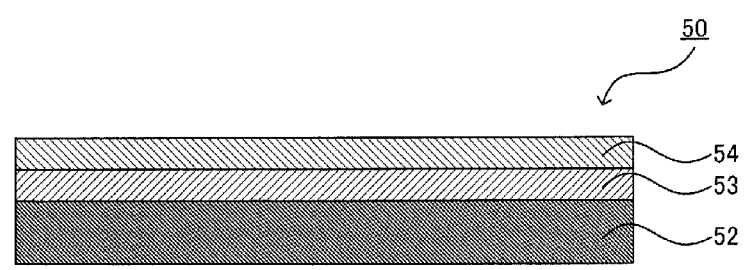
FIG. 17 is a schematic cross-sectional diagram showing another example of the substrate for a thin film element of the present invention.

FIG. 17 is a schematic cross-sectional diagram showing another example of the substrate for a thin film element produced by the method for manufacturing a substrate for a thin film element of the present invention. According to the present invention, it is preferable to form a contact adhesive layer 54 containing an inorganic compound on the insulating layer 53, as illustrated in FIG. 17.

According to the present invention, since the contact adhesive layer is formed by depositing an inorganic compound and has a small thickness, when the insulating layer has poor surface smoothness, the surface smoothness of the contact adhesive layer formed on the insulating layer is also poor. However, as described above, if the surface smoothness of the insulating layer is excellent, the surface smoothness of the contact adhesive layer formed on the insulating layer becomes satisfactory. Therefore, even in the case of forming a contact adhesive layer on an insulating layer, deterioration of the characteristics of the thin film element can be prevented.

Furthermore, according to the present invention, when a contact adhesive layer is formed on the insulating layer, the adhesiveness to the thin film element unit can be increased. Therefore, even if moisture or heat is applied during the production of the thin film element unit, and the dimension of the insulating layer is changed, the occurrence of detachment or cracks in the member constituting the thin film element, for example, an electrode or a semiconductor layer constituting a TFT, can be prevented.

According to the present invention, since the permeation of moisture or oxygen can be reduced by the metal base material, deterioration of the thin film element unit due to moisture or oxygen can be suppressed, the humidity inside the element can be maintained, and deterioration of the characteristics due to humidity change can be suppressed.

In addition, since metal base materials generally have excellent heat conductivity, heat dissipation properties can be imparted to the substrate for a thin film element. That is, the substrate for a thin film element has high moisture blocking properties, and can also rapidly conduct or dissipate heat. For example, in the case of using the substrate for a thin film element in an organic EL element, the adverse effects due to heat generation upon light emission of the organic EL element can be suppressed, and the luminescence characteristics can be maintained stably over a long time period. Also, uniform light emission without emission unevenness can be realized, and shortening of the service life or destruction of the element can be reduced.

Also, since the strength of the substrate for a thin film element can be increased by having a metal base material, durability can be enhanced.

The substrate for a thin film element produced by the present invention is used, for example, as shown in FIG. 13A to FIG. 15B described in the section for the first embodiment.

Hereinafter, the various steps of the method for manufacturing a substrate for a thin film element of the present invention will be explained.

1. Degassing Step

The degassing step according to the present invention is a step of degassing a polyimide resin composition so that the relative dissolved oxygen saturation calculated by a predetermined method is adjusted to be 95% or less.

Meanwhile, since the polyimide resin composition is the same as described above in the section for the first embodiment, further description will not be repeated here. Hereinafter, degassing of the polyimide resin composition will be explained.

The method for degassing a polyimide resin composition is not particularly limited as long as it is a method capable of adjusting the relative dissolved oxygen saturation calculated by a predetermined method to 95% or less, and examples include vacuum degassing, ultrasonic degassing, degassing using a porous membrane, and degassing using a non-porous membrane. Vacuum degassing is a method of subjecting the polyimide resin composition to a reduced pressure, and thereby decreasing the solubility of the dissolved gas. Ultrasonic degassing is a method of subjecting the polyimide resin composition to ultrasonic vibration, and thereby expelling dissolved gas by molecular vibration. Degassing using a porous membrane or a non-porous membrane is a method of removing dissolved gas in the polyimide resin composition by utilizing gas permeation through a membrane, and the gas concentration difference or pressure difference in the polyimide resin composition. These degassing methods may be used singly or may be used in combination. Among them, vacuum degassing, a combination of vacuum degassing and ultrasonic degassing, and in-line degassing using a porous membrane or a non-porous membrane are preferred.

The pressure used at the time of vacuum degassing is not particularly limited as long as the dissolved oxygen in the polyimide resin composition can be removed, and it is preferable to appropriately set the pressure in accordance with the vapor pressure of the solvent used in the polyimide resin composition. Among others, it is preferable that the pressure at the time of vacuum degassing be 1.1 times or more of the vapor pressure of the solvent used in the polyimide composition. Specifically, the pressure at the time of vacuum degassing is preferably in the range of 50,000 Pa to 1 Pa, and among others, the pressure is preferably in the range of 10,000 Pa to 1 Pa, and particularly preferably in the range of 1,000 Pa to 1 Pa. It is because if the pressure is high, it is difficult to obtain the effect of degassing, and if the pressure is low, the solvent volatilizes, the concentration or viscosity of the polyimide resin composition changes, and adverse effects are exerted on the formation of the insulating layer.

Furthermore, the duration at the time of vacuum degassing is not particularly limited as long as the dissolved oxygen in the polyimide resin composition can be removed, and for example, the time may be set to about 1 minute to 60 minutes.

The frequency of the ultrasonic wave at the time of ultrasonic degassing is not particularly limited as long as the dissolved oxygen in the polyimide resin composition can be removed, but the frequency is preferably about 15 kHz to 400 kHz.

The temperature at the time of ultrasonic degassing is not particularly limited as long as the dissolved oxygen in the polyimide resin composition can be removed, but the temperature is preferably in the range of 0° C. to 100° C., and among others, the temperature is preferably in the range of 0° C. to 80° C., and particularly preferably in the range of 0° C. to 50° C. It is because if the temperature is low, when the viscosity of the polyimide resin composition is high, the degassing efficiency is lowered, and if the temperature is high, there is a risk that the characteristics such as storage stability of the polyimide resin composition may change.

Also, the duration at the time of ultrasonic degassing is not particularly limited as long as the dissolved oxygen in the polyimide resin composition can be removed, and for example, the time may be set to about 1 minute to 60 minutes.

In the degassing using a porous membrane or a non-porous membrane, for example, a degassing apparatus manufactured by ERC, Inc. can be used.

According to the present invention, it is preferable to carry out the degassing step immediately before the insulating layer forming step that will be described below. Here, as the reason why air bubbles are included in the insulating layer, it can be speculated that the air bubbles included in the polyimide resin composition such as described above, the gas dissolved in the polyimide resin composition, and the water included in the polyimide resin composition are involved. When a polyimide resin composition obtained after degassing is left to stand for an arbitrary time, there is a risk that air bubbles may be generated in the polyimide resin composition, a gas may be dissolved in the polyimide resin composition, or the polyimide resin composition may absorb moisture. Therefore, in order to effectively reduce air bubbles that are included in the insulating layer, it is preferable to carry out the degassing step immediately before the insulating layer forming step.

Meanwhile, the term "immediately before" means that the time taken from the point of degassing the polyimide resin composition to the point of applying the polyimide resin composition is 60 minutes or less. This time is preferably 20 minutes or less, and more preferably 10 minutes or less.

In this step, the polyimide resin composition is degassed so that the relative dissolved oxygen saturation calculated by a method such as described below is adjusted to 95% or less.

<Method for Calculating Relative Dissolved Oxygen Saturation>

First, using a dissolved oxygen-saturated solvent prepared by bubbling air for 30 minutes or more into the solvent included in the polyimide resin composition, calibration of a dissolved oxygen meter is performed such that the measured value of the dissolved oxygen content of the above-mentioned solvent which contains no dissolved oxygen is designated as 0, and the measured value of the dissolved oxygen content of the dissolved oxygen-saturated solvent is designated as 100. Subsequently, the relative value of the dissolved oxygen content of a reference polyimide resin composition prepared by leaving the polyimide resin composition to stand for one hour or longer in air, and the relative value of the dissolved oxygen content of a degassed polyimide resin composition prepared by degassing the polyimide resin composition are measured with the calibrated dissolved oxygen meter. Then, the relative value of the dissolved oxygen content of the degassed polyimide resin composition determined when the relative value of the dissolved oxygen content of the reference polyimide resin composition is designated as 100%, is designated as the relative dissolved oxygen saturation.

As the dissolved oxygen meter used in the measurement of the dissolved oxygen content described above, for example, an oxygen sensor such as "B-506" (manufactured by Iijima Electronics Corp.) can be used.

The relative dissolved oxygen saturation is 95% or less, preferably 90% or less, and more preferably 85% or less.

2. Insulating Layer Forming Step

The insulating layer forming step according to the present invention is a step of applying the polyimide resin composition described above on a metal base material and thereby forming an insulating layer.

Meanwhile, since the insulating layer forming step is the same as described above in the section for the first embodiment, further description will not be repeated here.

Also, since the metal base material is the same as described above in the Section "F. Substrate for a thin film element, 2. Metal base material," further description will not be repeated here.

3. Metal Base Material Surface Treatment Step

According to the present invention, it is preferable to have a metal base material surface treatment step of subjecting the metal base material to a chemical treatment before the insulating layer forming step.

Meanwhile, since the metal base material surface treatment step is the same as described above in the section for the first embodiment, further description will not be repeated here.

4. Contact Adhesive Layer Forming Step

According to the present invention, it is acceptable to have a contact adhesive layer forming step of forming a contact adhesive layer containing an inorganic compound, on the insulating layer, after the insulating layer forming step.

Meanwhile, since the contact adhesive layer forming step is the same as described above in the section for the first embodiment, further description will not be repeated here.

J. Method for Manufacturing Thin Film Element

Next, the method for forming a thin film element of the present invention will be explained.

The method for manufacturing a thin film element of the present invention comprises a thin film element unit forming step of forming a thin film element unit on the substrate for thin film element produced by the method for manufacturing a substrate for a thin film element described above.

According to the present invention, since a thin film element unit is formed on a substrate for a thin film element having excellent surface smoothness, a thin film element having excellent characteristics can be obtained.

Furthermore, since the substrate for a thin film element has gas barrier properties against oxygen or water vapor, deterioration of the element performance due to moisture or oxygen can be suppressed, the humidity inside the element can be maintained constant, and deterioration of the characteristics due to humidity change can be suppressed. Furthermore, since the substrate for a thin film element has not only gas barrier properties but also heat dissipation properties, for example, when an organic EL element is produced as the thin film element unit, the luminescence characteristics can be maintained stably over a long time period, and uniform light emission without emission unevenness can be realized. Also, shortening of the service life or destruction of the element can be reduced.

Also, when a contact adhesive layer is formed on the insulating layer in the substrate for a thin film element, a thin film element unit can be formed with good adhesion on the substrate for a thin film element, so that even if moisture or heat is applied during the production of the thin film and the dimension of the insulating layer containing polyimide changes, the occurrence of detachment or cracks in the member constituting the thin film element unit can be prevented.

Meanwhile, since the thin film element unit has been described above in the Section "G. Thin film element," further description will not be repeated here.

K. Method for Manufacturing TFT

Next, the method for manufacturing a TFT of the present invention will be explained.

The method for manufacturing a TFT of the present invention comprises a TFT forming step of forming a TFT on a substrate for a thin film element produced by the method for manufacturing a substrate for a thin film element described above.

FIG. 13A to FIG. 15B are schematic cross-sectional diagrams showing examples of TFTs produced by the method for manufacturing a TFT of the present invention. The TFT 60 illustrated in FIG. 13A includes a TFT having a top gate/bottom contact structure, and the TFT 60 illustrated in FIG. 13B includes a TFT having a top gate/top contact structure. The TFT 60 illustrated in FIG. 14A includes a TFT having a bottom gate/bottom contact structure, and the TFT illustrated in FIG. 14B includes a TFT having a bottom gate/top contact structure. The TFT 60 illustrated in FIG. 15A and FIG. 15B include a TFT having a coplanar type structure. Meanwhile, since the various configurations of the TFTs shown in FIG. 13A to FIG. 15B have been described above in the Section "A. Method for manufacturing substrate for a thin film element," further description will not be repeated here.

According to the present invention, since a TFT is formed on a substrate for a thin film element having excellent surface smoothness, a TFT having satisfactory electrical performance can be obtained.

Furthermore, since the substrate for a thin film element have gas barrier properties against oxygen or water vapor, when an organic EL display apparatus is produced using a TFT, deterioration of the element performance due to moisture or oxygen can be suppressed. Also, when an electronic paper is produced using a TFT, the humidity inside the element can be maintained constant, and deterioration of the display characteristics due to humidity change can be suppressed. Since the substrate for a thin film element has not only gas barrier properties but also heat dissipation properties, when an organic EL display apparatus is produced using a TFT, luminescence characteristics can be maintained stably over a long time period, and uniform light emission without emission unevenness can be realized. Also, shortening of the service life or destruction of the element can be reduced.

Furthermore, when a contact adhesive layer is formed on the insulating layer in a substrate for a thin film element, a TFT can be formed with good adhesion on the substrate for a thin film element, so that even if moisture or heat is applied during the production of the thin film and the dimension of the insulating layer containing polyimide changes, the occurrence of detachment or cracks in an electrode or the semiconductor layer can be prevented.

Meanwhile, since the TFT is the same as described above in the Section "B. TFT substrate for a flexible device," further description will not be repeated here. Also, since the use of the TFT is the same as described above in the Section "H. TFT," further description will not be repeated here.

The present invention is not intended to be limited to the embodiment described above. The above embodiment is only for illustrative purpose, and any embodiment having a substantially identical constitution and offering an identical operating effect with the technical idea described in the claims of the present invention, is construed to be included in the technical scope of the present invention.

EXAMPLES

Hereinafter, the present invention will be specifically described by way of Examples and Comparative Examples.

Production Example

1. Preparation of Polyimide Precursor Solution

Production Example 1

4.0 g (20 mmol) of 4,4'-diaminodiphenyl ether (ODA) and 8.65 g (80 mmol) of para-phenylenediamine (PPD) were introduced into a 500-ml separable flask, and were dissolved in 200 g of dehydrated N-methyl-2-pyrrolidone (NMP). Under a nitrogen gas stream, the solution was heated in an oil bath while stirred, while the liquid temperature was monitored with a thermocouple to be maintained at 50° C. After it was confirmed that the components were completely dissolved, 29.1 g (99 mmol) of 3,3',4,4'-biphenyltetracarboxylic acid dianhydride (BPDA) was added thereto in small amounts over 30 minutes. After completion of the addition, the mixture was stirred for 5 hours at 50° C. Thereafter, the reaction mixture was cooled to room temperature, and thus a polyimide precursor solution 1 was obtained.

Production Example 2

Polyimide precursor solutions 2 to 15 and a polyimide precursor solution Z (Comparative Example) were synthesized at the mixing ratios indicated in the following Table 1, in the same manner as in Production Example 1, except that the amount of NMP was adjusted so that the reaction temperature and the solution concentration would be 17% by weight to 19% by weight.

As the acid dianhydride, 3,3',4,4'-biphenyltetracarboxylic acid dianhydride (BPDA), pyromellitic dianhydride (PMDA), p-phenylenebistrimellitic acid monoester acid dianhydride (TAHQ), and p-biphenylbistrimellitic acid monoester acid dianhydride (BPTME) were used. As the diamine, one kind or two or more kinds of 4,4'-diaminodiphenyl ether (ODA), para-phenylenediamine (PPD), 1,4-bis(4-aminophenoxy)benzene (4APB), 2,2'-dimethyl-4,4'-diaminobiphenyl (TBHG), and 2,2'-bis(trifluoromethyl)-4,4'-diaminobiphenyl (TFMB) were used.

TABLE 1

| Polyimide precursor solution | Acid dianhydride | | Diamine | | Diamine | | Reaction temperature (° C.) |
|---|---|---|---|---|---|---|---|
| | Type | Amount of addition (mmol) | Type | Amount of addition (mmol) | Type | Amount of addition (mmol) | |
| 1 | BPDA | 99 | PPD | 80 | ODA | 20 | 50 |
| 2 | BPDA | 99 | PPD | 100 | — | — | 50 |
| 3 | BPDA | 99 | PPD | 80 | 4APB | 20 | 50 |

TABLE 1-continued

| Polyimide precursor solution | Acid dianhydride Type | Amount of addition (mmol) | Diamine Type | Amount of addition (mmol) | Diamine Type | Amount of addition (mmol) | Reaction temperature (° C.) |
|---|---|---|---|---|---|---|---|
| 4 | BPDA | 99 | — | — | TBHG | 100 | 50 |
| 5 | BPDA | 99 | ODA | 80 | TBHG | 20 | 50 |
| 6 | BPDA | 99 | ODA | 75 | TBHG | 25 | 50 |
| 7 | BPDA | 99 | — | — | TFMB | 100 | 50 |
| 8 | BPDA | 99 | PPD | 80 | TFMB | 20 | 50 |
| 9 | BPDA | 99 | PPD | 70 | TFMB | 30 | 50 |
| 10 | PMDA | 99 | — | — | TBHG | 100 | 0 |
| 11 | PMDA | 99 | — | — | ODA | 100 | 0 |
| 12 | PMDA | 99 | PPD | 50 | ODA | 50 | 0 |
| 13 | BPTME | 99 | — | — | ODA | 100 | 50 |
| 14 | TAHQ | 99 | — | — | ODA | 100 | 50 |
| 15 | TAHQ | 99 | PPD | 75 | ODA | 25 | 50 |
| Z | BPDA | 99 | — | — | ODA | 100 | 50 |

Production Example 3

In order to obtain a photosensitive polyimide, {[(4,5-dimethoxy-2-nitrobenzyl)oxy]carbonyl}-2,6-dimethylpiperidine (DNCDP) was added to the polyimide precursor solution 1 in an amount of 15% by weight of the solids content of the solution. Thus, a photosensitive polyimide precursor solution 1 was obtained.

Production Example 4

In order to obtain a photosensitive polyimide, an amide compound (HMCP) synthesized from 2-hydroxy-5-methoxycinnamic acid and piperidine was added to the polyimide precursor solution 1 in an amount of 10% by weight of the solids content of the solution. Thus, a photosensitive polyimide precursor solution 2 was obtained.

[Chemical Formula 13]

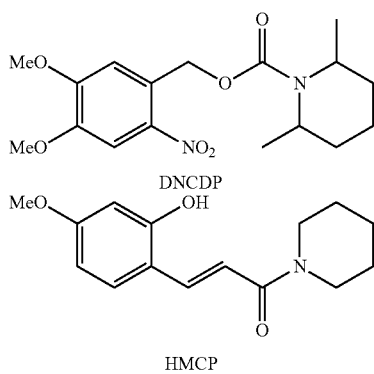

(Evaluation of Coefficient of Linear Thermal Expansion and Coefficient of Hygroscopic Expansion)

Each of the polyimide precursor solutions 1 to 15 and the polyimide precursor solution Z was applied on a heat resistant film (Upilex S 50S™: manufactured by Ube Industries, Ltd.) attached onto a glass plate, and the polyimide precursor solution was dried for 10 minutes on a hot plate at 80° C. Subsequently, the dried composition was peeled off from the heat resistant film, and thus a film having a thickness of 15 μm to 20 μm was obtained. Thereafter, the film was fixed to a frame made of a metal, and was heat treated for one hour at 350° C. (rate of temperature increase: 10° C./min, natural cooling) in a nitrogen atmosphere. Thus, films of polyimides 1 to 15 and polyimide Z, each having a thickness of 9 μm to 15 μm, were obtained.

Furthermore, each of the photosensitive polyimide precursor solutions 1 and 2 was applied on a heat resistant film (Upilex S 50S™: manufactured by Ube Industries, Ltd.) attached onto a glass plate, and the polyimide precursor solution was dried for 10 minutes on a hot plate at 100° C. Subsequently, the dried composition was exposed to a high pressure mercury lamp at a dose of 2,000 mJ/cm² in terms of the illuminance at a wavelength of 365 nm, and then was heated to 170° C. on a hot plate for 10 minutes. Subsequently, the dried composition was peeled off from the heat resistant film, and thus a film having a thickness of 10 μm was obtained. Thereafter, the film was fixed to a frame made of a metal, and was heat treated for one hour at 350° C. (rate of temperature increase: 10° C./min, natural cooling) in a nitrogen atmosphere. Thus, films of photosensitive polyimide 1 and photosensitive polyimide 2, each having a thickness of 6 μm, were obtained.

<Coefficient of Linear Thermal Expansion>

Each of the films produced by the method described above was cut to a size of 5 mm in width×20 mm in length, and this was used as an evaluation sample. The coefficient of linear thermal expansion was measured using a thermomechanical analyzer, Thermo Plus TMA8310™ (manufactured by Rigaku Corp.). For the measurement conditions, the observation length of the evaluation sample was set to 15 mm, the rate of temperature increase was set to 10° C./min, and the tensile load was set to 1 g/25,000 μm² so that the load per cross-sectional area of the evaluation sample was uniform. The average coefficient of linear thermal expansion in the temperature range of 100° C. to 200° C. was designated as the coefficient of linear thermal expansion (C.T.E.).

<Coefficient of Hygroscopic Expansion>

Each of the films produced by the method described above was cut to a size of 5 mm in width×20 mm in length, and this was used as an evaluation sample. The coefficient of hygroscopic expansion was measured using an adjustable humidity mechanical analyzer, Thermo Plus TMA8310 Kai™ (manufactured by Rigaku Corp.). The temperature was set constant at 25° C., and first, the sample was brought to a stabilized state in an environment at a humidity of 15% RH and was maintained in that state for approximately 30 minutes to 2 hours. Subsequently, the humidity of the measurement site was adjusted to 20% RH, and the sample was maintained in that state for 30 minutes to 2 hours until the sample was stabilized. Thereafter, the humidity was changed to 50% RH, and the difference between the sample length obtainable when the sample was stabilized at the humidity and the sample length obtainable when the sample was stabilized at 20% RH was determined. The value calculated by dividing the difference of sample length by the change of humidity (in this case, 50−20=30), and dividing this value by the sample length, was designated as the coefficient of hygroscopic expansion (C. H. E.). At this time, the tensile load was set to 1 g/25,000 μm² so that the load per cross-sectional area of the evaluation sample was uniform.

(Evaluation of Substrate Warpage)

Polyimide films of the polyimides 1 to 15 and Z, and polyimide films of the photosensitive polyimides 1 and 2 were formed a SUS304-HTA foil (manufactured by Toyo Seihaku Co., Ltd.) having a thickness of 18 μm, using the polyimide precursor solutions 1 to 15 and Z, and the photosensitive polyimide precursor solutions 1 and 2, so as to obtain film thicknesses after imidization of 10 μm±1 μm, under the same process conditions as those used in the sample preparation for the evaluation of the coefficient of linear thermal expansion. Thereafter, each of the laminates of the SUS304 foil and the polyimide films was cut to a size of 10 mm in width×50 mm in length, and this was used as a sample for the evaluation of substrate warpage.

This sample was fixed to the surface of a SUS plate such that only one side of the short edges of the sample was fixed with a Kapton tape. The sample was heated in an oven at 100° C. for one hour, and then inside the oven heated to 100° C., the distance between the short edge on the opposite side of the sample and the SUS plate was measured. In regard to the distance at that time, a sample showing a distance of equal to or greater than 0 mm and equal to or less than 0.5 mm was rated as ○; a sample showing a distance of greater than 0.5 mm and equal to or less than 1.0 mm was rated as Δ; and a sample showing a distance of greater than 1.0 mm was rated as X.

Similarly, this sample was fixed to the surface of a SUS plate such that only one side of the short edges of the sample was fixed with a Kapton tape. The sample was left to stand for one hour in a thermo-hygrostat under the conditions of 23° C. and 85% RH, and then the distance between the short edge on the opposite side of the sample and the SUS plate was measured. In regard to the distance at that time, a sample showing a distance of equal to or greater than 0 mm and equal to or less than 0.5 mm was rated as ○; a sample showing a distance of greater than 0.5 mm and equal to or less than 1.0 mm was rated as Δ; and a sample showing a distance of greater than 1.0 mm was rated as X.

These evaluation results are shown below.

TABLE 2

| Polyimide film | Coefficient of linear thermal expansion (ppm/° C.) | Coefficient of hygroscopic expansion (ppm/% RH) | Evaluation of substrate warpage due to heating | Evaluation of substrate warpage at 23° C. and 85% RH |
|---|---|---|---|---|
| Polyimide 1 | 18.9 | 8.4 | ○ | ○ |
| Polyimide 2 | 10.9 | 8.5 | ○ | ○ |
| Polyimide 3 | 19.3 | 10.9 | ○ | ○ |
| Polyimide 4 | 4.6 | 5.1 | Δ | ○ |
| Polyimide 5 | 12.3 | 6.1 | ○ | ○ |
| Polyimide 6 | 22.0 | 8.7 | ○ | ○ |
| Polyimide 7 | 31.1 | 3.5 | X | ○ |
| Polyimide 8 | 11.4 | 5.9 | ○ | ○ |
| Polyimide 9 | 15.4 | 3.4 | ○ | ○ |
| Polyimide 10 | 14.2 | 3.8 | ○ | ○ |
| Polyimide 11 | 35.2 | 20.4 | X | Δ |
| Polyimide 12 | 17.2 | 21.6 | ○ | X |
| Polyimide 13 | 34.7 | 4.0 | X | ○ |
| Polyimide 14 | 37.7 | 6.5 | X | ○ |
| Polyimide 15 | 15.6 | 9.7 | ○ | ○ |
| Photosensitive polyimide 1 | 26.1 | 16.0 | Δ | Δ |
| Photosensitive polyimide 2 | 22.1 | 13.0 | ○ | ○ |
| Polyimide Z | 43.9 | 21.8 | X | X |

Since the coefficient of linear thermal expansion of the SUS304 foil was 17 ppm/° C., it was verified that when the difference between the coefficients of linear thermal expansion of the polyimide film and the metal foil is large, the warpage of the laminate is large.

Furthermore, it can be seen from Table 2 that as the coefficient of hygroscopic expansion of the polyimide film is smaller, the warpage of the laminate in a high humidity environment is smaller.

2. Formation of Planarizing Layer (Insulating Layer)

(Formation of Planarizing Layer (Insulating Layer) 1)

On a SUS304-HTA foil (manufactured by Toyo Seihaku Co., Ltd.) cut to a size which measured 15 cm on each side and having a thickness of 18 μm, each of the polyimide precursor solutions 1 to 15 was coated with a die coater, and the polyimide precursor solution was dried for 60 minutes in air in an oven at 80° C. Subsequently, the dried precursor solution was heat treated for one hour at 350° C. (rate of temperature increase: 10° C./min, natural cooling) in a nitrogen atmosphere. Thus, polyimide films of the polyimides 1 to 15, each having a thickness of 6 μm to 12 μm, were formed, and laminates 1 to 15 were obtained.

Among the laminates 1 to 15, the laminates 1, 2, 3, 5, 6, 8, 9, 10, 12 and 15 did not show any warpage even under changes in the environmental temperature or humidity. On the other hand, the laminates 4, 7, 11, 13 and 14 showed noticeable warpage.

(Formation of Planarizing Layer (Insulating Layer) 2 (Planarizing Layer (Insulating Layer) Pattern))

On a SUS304-HTA foil (manufactured by Toyo Seihaku Co., Ltd.) cut to a size which measured 15 cm on each side and having a thickness of 18 μm, the polyimide precursor solution 1 was coated with a die coater, and the polyimide precursor solution was dried for 60 minutes in air in an oven at 80° C. Subsequently, a resist was produced on the polyimide precursor film such that the resist was removed and developed in the areas along three edges of the square-shaped SUS foil, each of which measured 15 mm in width from the outer periphery toward the interior, and simultaneously, the polyimide precursor film was developed. Thereafter, the resist pattern was peeled off, and then the system was heat treated for one hour at 350° C. (rate of temperature increase: 10° C./min, natural cooling) in a nitrogen atmosphere. Thus, a laminate 1P in which the planarizing layer in the outer peripheral area was removed was obtained.

The laminate 1P did not show warpage even under changes in the environmental temperature or humidity.

(Formation of Planarizing Layer (Insulating Layer) 3 (Planarizing Layer (Insulating Layer) Pattern))

A resist pattern was formed on the polyimide film of the laminate 10 such that the resist was removed in the areas along three edges of the square-shaped SUS foil, each of which measured 15 mm in width from the outer periphery toward the interior. The portions where the polyimide film was exposed were removed by using a polyimide etching solution, TPE-3000 (manufactured by Toray Engineering Co., Ltd.), and then the resist pattern was peeled off. Thus, a laminate 10P in which the planarizing layer in the outer peripheral area was removed was obtained.

The laminate 10P did not show warpage even under changes in the environmental temperature or humidity.

(Formation of Planarizing Layer (Insulating Layer) 4 (Planarizing Layer (Insulating Layer) Pattern))

On a SUS304-HTA foil (manufactured by Toyo Seihaku Co., Ltd.) cut to a size which measured 15 cm on each side and having a thickness of 18 μm, each of the photosensitive polyimide precursor solutions 1 and 2 was coated with a die coater, and the photosensitive polyimide precursor solution was dried for 60 minutes in air in an oven at 80° C. Subsequently, the areas along three edges of the square-shaped SUS foil, each of which measured 15 mm in width from the outer periphery toward the interior, were masked (so that the areas would not be irradiated with ultraviolet radiation), and the dried photosensitive polyimide precursor composition was exposed to a high pressure mercury lamp at a dose of 2,000 mJ/cm$^2$ in terms of the illuminance at a wavelength of 365 nm, and then was heated to 170° C. on a hot plate for 10 minutes. Subsequently, the dried composition was heat treated for one hour at 350° C. (rate of temperature increase: 10° C./min, natural cooling) in a nitrogen atmosphere. Thus, polyimide films of the photosensitive polyimide 1 and the photosensitive polyimide 2, each having a thickness of 3 μm, were formed, and thus laminates 11 and 12 were obtained.

The laminates 11 and 12 did not show warpage even under changes in the environmental temperature or humidity.

(Formation of Planarizing Layer 5 (Surface Irregularities on Metal Foil Surface))

First, dry film resists were laminated on both sides of the laminate 1. Subsequently, the laminate 1 was exposed through the SUS foil side, such that the resist would be removed in a striped form with a line-and-space (L/S) pattern having a width of 200 μm, while the laminate 1 was exposed over the entire surface through the planarizing layer side. Subsequently, a resist was produced. Thereafter, the SUS foil was half-etched using a ferric chloride solution, such that the SUS foil remained to a thickness of 9 μm at the opening areas of the resist, and then the resist pattern was peeled off. Thereby, a laminate 1H in which the SUS foil was half-etched at a width of 200 μm was obtained.

The laminate 1H did not show warpage even under changes in the environmental temperature or humidity.

(Formation of Planarizing Layer 6 (Surface Irregularities on Metal Foil Surface))

First, dry film resists were laminated on both sides of the laminate 1. Subsequently, the laminate 1 was exposed through the SUS foil side, such that the resist would be removed at a constant interval with a line-and-space (L/S) pattern which measured 50 μm on each side, while the laminate 1 was exposed over the entire surface through the planarizing layer side. Subsequently, a resist was produced. Thereafter, the SUS foil was half-etched using a ferric chloride solution, such that the SUS foil remained to a thickness of 9 μm at the opening areas of the resist, and then the resist pattern was peeled off. Thereby, a laminate 1H' in which the SUS foil was half-etched in a square pattern which measured 50 μm on each side was obtained.

The laminate 1H' did not show warpage even under changes in the environmental temperature or humidity.

(Evaluation of Planarity)

The surface roughness Ra of the laminate 1 and the SUS foil was measured.

First, the surface roughness Ra of the laminate 1 was determined by taking an image of the surface morphology using Nanoscope V Multimode™ (manufactured by Veeco Instruments, Inc.) in a tapping mode, under the conditions of cantilever: MPP11100, scan range: 50 μm×50 μm, and scan speed: 0.5 Hz, and calculating the discrepancy of the average from the center line of a roughness curve calculated from the image thus obtained. The surface roughness Ra in an area of 50 μm×50 μm of the laminate 1 was 6.2 nm.

Subsequently, the surface roughness Ra of the laminate 1 was determined by taking an image of the surface morphology of an area having a size of 50 μm×50 μm using New View 5000™ (manufactured by Zygo Corp.) under the conditions of object lens: 100 times, zoom lens: 2 times, and scan length: 15 μm, and calculating the discrepancy of the average from the center line of a roughness curve calculated from the image thus obtained. The surface roughness Ra in an area of 50 μm×50 μm of the laminate 1 was 9.3 nm.

Similarly, the surface roughness Ra in an area having a size of 50 μm×50 μm of the SUS304-HTA foil (manufactured by Toyo Seihaku Co., Ltd.), which was measured using Nanoscope V Multimode (manufactured by Veeco Instruments, Inc.), was 128 nm, and the surface roughness Ra in an area having a size of 50 μm×50 μm measured using New View 5000™ (manufactured by Zygo Corp.) was 150 nm.

3. Surface Treatment of SUS Foil

A SUS304-HTA foil (manufactured by Toyo Seihaku Co., Ltd.) having a thickness of 20 μm was cut to a square which measured 15 cm on each side, and surface treatments were carried out with the chemicals and the treatment conditions indicated in the following Table 3.

The contact angle of the SUS foil surface before a surface treatment and the contact angle of the respective SUS foil surfaces after the surface treatments, both with respect to NMP, which was the solvent of the polyimide resin composition, were measured using a contact angle analyzer (Model DM500 manufactured by Kyowa Interface Science Co., Ltd.) (2 seconds after dropping 1.5 μL of liquid droplets from a microsyringe). The contact angle was measured at five points on the same sample, and the average value was calculated.

Furthermore, the abundance ratio of the atom numbers of all detected elements and carbon at the SUS foil surface before a surface treatment and the abundance ratio at the respective SUS foil surfaces after the surface treatments were calculated, using X-ray photoelectron spectrophotometry (XPS).

Meanwhile, on the SUS foil before a surface treatment and the respective SUS foils after the surface treatments, the polyimide precursor solution 1 was coated with a die coater, and the polyimide precursor solution was dried for 60 minutes in air in an oven at 80° C. Thus, coating properties were checked. As a result, in the sample before a surface treatment, pinholes were occasionally produced. Furthermore, in Treatment Example 4, coating unevenness occurred occasionally.

In the samples of Treatment Examples 1, 2, 3, 5 and 6, pinholes or coating unevenness did not occur, and the coating properties were satisfactory.

TABLE 3

| | Chemical | Treatment conditions | Contact angle (°) | Ratio of carbon/all elements (XPS) | Coating properties |
|---|---|---|---|---|---|
| Before surface treatment | — | — | 46.2 | 0.31 | Δ |
| Treatment Example 1 | Sulfuric acid (10%) | Room temperature, 1 minute | 12.0 | 0.18 | ⊚ |
| Treatment Example 2 | Aqueous solution of phosphoric acid (electrolytic degreasing) | 30 seconds | Less than 5 | 0.16 | ⊚ |
| Treatment Example 3 | Melplate PC-316 (10%) | 40° C., 5 minutes | 16.4 | 0.17 | ⊚ |
| Treatment Example 4 | ADEKA Cleaner MS-303 (20%) | 40° C., 10 minutes | 18.7 | 0.21 | ○ |
| Treatment Example 5 | Bright Dip 3 | 50° C., 3 minutes | 6.2 | 0.14 | ⊚ |
| Treatment Example 6 | PC-316 (10%) →MS-303 (20%) | 40° C., 5 minutes →40° C., 10 minutes | 6.4 | 0.16 | ⊚ |

Melplate PC-316 ™: manufactured by Meltex, Inc., acidic degreasing agent
ADEKA Cleaner MS-303 ™: manufactured by Adeka Corp., chemical polishing agent
Bright Dip 3 ™: manufactured by Meltex, Inc., chemical polishing agent Furthermore, for various SUS foils which were not subjected to surface treatment, the contact angles with respect to NMP, which was the solvent of the polyimide resin composition, were measured.

TABLE 4

| SUS foil | Thickness (μm) | Contact angle (°) |
|---|---|---|
| Sample 1 | 20 | 46.2 |
| Sample 2 | 20 | 19.2 |
| Sample 3 | 18 | 40.0 |

In the various SUS foils which were not subjected to surface treatment, fluctuations in the values of the contact angle could be seen. This is speculated to be because there are differences in the residual extent of organic components on the SUS foil surfaces.

4. Degassing of Polyimide Precursor Solution (Polyimide Resin Composition)

The polyimide precursor solution 1 was diluted with NMP solvent to obtain a solid content of 10%, and then 50 mL each of the dilution was proportioned out into glass sample tubes.

(Degassing Method)
(1) Ultrasonication

The proportioned samples were each subjected to an ultrasonic treatment for 10 minutes at 100 W and 37 kHz using an ultrasonic cleaner, UT-106 (manufactured by Sharp Manufacturing Systems Corp.), with the lids of the sample tubes closed.

(2) Vacuum

For the proportioned samples, the lids of the sample tubes were opened, the sample tubes were placed in a specimen dryer, and the pressure was reduced using a vacuum pump. After the pressure reached a value less than 300 Pa, a depressurization treatment was carried out for 15 minutes. At this time, the final ultimate pressure was 230 Pa.

(Measurement of Dissolved Oxygen Content)

The degassed samples were immediately subjected to the measurement of the dissolved oxygen content using an oxygen sensors "B-506™", "MA-3000™", and "WA-BRP™" (manufactured by Iijima Electronics Corp.).

First, as a reference, a dissolved oxygen-saturated solvent (dissolved oxygen-saturated NMP) prepared by bubbling air for 30 minutes or more into N-methylpyrrolidone (NMP), was subjected to the measurement of the dissolved oxygen content using an oxygen sensor. Calibration of the oxygen sensor was performed such that the measured value of the dissolved oxygen content of NMP that contained no dissolved oxygen was designated as 0, and the measured value of the dissolved oxygen content of dissolved oxygen-saturated NMP was designated as 100. Subsequently, the relative value of the dissolved oxygen content of the reference polyimide precursor solution that had been left to stand for one hour in air, and the relative value of the dissolved oxygen content of a degassed sample were measured with the calibrated oxygen sensor. Subsequently, for the degassed sample, the relative value of the dissolved oxygen content (relative dissolved oxygen saturation) of the degassed sample was calculated, while the relative value of the dissolved oxygen content of the reference polyimide precursor solution was designated as 100%. As a comparison, NMP that had been left to stand for one hour in air was also analyzed.

TABLE 5

| | | Dissolved oxygen content | |
|---|---|---|---|
| | | Relative value | Relative dissolved oxygen saturation (%) |
| Dissolved oxygen-saturated NMP (measurement reference) | | 100 | — |
| Reference polyimide precursor solution (stood for 1 hour in air) (degassed reference) | | 64.8 | 100 |
| Degassing method 1 | Ultrasonication only (10 min) | 58.8 | 91 |
| Degassing method 2 | Vacuum only (15 min) | 52.0 | 80 |
| Degassing method 3 | Ultrasonication (10 min) → vacuum (15 min) | 51.1 | 79 |

It was clearly shown that as compared with the use of a vacuum, the effect of degassing was small with the use of ultrasonication only. Also it became clear that when a vacuum only was used, or when ultrasonication and a vacuum were combined, the effect of degassing did not change much.

(Change Over Time after Degassing)

The samples degassed by using ultrasonication (10 minutes) and a vacuum (15 minutes) were further left to stand in air, and the changes over time in the dissolved oxygen contents were monitored. Up to 10 minutes, a low dissolved oxygen content was maintained, but when a longer time elapsed, the effect of degassing was decreased by the absorption of moisture from the air. It could be seen that after 120 minutes, the samples completely returned to the state before degassing.

TABLE 6

|  | Dissolved oxygen content | |
|---|---|---|
|  | Relative value | Relative dissolved oxygen saturation (%) |
| Dissolved oxygen-saturated NMP (Measurement reference) | 100 | — |
| Reference polyimide precursor solution (stood for 1 hour in air) (degassed reference) | 64.8 | 100 |
| Ultrasonication (10 min) → vacuum (15 min) | 51.1 | 79 |
| After lapse of 10 min | 54.0 | 83 |
| After lapse of 20 min | 60.3 | 93 |
| After lapse of 40 min | 61.5 | 95 |
| After lapse of 120 min | 65.0 | 100 |

5-1. Planarity of Insulating Layer (Formation of Insulating Layer 1)

On a SUS foil that had been subjected to the surface treatment of Treatment Example 1 of Table 3 shown above, the polyimide precursor solution 1 was coated with a spin coater such that the film thickness after imidization would be 7 μm±1 μm, and the polyimide precursor solution was dried for 15 minutes on a hot plate at 100° C. The dried polyimide precursor solution was heat treated for one hour at 350° C. in a nitrogen atmosphere (rate of temperature increase: 10° C./min, natural cooling), and thus an insulating layer 1 was formed.

(Formation of Insulating Layer 2)

The SUS foil before surface treatment of Table 3 shown above was used, and the same procedure as in the formation of the insulating layer 1 was carried out. Thus, an insulating layer 2 was formed.

(Formation of Insulating Layer 3)

Samples were prepared by proportioning out 50 mL each of the polyimide precursor solution 1 into glass sample tubes, and the samples were subjected to an ultrasonication treatment for 10 minutes at room temperature at 100 W and 37 kHz, using an ultrasonic cleaner, UT-106™ (manufactured by Sharp Manufacturing Systems Corp.), with the lids of the sample tubes closed. Thereafter, the lids of the sample tubes were opened, the sample tubes were placed in a specimen dryer, and the pressure was reduced using a vacuum pump. After the pressure reached a value less than 300 Pa, a depressurization treatment was carried out for 20 minutes. Subsequently, on a SUS foil that had been subjected to the surface treatment of Treatment Example 1 of Table 3 shown above, the polyimide precursor solution 1 after degassing was coated with a spin coater such that the film thickness after imidization would be 7 μm±1 μm, and was dried for 15 minutes on a hot plate at 100° C. Subsequently, the dried polyimide precursor solution was heat treated for one hour at 350° C. (rate of temperature increase: 10° C./min, natural cooling) in a nitrogen atmosphere, and thus an insulating layer 3 was formed.

(Measurement of Surface Roughness)

The surface roughness Ra of the insulating layers 1 to 3 was measured.

The surface roughness Ra (unit: nm) of each of the insulating layers was determined by taking the respective images of the surface morphologies of (1) an area having a size of 1000 μm×1000 μm under the conditions of object lens: 10 times, zoom lens: 1 time, and scan length: 15 μm; (2) an area having a size of 200 μm×200 μm under the conditions of object lens: 50 times, zoom lens: 1 time, and scan length: 15 μm; (3) an area having a size of 100 μm×100 μm under the conditions of object lens: 100 times, zoom lens: 1 time, and scan length: 15 μm; and (4) an area having a size of 50 μm×50 μm under the conditions of object lens: 100 times, zoom lens: 2 times, and scan length: 15 μm, and calculating the discrepancy of the average from the center line of a roughness curve calculated from the images thus obtained.

TABLE 7

|  |  |  | Surface roughness, Ra (nm) | | | |
|---|---|---|---|---|---|---|
|  | Chemical treatment | Degassing | Measured area 1000 μm on each side | Measured area 200 μm on each side | Measured area 100 μm on each side | Measured area 50 μm on each side |
| Insulating layer 1 | Treated | None | 85.5 | 60.8 | 29.0 | 27.5 |
| Insulating layer 2 | None | None | 158.1 | 100.0 | 41.7 | 36.9 |
| Insulating layer 3 | Treated | Treated | 41.3 | 31.4 | 25.5 | 20.1 |

It became clear that the planarity of the insulating layer surface was increased by the surface treatments. It also became clear that the effect was further increased by using degassing in combination.

5-2. Planarity of Insulating Layer (Formation of Insulating Layer 1)

First, the polyimide precursor solution 1 was degassed by the degassing method 3 of Table 5 shown above. Subsequently, on a SUS304-HTA Foil™ (manufactured by Toyo Seihaku Co., Ltd.) that measured 90 mm on each side and had a thickness of 20 μm, while attached on a glass plate, the polyimide precursor solution 1 after degassing was coated with a spin coater such that the film thickness after imidization would be 7 μm±1 μm, and was dried for 15 minutes on a hot plate at 100° C. The dried polyimide precursor solution was heat treated for one hour at 350° C. (rate of temperature increase: 10° C./min, natural cooling) in a nitrogen atmosphere, and thus an insulating layer 1 was formed.

(Formation of Insulating Layer 2)

First, a SUS304-HTA Foil™ (manufactured by Toyo Seihaku Co., Ltd.) having a thickness of 20 μm was cut to a size which measured 15 cm on each side, and the cut specimens were subjected to a surface treatment for one minute at room temperature using 10% sulfuric acid. Subsequently, the polyimide precursor solution 1 was degassed by the degassing method 3 of Table 5 shown above. Subsequently, samples obtained by cutting the SUS foil after the surface treatment into a size which measured 90 mm on each side, were attached on a glass plate, and the polyimide precursor solution 1 after degassing was coated with a spin coater such that the film thickness after imidization would be 7 μm±1 μm, and was dried for 15 minutes on a hot plate at 100° C. The dried polyimide precursor solution was heat treated for one hour at 350° C. (rate of temperature increase: 10° C./min, natural cooling) in a nitrogen atmosphere, and thus an insulating layer 2 was formed.

(Formation of Insulating Layer 3)

On a SUS304-HTA foil (manufactured by Toyo Seihaku Co., Ltd.) having a size which measured 90 mm on each side and having a thickness of 20 μm, attached to a glass plate, the polyimide precursor solution 1 was coated with a spin coater such that the film thickness after imidization would be 7 μm±1 μm, and was dried for 15 minutes on a hot plate at 100° C. Subsequently, the dried polyimide precursor solution was heat treated for one hour at 350° C. (rate of temperature increase: 10° C./min, natural cooling) in a nitrogen atmosphere, and thus an insulating layer 3 was formed.

(Measurement of Surface Roughness Ra)

The measurement of the surface roughness was carried out as described above.

TABLE 8

| | Degassing | Chemical treatment | Surface roughness, Ra (nm) | | | |
| --- | --- | --- | --- | --- | --- | --- |
| | | | Measured area 1000 μm on each side | Measured area 200 μm on each side | Measured area 100 μm on each side | Measured area 50 μm on each side |
| Insulating layer 1 | Treated | None | 80.9 | 55.7 | 27.9 | 25.8 |
| Insulating layer 2 | Treated | Treated | 41.3 | 31.4 | 25.2 | 20.1 |
| Insulating layer 3 | None | None | 158.1 | 100.0 | 41.7 | 36.9 |

It became clear that planarity of the insulating layer surface is increased by degassing. Furthermore, it also became clear that the effect is further enhanced by using the surface treatments in combination.

6. Planarity of Contact Adhesive Layer (Formation of Contact Adhesive Layer)

Samples were prepared by proportioning out 50 mL each of the polyimide precursor solution 1 into glass sample tubes, and the samples were subjected to an ultrasonication treatment for 10 minutes at room temperature at 100 W and 37 kHz using an ultrasonic cleaner, UT-106™ (manufactured by Sharp Manufacturing Systems Corp.), with the lids of the samples tubes closed. Thereafter, the lids of the sample tubes were opened, the sample tubes were placed in a specimen dryer, and the pressure was reduced using a vacuum pump. After the pressure reached a value less than 300 Pa, a depressurization treatment was carried out for 20 minutes.

On a SUS304-HTA base material (manufactured by Koyama Steel, Ltd.) having a thickness of 100 μm, which had been immersed in 10% sulfuric acid for one minute, the polyimide precursor solution 1 that had been degassing treated was coated with a spin coater such that the film thickness after imidization would be 7 μm±1 μm, and was dried for 60 minutes in air in an oven at 100° C. Subsequently, the dried polyimide precursor solution was heat treated for one hour at 350° C. (rate of temperature increase: 10° C./min, natural cooling) in a nitrogen atmosphere, and thus an insulating layer was formed.

Next, an aluminum film was formed on the insulating layer, as a first contact adhesive layer to a thickness of 5 nm by a DC sputtering method (film forming pressure 0.2 Pa (argon), input power 1 kW, and film forming time 10 seconds). Subsequently, a silicon oxide film was formed thereon as a second contact adhesive layer to a thickness of 100 nm by an RF magnetron sputtering method (film forming pressure 0.3 Pa (argon:oxygen=3:1), input power: 2 kW, and film forming time: 30 minutes). Thereby, a substrate for a thin film element was obtained.

(Measurement of Surface Roughness)

For insulating layer, the surface roughness Ra in an area of 50 μm×50 μm as measured using New View 5000™ (manufactured by Zygo Corp.) was 13.2 nm.

For the contact adhesive layer, the surface roughness Ra in an area of 50 μm×50 μm as measured using New View 5000™ (manufactured by Zygo Corp.) was 23.5 nm. Also, the surface roughness Ra in an area of 50 μm×50 μm as measured using Nanoscope V Multimode (manufactured by Veeco Instruments, Inc.) was 15.9 nm.

Example 1

On a SUS304-HTA plate (manufactured by Koyama Steel, Ltd.) having a thickness of 100 μm, the polyimide precursor solution 1 was used coated with a spin coater such that the film thickness after imidization would be 7 μm±1 μm, and the polyimide precursor solution was dried for 60 minutes in air in a hot plate oven at 100° C. Subsequently, the dried polyimide precursor solution was heat treated for one hour at 350° C. (rate of temperature increase: 10° C./min, natural cooling) in a nitrogen atmosphere, and thus a planarizing layer was formed.

Subsequently, an aluminum film was formed on the planarizing layer, as a first contact adhesive layer to a thickness of 5 nm by a DC sputtering method (film forming pressure: 0.2 Pa (argon), input power: 1 kW, and film forming time: 10 seconds). Subsequently, a silicon oxide film was formed thereon as a second contact adhesive layer to a thickness of 100 nm by an RF magnetron sputtering method (film forming pressure: 0.3 Pa (argon:oxygen=3:1), input power: 2 kW, and film forming time: 30 minutes). Thereby, a substrate for a flexible device was obtained.

For the planarizing layer, the surface roughness Ra in an area of 50 μm×50 μm as measured using New View 5000™ (manufactured by Zygo Corp.) was 13.2 nm.

For the contact adhesive layer, the surface roughness Ra in an area of 50 μm×50 μm as measured using New View 5000™ (manufactured by Zygo Corp.) was 23.5 nm. Also, the surface roughness Ra in an area of 50 μm×50 μm as measured using Nanoscope V Multimode™ (manufactured by Veeco Instruments, Inc.) was 15.9 nm.

A TFT having a bottom gate/bottom contact structure was produced on the substrate for a flexible device. First, an aluminum film having a thickness of 100 nm was formed as a gate electrode film, and then a resist pattern was formed by a photolithographic method and then was wet etched with a phosphoric acid solution. The aluminum film was patterned in a predetermined pattern, and thus a gate electrode was formed. Subsequently, a silicon oxide film having a thickness of 300 nm was formed over the entire surface as a gate insulating film so as to cover the gate electrode. This gate insulating film was formed using an RF magnetron sputtering apparatus with a 6-inch $SiO_2$ target under the film-forming conditions of input power: 1.0 kW (3 W/cm$^2$), pressure: 1.0 Pa, and gas: argon+$O_2$ (50%). Thereafter, a resist pattern was formed by a photolithographic method, and then was dry etched. Thus, contact holes were formed. Subsequently, a titanium film, an aluminum film and an IZO film, each having a thickness of 100 nm, were deposited over the entire surface of the gate insulating film to form a source electrode and a drain electrode, and then a resist pattern was formed by a photolithographic method and then was wet etched sequentially with an aqueous hydrogen peroxide solution and a phosphoric acid solution. The titanium film was patterned in a predetermined pattern, and thus a source electrode and a drain electrode were formed. At this time, the source electrode and the drain electrode were formed on the gate insulating layer so as to form separated patterns in areas other than right on top of the center of the gate electrode.

Subsequently, an InGaZnO-based amorphous oxide thin film (InGaZnO$_4$), with In:Ga:Zn=1:1:1, was formed to a thickness of 25 nm, over the entire surface to cover the source electrode and the drain electrode. The amorphous oxide thin film was formed using an RF magnetron sputtering apparatus using a 4-inch InGaZnO (In:Ga:Zn=1:1:1) target under the conditions of room temperature (25° C.), and Ar:$O_2$=30:50. Thereafter, a resist pattern was formed on the amorphous oxide thin film by a photolithographic method, and then the resist pattern was wet etched with an oxalic acid solution. The amorphous oxide thin film was patterned, and thus an amorphous oxide thin film having a predetermined pattern was formed. The amorphous oxide thin film thus obtained was formed on the gate insulating film so as to be in contact with the source electrode and the drain electrode on both sides and also to straddle the source electrode and the drain electrode. Subsequently, a silicon oxide film having a thickness of 100 nm was formed as a protective film by an RF magnetron sputtering method so as to cover the entire surface, and then a resist pattern was formed by a photolithographic method and was dry etched. The assembly was annealed for one hour at 300° C. in air, and then a partition wall for EL was formed using an acrylic positive type resist. Thus, a TFT substrate was produced.

An EL layer was deposited on the TFT substrate to obtain white light, and then an IZO film was deposited thereon as an electrode. The EL was sealed using a barrier film. Subsequently, a flexible color filter formed on a PEN film was bonded thereon, and thus a flexible, active matrix-driven, full-color EL display which measured 4.7 inches diagonally, with a resolution of 85 dpi, 320×240×RGB (QVGA), was produced. The full-color EL display thus produced was checked for its operation at a scan voltage of 15 V, a beta voltage of 10 V, and a power supply voltage of 10 V. The continuous operation for 24 hours and the operation after 6 months from the production of the full-color EL display thus produced were checked.

Example 2

On a SUS304-HTA base material (manufactured by Koyama Steel, Ltd.) having a thickness of 100 μm, which had been immersed in 10% sulfuric acid for one minute, the polyimide precursor solution 1 was coated with a spin coater such that the film thickness after imidization would be 7 μm±1 μm, and the polyimide precursor solution was dried for 60 minutes in air in an oven at 100° C. Subsequently, the dried polyimide precursor solution was heat treated for one hour at 350° C. (rate of temperature increase: 10° C./min, natural cooling) in a nitrogen atmosphere, and thus an insulating layer was formed.

Next, an aluminum film was formed on the insulating layer, as a first contact adhesive layer to a thickness of 5 nm by a DC sputtering method (film forming pressure: 0.2 Pa (argon), input power: 1 kW, and film forming time: 10 seconds). Subsequently, a silicon oxide film was formed thereon as a second contact adhesive layer to a thickness of 100 nm by an RF magnetron sputtering method (film forming pressure: 0.3 Pa (argon:oxygen=3:1), input power: 2 kW, and film forming time: 30 minutes). Thereby, a substrate for a thin film element was obtained.

A TFT having a bottom gate/bottom contact structure was produced on the substrate for a thin film element. First, an aluminum film having a thickness of 100 nm was formed as a gate electrode film, and then a resist pattern was formed by a photolithographic method and then was wet etched with a phosphoric acid solution. The aluminum film was patterned in a predetermined pattern, and thus a gate electrode was formed. Subsequently, a silicon oxide film having a thickness of 300 nm was formed over the entire surface as a gate insulating film so as to cover the gate electrode. This gate insulating film was formed using an RF magnetron sputtering apparatus with a 6-inch $SiO_2$ target under the film-forming conditions of input power: 1.0 kW (3 W/cm$^2$), pressure: 1.0 Pa, and gas: argon+$O_2$ (50%). Thereafter, a resist pattern was formed by a photolithographic method, and then was dry etched. Thus, contact holes were formed. Subsequently, a titanium film, an aluminum film and an IZO film, each having a thickness of 100 nm, were deposited over the entire surface of the gate insulating film to form a source electrode and a drain electrode, and then a resist pattern was formed by a photolithographic method and then was wet etched sequentially with an aqueous hydrogen peroxide solution and a phosphoric acid solution. The titanium film was patterned in a predetermined pattern, and thus a source electrode and a drain electrode were formed. At this time, the source electrode and the drain electrode were formed on the gate insulating layer so as to form separated patterns in areas other than right on top of the center of the gate electrode.

Subsequently, an InGaZnO-based amorphous oxide thin film (InGaZnO$_4$), with In:Ga:Zn=1:1:1, was formed to a thickness of 25 nm, over the entire surface to cover the source electrode and the drain electrode. The amorphous oxide thin film was formed using an RF magnetron sputtering apparatus using a 4-inch InGaZnO (In:Ga:Zn=1:1:1) target under the conditions of room temperature (25° C.), and Ar:$O_2$=30:50. Thereafter, a resist pattern was formed on the amorphous oxide thin film by a photolithographic method, and then the resist pattern was wet etched with an oxalic acid solution. The amorphous oxide thin film was patterned, and thus an amorphous oxide thin film having a predetermined pattern was formed. The amorphous oxide thin film thus obtained was formed on the gate insulating film so as to be in contact with the source electrode and the drain electrode on both sides and also to straddle the source electrode and the drain electrode. Subsequently, a silicon oxide film having a thickness of 100 nm was formed as a protective film by an RF magnetron sputtering method so as to cover the entire surface, and then a resist pattern was formed by a photolithographic method and was dry etched. The assembly was annealed for one hour at 300° C. in air. Thus, a TFT was produced.

Comparative Example 1

A TFT was produced in the same manner as in Example 2, except that a SUS base material which had not been surface treated was used.

[Evaluation]

The electrical characteristics of the TFT produced on a SUS base material which had not been surface treated (Comparative Example 1) were evaluated, and as compared with the TFT produced on a SUS base material that had been surface treated (Example 2), a decrease in the electron field-effect mobility was observed. Also, in some parts of the TFT of Comparative Example 1, short circuits between the gate electrode and the source electrode or the drain electrode was observed. It can be speculated that these are attributable to the low surface planarity of the insulating layer formed on the SUS base material. Furthermore, the short circuits between these electrodes can occur even in the wiring of displays and the like, in addition to TFTs. For this reason, planarization of the insulating layer formed on the SUS base material is necessary.

Example 3

First, the polyimide precursor solution 1 was degassed by the degassing method 3 of Table 5 shown above. Subsequently, on a SUS304-HTA Base Material™ (manufactured by Koyama Steel, Ltd.) having a thickness of 100 µm, the polyimide precursor solution 1 after degassing was coated with a spin coater such that the film thickness after imidization would be 7 µm±1 µm, and the polyimide precursor solution was dried for 60 minutes in air in an oven at 100° C. Subsequently, the dried polyimide precursor solution was heat treated for one hour at 350° C. (rate of temperature increase: 10° C./min, naturally cooled) in a nitrogen atmosphere. Thus, an insulating layer was formed.

Next, an aluminum film was formed on the insulating layer, as a first contact adhesive layer to a thickness of 5 nm by a DC sputtering method (film forming pressure: 0.2 Pa (argon), input power: 1 kW, and film forming time: 10 seconds). Subsequently, a silicon oxide film was formed thereon as a second contact adhesive layer to a thickness of 100 nm by an RF magnetron sputtering method (film forming pressure: 0.3 Pa (argon:oxygen=3:1), input power: 2 kW, and film forming time: 30 minutes). Thereby, a substrate for a thin film element was obtained.

A TFT having a bottom gate/bottom contact structure was produced on the substrate for a thin film element. First, an aluminum film having a thickness of 100 nm was formed as a gate electrode film, and then a resist pattern was formed by a photolithographic method and then was wet etched with a phosphoric acid solution. The aluminum film was patterned in a predetermined pattern, and thus a gate electrode was formed. Subsequently, a silicon oxide film having a thickness of 300 nm was formed over the entire surface as a gate insulating film so as to cover the gate electrode. This gate insulating film was formed using an RF magnetron sputtering apparatus with a 6-inch $SiO_2$ target under the film-forming conditions of input power: 1.0 kW (3 $W/cm^2$), pressure: 1.0 Pa, and gas: argon+$O_2$ (50%). Thereafter, a resist pattern was formed by a photolithographic method, and then was dry etched. Thus, contact holes were formed. Subsequently, a titanium film, an aluminum film and an IZO film, each having a thickness of 100 nm, were deposited over the entire surface of the gate insulating film to form a source electrode and a drain electrode, and then a resist pattern was formed by a photolithographic method and then was wet etched sequentially with an aqueous hydrogen peroxide solution and a phosphoric acid solution. The titanium film was patterned in a predetermined pattern, and thus a source electrode and a drain electrode were formed. At this time, the source electrode and the drain electrode were formed on the gate insulating layer so as to form separated patterns in areas other than right on top of the center of the gate electrode.

Subsequently, an InGaZnO-based amorphous oxide thin film ($InGaZnO_4$), with In:Ga:Zn=1:1:1, was formed to a thickness of 25 nm, over the entire surface to cover the source electrode and the drain electrode. The amorphous oxide thin film was formed using an RF magnetron sputtering apparatus using a 4-inch InGaZnO (In:Ga:Zn=1:1:1) target under the conditions of room temperature (25° C.), and Ar:$O_2$=30:50. Thereafter, a resist pattern was formed on the amorphous oxide thin film by a photolithographic method, and then the resist pattern was wet etched with an oxalic acid solution. The amorphous oxide thin film was patterned, and thus an amorphous oxide thin film having a predetermined pattern was formed. The amorphous oxide thin film thus obtained was formed on the gate insulating film so as to be in contact with the source electrode and the drain electrode on both sides and also to straddle the source electrode and the drain electrode. Subsequently, a silicon oxide film having a thickness of 100 nm was formed as a protective film by an RF magnetron sputtering method so as to cover the entire surface, and then a resist pattern was formed by a photolithographic method and was dry etched. Thereafter, the assembly was annealed for one hour at 300° C. in air. Thus, a TFT was produced.

Comparative Example 2

A substrate for a thin film element and a TFT were produced in the same manner as in Example 3, except that an insulating layer was formed such as described below.

On a SUS304-HTA Base Material™ (manufactured by Koyama Steel, Ltd.) having a thickness of 100 µm, the polyimide precursor solution 1 was coated with a spin coater such that the film thickness after imidization would be 7 µm±1 µm, and the polyimide precursor solution was dried for 60 minutes in air in an oven at 100° C. Subsequently, the dried polyimide precursor solution was heat treated for one hour at 350° C. (rate of temperature increase: 10° C./min, natural cooling) in a nitrogen atmosphere. Thus, an insulating layer was formed.

[Evaluation]

The electrical characteristics of the TFT produced using a polyimide precursor solution 1 that had not been degassed (Comparative Example 2) were evaluated, and as compared with the TFT produced using a polyimide precursor solution 1 that had been degassed (Example 3), a decrease in the electron field-effect mobility was observed. Also, in some parts of the TFT of Comparative Example 2, short circuits between the gate electrode and the source electrode or the drain electrode was observed. It can be speculated that these are attributable to the low surface planarity of the insulating layer formed on the SUS base material. Furthermore, the short circuits between these electrodes can occur even in the wiring of displays and the like, in addition to TFTs. For this reason, planarization of the insulating layer formed on the SUS base material is necessary.

Example 4

First, the polyimide precursor solution 1 was degassed by the degassing method 3 of Table 5 shown above. On a SUS304-HTA Base Material™ (manufactured by Koyama Steel, Ltd.) having a thickness of 100 µm, which had been immersed in 10% sulfuric acid for one minute, the degassed polyimide precursor solution 1 was coated with a spin coater such that the film thickness after imidization would be 7 µm±1 µm, and the polyimide precursor solution was dried for 60 minutes in air in an oven at 100° C. Subsequently, the dried polyimide precursor solution was heat treated for one hour at 350° C. (rate of temperature increase: 10° C./min, naturally cooled) in a nitrogen atmosphere. Thus, an insulating layer was formed. Thereby, a substrate for a thin film element was obtained.

A TFT having a top gate/bottom contact structure was produced on the substrate for a thin film element. First, a patterned source electrode and a patterned drain electrode were formed using a mask and using a sputtering apparatus (SPF-730™, manufactured by Canon Anelva Corp.) with a Cr target. At this time, the thicknesses of the source electrode and the drain electrode were both set to 50 nm.

Subsequently, an organic semiconductor layer was formed using a thiophene-based organic semiconductor, by forming a pattern using a mask with a deposition apparatus, VPC-060™ manufactured by Ulvac KIKO. At this time, the thickness of the organic semiconductor layer was set to 50 nm.

Next, a photoresist (acrylic negative type resist) was spin coated as a gate insulating film on the substrate where the source electrode, the drain electrode and the organic semiconductor layer had been formed. Thereafter, the substrate was dried for 2 minutes at 120° C., and was subjected to pattern-wise exposure at 350 mJ/cm$^2$. The photoresist was developed, and was heat treated for 30 minutes in an oven at 200° C. Thus, a patterned gate insulating film was formed.

Subsequently, a chromium film having a thickness of 50 nm was formed on the surface where the gate insulating film had been formed, with a sputtering apparatus (SPF-730™, manufactured by Canon Anelva Corp.) with a Cr target, using a metal mask having openings that are shaped after a patterned gate electrode. Subsequently, an aluminum film having a thickness of 200 nm was deposited thereon, and a gate electrode was formed. Thereby, a TFT was produced.

[Evaluation]

The transistor characteristics of the TFT thus produced were analyzed, and as a result, it was found that neither a decrease in the electron field-effect mobility, nor short circuits between the gate electrode and the source electrode or the drain electrode could be seen, and the TFT operated as a transistor.

REFERENCE SIGNS LIST

1 Substrate for a flexible device
2 Metal foil
3 Planarizing layer
4 Contact adhesive layer
4a First contact adhesive layer
4b Second contact adhesive layer
10A TFT substrate
10B Electrode substrate
30 Organic EL display apparatus
40 Electronic paper
50 Substrate for a thin film element
52 Metal base material
53 Insulating layer
54 Contact adhesive layer
60 TFT
63 Polyimide resin composition

The invention claimed is:

1. A substrate for a flexible device, comprising a metal foil; a planarizing layer that is formed on the metal foil and contains polyimide; and a contact adhesive layer that is formed on the planarizing layer and contains an inorganic compound, wherein the planarizing layer and the contact adhesive layer are formed partially over the metal foil, and the planarizing layer and the contact adhesive layer are formed in an area excluding the outer peripheral area of the metal foil.

2. The substrate for a flexible device according to claim 1, wherein the planarizing layer contains the polyimide as a main component.

3. The substrate for a flexible device according to claim 1, wherein a surface roughness Ra of the contact adhesive layer is 25 nm or less.

4. The substrate for a flexible device according to claim 1, wherein the inorganic compound that constitutes the contact adhesive layer is at least one selected from the group consisting of silicon oxide, silicon nitride, silicon oxynitride, aluminum oxide, aluminum nitride, aluminum oxynitride, chromium oxide and titanium oxide.

5. The substrate for a flexible device according to claim 1, wherein the contact adhesive layer is a multilayer film.

6. The substrate for a flexible device according to claim 5, wherein the contact adhesive layer has: a first contact adhesive layer that is formed on the planarizing layer and is formed from at least one selected from the group consisting of chromium, titanium, aluminum, silicon, silicon nitride, silicon oxynitride, aluminum oxide, aluminum nitride, aluminum oxynitride, chromium oxide and titanium oxide; and a second contact adhesive layer that is formed on the first contact adhesive layer and is formed from silicon oxide.

7. The substrate for a flexible device according to claim 1, wherein a thickness of the contact adhesive layer is in the range of 1 nm to 500 nm.

8. The substrate for a flexible device according to claim 1, wherein a surface roughness Ra of the planarizing layer is 25 nm or less.

9. The substrate for a flexible device according to claim 1, wherein a thickness of the planarizing layer is in the range of 1 µm to 1000 µm.

10. A thin film transistor substrate for a flexible device, comprising the substrate for a flexible device according to claim 1, and a thin film transistor formed on the contact adhesive layer of the substrate for a flexible device.

11. The thin film transistor substrate for a flexible device according to claim 10, wherein the thin film transistor has an oxide semiconductor layer.

12. A flexible device, comprising the thin film transistor substrate for a flexible device according to claim 10.

13. An organic electroluminescent display apparatus, comprising:
the substrate for a flexible device according to claim 1;
a back surface electrode layer and a thin film transistor formed on the contact adhesive layer of the substrate for a flexible device;
an electroluminescent layer that is formed on the back surface electrode layer and includes at least an organic light emitting layer; and
a transparent electrode layer formed on the electroluminescent layer.

14. An electronic paper, comprising:
the substrate for a flexible device according to claim 1;
a back surface electrode layer and a thin film transistor formed on the contact adhesive layer of the substrate for a flexible device;
a display layer formed on the back surface electrode layer; and
a transparent electrode layer formed on the display layer.

15. A substrate for a thin film element, comprising a metal base material, and an insulating layer that is formed on the metal base material and contains polyimide,
   wherein a surface roughness Ra of the insulating layer is 30 nm or less, and a contact angle of a surface of the metal base material with respect to a solvent that is included in a polyimide resin composition used in the insulating layer is 30° or less.

16. The substrate for a thin film element according to claim 15, wherein the metal base material contains iron as a main component.

17. The substrate for a thin film element according to claim 15, wherein a ratio of an amount of carbon (C) element relative to a total amount of elements detected by X-ray photoelectron spectrophotometry (XPS) from a surface of the metal base material, is 0.25 or less.

18. A thin film element, comprising the substrate for a thin film element according to claim 15, and a thin film element unit formed on the substrate for a thin film element.

19. A thin film transistor, comprising the substrate for a thin film element according to claim 15, and a thin film transistor formed on the substrate for a thin film element.

20. A method for manufacturing a substrate for a thin film element, comprising steps of:
   a metal base material surface treatment step of subjecting a metal base material to a chemical treatment; and
   an insulating layer forming step of applying a polyimide resin composition on the metal base material and thereby forming an insulating layer;
   wherein a surface roughness Ra of the insulating layer is 30 nm or less.

21. The method for manufacturing a substrate for a thin film element according to claim 20, wherein, in the metal base material surface treatment step, the chemical treatment is applied such that a contact angle of a surface of the metal base material with respect to a solvent included in the polyimide resin composition is 30° or less.

22. The method for manufacturing a substrate for a thin film element according to claim 20, wherein the polyimide resin composition contains a polyimide precursor.

23. A method for manufacturing a substrate for a thin film element, comprising steps of:
   a degassing step of degassing a polyimide resin composition so that a relative dissolved oxygen saturation calculated by the following method is adjusted to 95% or less; and
   an insulating layer forming step of applying the polyimide resin composition on a metal base material and thereby forming an insulating layer,
   wherein a surface roughness Ra of the insulating layer is 30 nm or less:
   <method for calculating relative dissolved oxygen saturation>
   first, using a dissolved oxygen-saturated solvent prepared by bubbling air for 30 minutes or more into a solvent that is included in the polyimide resin composition, calibration of a dissolved oxygen meter is performed such that a measured value of a dissolved oxygen content of the solvent which contains no dissolved oxygen is designated as 0, and a measured value of a dissolved oxygen content of the dissolved oxygen-saturated solvent is designated as 100; subsequently, a relative value of a dissolved oxygen content of a reference polyimide resin composition prepared by leaving the polyimide resin composition to stand for one hour or longer in air, and a relative value of a dissolved oxygen content of a degassed polyimide resin composition prepared by degassing the polyimide resin composition, are measured with the calibrated dissolved oxygen meter; then, the relative value of the dissolved oxygen content of the degassed polyimide resin composition determined when the relative value of the dissolved oxygen content of the reference polyimide resin composition is designated as 100%, is designated as the relative dissolved oxygen saturation.

24. The method for manufacturing a substrate for a thin film element according to claim 23, wherein the degassing step is carried out immediately before the insulating layer forming step.

25. The method for manufacturing a substrate for a thin film element according to claim 20, comprising a contact adhesive layer forming step of forming a contact adhesive layer containing an inorganic compound on the insulating layer, after the insulating layer forming step.

26. A method for manufacturing a thin film element, comprising a thin film element unit forming step of forming a thin film element unit on a substrate for a thin film element produced by the method for manufacturing a substrate for a thin film element according to claim 20.

27. A method for manufacturing a thin film transistor, comprising a thin film transistor forming step of forming a thin film transistor on a substrate for a thin film element produced by the method for manufacturing a substrate for a thin film element according to claim 20.

28. The method for manufacturing a thin film transistor according to claim 27, wherein the thin film transistor includes an oxide semiconductor layer.

* * * * *